(12) United States Patent
Harada et al.

(10) Patent No.: US 7,408,481 B2
(45) Date of Patent: Aug. 5, 2008

(54) INFORMATION ENCODING METHOD, DECODING METHOD, COMMON MULTIPLIER ESTIMATING METHOD, AND APPARATUS, PROGRAM, AND RECORDING MEDIUM USING THESE METHODS

(75) Inventors: Noboru Harada, Nerima-ku (JP);
Hiroshi Sekigawa, Yokohama (JP);
Takehiro Moriya, Nerima-ku (JP);
Kiyoshi Shirayanagi, Yokohama (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 0 days.

(21) Appl. No.: 11/576,496

(22) PCT Filed: Oct. 14, 2005

(86) PCT No.: PCT/JP2005/018978

§ 371 (c)(1),
(2), (4) Date: May 16, 2007

(87) PCT Pub. No.: WO2006/041165

PCT Pub. Date: Apr. 20, 2006

(65) Prior Publication Data
US 2007/0257824 A1 Nov. 8, 2007

(30) Foreign Application Priority Data
Oct. 15, 2004 (JP) ............................. 2004-329735
Oct. 15, 2004 (JP) ............................. 2004-329736

(51) Int. Cl.
*H03M 7/00* (2006.01)
(52) U.S. Cl. .......................................... 341/50; 341/51
(58) Field of Classification Search .............. 341/50–51
See application file for complete search history.

(56) References Cited

U.S. PATENT DOCUMENTS 5,768,170 A 6/1998 Smith (Continued)

FOREIGN PATENT DOCUMENTS

EP 0 821 303 1/1998

(Continued)

OTHER PUBLICATIONS

Mat Hans, et al. "Lossless Compression of Digital Audio", IEEE Signal Processing Magazine, vol. 18, No. 4, Jul. 2001, pp. 21-32.

(Continued)

*Primary Examiner*—Khai M Nguyen
(74) *Attorney, Agent, or Firm*—Oblon, Spivak, McClelland, Maier & Neustadt, P.C.

(57) ABSTRACT

An information encoding method in which a common multiplier A of the input signal samples x(i) in each frame is estimated. Each sample x(i) is divided by A, the quotient is rounded to the number of significant digits, and the rounded quotient y(i) is encoded. The y(i) is multiplied by A and the product is subtracted from x(i) to obtain an error signal z(i), which is encoded. The A is encoded and the codes of y(i), z(i), and A are combined together and outputted. To estimate A, each numeric value is divided by a determined representative value. Irreducible fractions between the maximum positive error and the maximum negative error are obtained by dividing each numeric value by a correct representative value using rational approximation. Among the obtained irreducible fractions, the one having the smallest common denominator of the numeric values is obtained, which is corrected using the representative value to obtain A.

29 Claims, 30 Drawing Sheets

U.S. PATENT DOCUMENTS

| | | | | |
|---|---|---|---|---|
| 5,839,100 | A | * | 11/1998 | Wegener ................. 704/220 |
| 6,043,763 | A | * | 3/2000 | Levine .................... 341/51 |
| 7,126,501 | B2 | * | 10/2006 | Moriya et al. ............. 341/50 |
| 7,209,056 | B2 | * | 4/2007 | Moriya et al. ............. 341/51 |
| 7,230,551 | B2 | * | 6/2007 | Moriya et al. ............. 341/83 |

FOREIGN PATENT DOCUMENTS

| | | |
|---|---|---|
| JP | 10-78863 | 3/1998 |
| JP | 11-145843 | 5/1999 |

OTHER PUBLICATIONS

Dai Yang, et al. "Lossless Compression for Audio Data in the IEEE Floating-Point Format", Audio Engineering Society Convention Paper 5987, Oct. 2003, pp. 1-5.

Teiji Takagi, "Lectures on the Elementary Theory of Numbers", Second Edition, Kyoritsu Shuppan Co., Ltd., Sep. 15, 2003, pp. 124-145 and cover page (with English Translation).

Noboru Harada, et al.: "Proposal of CE for improved floating-point compression using ACFC (Approximate-Common-Factor Coding) in ALS (Audio Lossless Coding)" Video Standards and Drafts, Oct. 13, 2004 (Oct. 13, 2004) XP030040088 pp. 1-35.

Karacanias N., et al.: "Computation of the least common multiple of a seo of palynomials: Symbolic and numerical approaches" IEE Colloquium on Symbolic Computation for Control, Jun. 17, 1999 (Jun. 17, 1999), pp. 11-1, XP006501222 10 pages.

Waterman M. S.: "Mutidimensional greatest common divisor and Lehmer algorithms" BIT (Nordisk Tidskrift for Informationsbehandling) Sweden, vol. 17, No. 4, 1977, pp. 465-478, XP002473583 ISSN: 0006-3835.

Dai Yang, et al.: "A lossles audio compression scheme with random access property" Acoustics, Speech, and Signal Processing, 2004. Proceedings, (ICASSP '04). IEEE International Conference on Montreal, Quebec, Canada May 17-21, 2004, Piscataway, NJ, USA, IEEE, vol. 3, May 17, 2004 (May 7, 2004), pp. 1016-1019, XP010718365 ISBN: 0-7803-8484-9.

* cited by examiner

FIG. 5

```
CODE INPUT — S11
   ↓
SEPARATE CODE — S12
   ↓
DECODE C_Y INTO y(i), (DECODE C_Z INTO z(i)),
AND OUTPUT A AS IS OR (DECODE C_A INTO A) — S13
   ↓
MULTIPLY y(i) BY A AND ROUND RESULT TO
NEAREST SIGNIFICANT DIGIT TO OBTAIN x'(i) — S14
   ↓
ADD x'(i) TO z(i) TO OBTAIN x(i) — S15
   ↓
COMBINE AND OUTPUT FRAMES — S16
```

FIG. 6A

| DECIMAL REPRESENTATION | BINARY REPRESENTATION |
|---|---|
| $x(1) = 250$ | 1 1 1 1 1 0 1 0 |
| $x(2) = 50$  | 1 1 0 0 1 0 |
| $x(3) = 350$ | 1 0 1 0 1 1 1 1 0 |

FIG. 6B $y(1) = x(1) \div A = 250 \div 1.5625 = 160$
$y(2) = x(2) \div A = 50 \div 1.5625 = 32$
$y(3) = x(3) \div A = 350 \div 1.5625 = 224$

FIG. 6C

| DECIMAL REPRESENTATION | BINARY REPRESENTATION |
|---|---|
| $y(1) = 160$ | 1 0 1 0 0 0 0 0 |
| $y(2) = 32$  | 1 0 0 0 0 0 |
| $y(3) = 224$ | 1 1 1 0 0 0 0 0 |

```
           NUMERIC
           VALUE    CODE  EXPONENT      MANTISSA (23 BITS)
        {  478.4  :  0  :    8     : 11011110011001100110011 :
           95.68  :  0  :    6     : 01111110101110000101001 :
           669.76 :  0  :    9     : 01001110111000010100100 :
```

```
              NUMERIC
              VALUE          CODE  EXPONENT      MANTISSA (23 BITS)
        {  160 (= 478.4/2.99)  :  0  :  7  : 01000000000000000000000 :
           32 (= 95.68/2.99)   :  0  :  5  : 00000000000000000000000 :
           224 (= 669.76/2.99) :  0  :  7  : 11000000000000000000000 :
```

| | |
|---|---|
| z(i) | 1 0 0 1 0 0 1 0 0 1 0 0 |
| z(i)(1) | 1 0 0 1 0 0 1 0 0 1 0 0 |
| CORRELATION VALUE | 0 0 0 0 0 0 0 0 0 0 0 0 |

| | |
|---|---|
| j: | 1 2 3 4 5 6 7 8 9 |
| x(0)(j): | 5 0 2 0 0 0 3 2 0 |
| x(1)(j): | 3 0 4 1 0 0 0 8 0 |
| x(2)(j): | 2 0 1 0 0 3 1 1 0 |
| x(3)(j): | 4 0 2 1 0 8 0 4 0 |
| x(4)(j): | 9 0 6 0 0 8 0 6 6 |
| SUM: | 23 0 15 2 0 19 4 21 6 |
| DETERMINATION: | 1 0 1 0 0 1 0 1 0 |

INFORMATION ENCODING METHOD, DECODING METHOD, COMMON MULTIPLIER ESTIMATING METHOD, AND APPARATUS, PROGRAM, AND RECORDING MEDIUM USING THESE METHODS

CROSS-REFERENCE TO RELATED APPLICATIONS

The present application claims priority to PCT application PCT/JP05/18978, filed Oct. 14, 2005, which in turn claims priority to Japanese Application No. 2004-329735, filed Oct. 15, 2004, and Japanese Application No. 2004-329736, filed Oct. 15, 2004.

TECHNICAL FIELD

The present invention relates to an information compression-encoding method and decompression-decoding method used for improving the efficiency of transmission or saving the recording capacity when sample values of an audio signal, such as voice and music, and a video signal (hereinafter collectively referred to as an information signal) are transmitted through a communication channel or recorded in information recording media, and to a method for estimating a multiplier common to multiple sets of information used for the information compression encoding, and an apparatus, program, and recording medium using these methods.

BACKGROUND ART

There are compression encoding schemes that introduces some distortion of audio signal data (sample values) such as MP3, AAC, and TwinVQ. There are also compression encoding schemes of video information data (sample values), such as JPEG There are lossless coding schemes as well that do not introduce distortion (for example see Non-patent literature 1). Also important is lossless compression of floating-point-format data, which is readily editable (for example see Non-patent literature 2). Also known is the Euclidean algorithm, which determines the greatest common divisor, namely common multiplier, of multiple values.

In case of an audio signal, an audio signal captured by a microphone is sampled at a sampling frequency f and using a quantizing bit number q. Each sample value is converted to a digital value, and inputted as digital sample. The analog samples are often multiplied by a common constant to adjust the gain. If samples are multiplied by a constant in an analog domain before analog-digital conversion is performed, the samples in the analog signal domain can contain errors.

Similarly, in the case of compression encoding of a video information signal, when a two-dimensional video signal is raster-scanned to obtain one-dimensional sample sequences, each of the samples may be multiplied by a common constant to adjust the gain to obtain the original video signal.

Each sample $s0(i)$ in an original sample sequence is multiplied by a common real number G as a gain to obtain a sample $s1(i)=s0(i)\times G$.

The samples $s1(i)$ obtained by multiplying the real number G are often represented in binary notation or IEEE 754 binary floating point format and the digital sample sequences are encoded. The floating point for at standardized as IEEE-754 uses 32 bits as shown in FIG. 1. The floating-point representation consists of a 1-bit sign, an 8-bit exponent, and 23-bit mantissa, starting from the most significant bit. Let S denote the sign, E denote a decimal value represented by the 8-bit exponent, and M denote a binary number of the mantissa Then the numeric value of the floating-point representation can be represented in sign and magnitude binary notation as Formula (1):

$$(-1)^S \times 1.M \times 2^{E-E_0} \quad (1) \text{ [Formula 1]}$$

According to IEEE-754, $E_0=2^7-1=127$. Therefore, $E-E_0$ in Formula (1) can take any value in the range:

$$-127 \leq E-E_0 \leq 128$$

However, $E-E_0=127$ is defined to be all 0s and $E-E_0=128$ is defined to be all 1s. $E-E_0=n$ represents the number of digits (bits) of the integer part of the value expressed by Formula (1) minus 1, that is, the number of bits lower than the highest, "1".

Most of conventional compression encoding schemes such as the one described in Non-patent literature 1 have tried to minimize redundancy in an original input waveform (for example music signal waveform) of input sample sequences in order to reduce the amount of information. The amplitude (bit length) of an input waveform that can be encoded by an encoder is specified as 16 bits, for example. If the bit length is 24 bits, 16 higher-order bits are encoded and the lower 8 bits are outputted without being encoded or after being separately compression-coded.

Non-patent literature 1 Hans M. and Schafer R. W.: Lossless Compression of Digital Audio, IEEE Signal Processing Magazine, Vol. 18, No. 4, pp. 21-32 (2001).

Non-patent literature 2: Dai Yang and Takehiro Moriya: Lossless Compression for Audio Data in the IEEE Floating-Point Format, AES Convention Paper 59873 AES 115th Convention, New York, N.Y., USA, Oct. 10-13, 2003.

DISCLOSURE OF THE INVENTION

Problems to be Solved by the Invention

Conventional encoding method (apparatus) cannot encode an input sample sequence longer than a specified amplitude (bit length). If a sample sequence is converted to a sequence having an encodable amplitude (bit length) and then is coded, the quality of the decoded result degrades. If a part that cannot be encoded is outputted as separate information (or a separate code), the amount of information increases.

For example, suppose that such a sample sequence is encoded using a universal coding which does not produce distortion and each sample in the sample sequence is viewed as a bit string. A sample sequence $x(1)$-$x(3)$ that includes successive 0s such as $x(1)=10100000$ (decimal number 160), $x(2)=100000$ (decimal number 32), and $x(3)=11100000$ (decimal number 224) can be compressed at a high compression ratio. On the other hand, a complex sample sequence in which 0s and 1s discontinuously appear such as $x(1)=111010$ (decimal number 250), $x(2)=110010$ (decimal number 50), and $x(3)=101011110$ (decimal number 350) is difficult to encode at a high compression ratio.

The conventional Euclidean algorithm is relatively simple processing. However, if values are half-adjusted or include errors, the errors cannot be taken into consideration in determining the greatest common divisor.

An object of the present invention is to provide a coding technique capable of encoding an input waveform having an amplitude (bit length) greater than an amplitude (bit length) that can be encoded by a compression encoding scheme, without increasing the amount of information. Another object of the present invention is to provide a coding technique capable of efficiently compressing sample sequences regardless of the patter of 0-bits and 1-bits constituting an input sample a decoding technique, and a technique for obtaining a common multiplier used for the coding technique.

Means to Solve Problems

According to the present invention, a number common to samples (common multiplier A) in a sample sequence is estimated from the sample sequence. Each sample is divided by the common multiplier A, the result is compression-coded, and at least the compression-coded code $C_Y$ and the estimated multiplier A are output. The multiplier A may or may not be compression-coded.

In decoding, the code $C_Y$ is separated from the multiplier A and is decoded by using a decoding scheme corresponding to the encoding scheme and the result is multiplied by the common multiplier A to restore the original sample.

In a process for obtaining the common multiplier in the compression-encoding, a representative value is selected from a set of values. Each value is divided by the representative value and irreducible reactions between the maximum positive error and the maximum negative error are obtained each of which is a correct value divided by a representative correct value (without an error), by using rational approximation. Then, the irreducible fraction that has the least common denominator for the values is obtained and the common denominator is corrected using the representative value to provide a common multiplier.

Effects of the Invention

For examples if a sample sequence multiplied by a common gain at the analog level is to be compression-coded, the gain is estimated to be the common multiplier and each sample is divided by the multiplier. As a result, the amplitude is reduced and therefore a conventional coding scheme (for example the scheme described in Non-patent literature 1) can be applied without modification in most cases with a smaller quality loss and a negligibly small increase in the amount of information.

Because common redundancy in the original sample sequences can be eliminated by the division mentioned above, the entropy of a set of quotients can be significantly reduced. As a result, the entire information compression ratio can be improved.

For example, when the present invention is applied to an audio signal represented in floating-point for information can be compressed to an amount in the range between ½ and ⅓ the amount of information compressed by using a conventional compression scheme.

Furthermore, in the process for obtaining a common multiplier, the common multiplier of a set of values including errors can be obtained by taking errors into account.

BRIEF DESCRIPTION OF THE DRAWINGS

FIG. 5 is a flowchart of an exemplary process performed by the decoding apparatus;

FIG. 6A shows specific exemplary values of exemplary sample sequences for illustrating an effect of the present invention;

FIG. 6B shows specific exemplary values of exemplary sample sequences divided by a common divider for illustrating an effect of the present invention;

FIG. 6C shows specific exemplary values of exemplary sample sequences resulting from the division for illustrating an effect of the present invention;

BEST MODES FOR CARRYING OUT THE INVENTION

Figure 1:
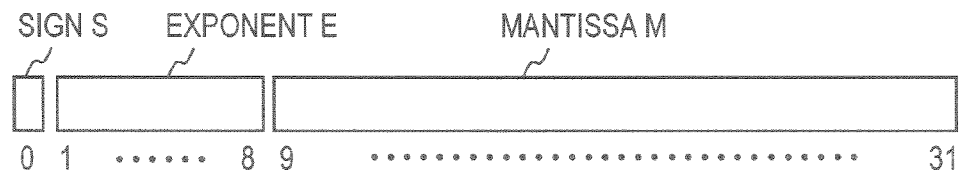
FIG. 1 is a diagram illustrating a floating-point representation according to IEEE-754.

Embodiments of the present invention will be described with reference to the accompanying drawings. Like elements are labeled with like reference numerals throughout the drawings to avoid overlapping descriptions. Examples will be described in which the present invention is applied to audio signal sequences represented by 32-bit floating-point numbers.

First Embodiment

FIRST EXAMPLE

Coding

Figure 2:
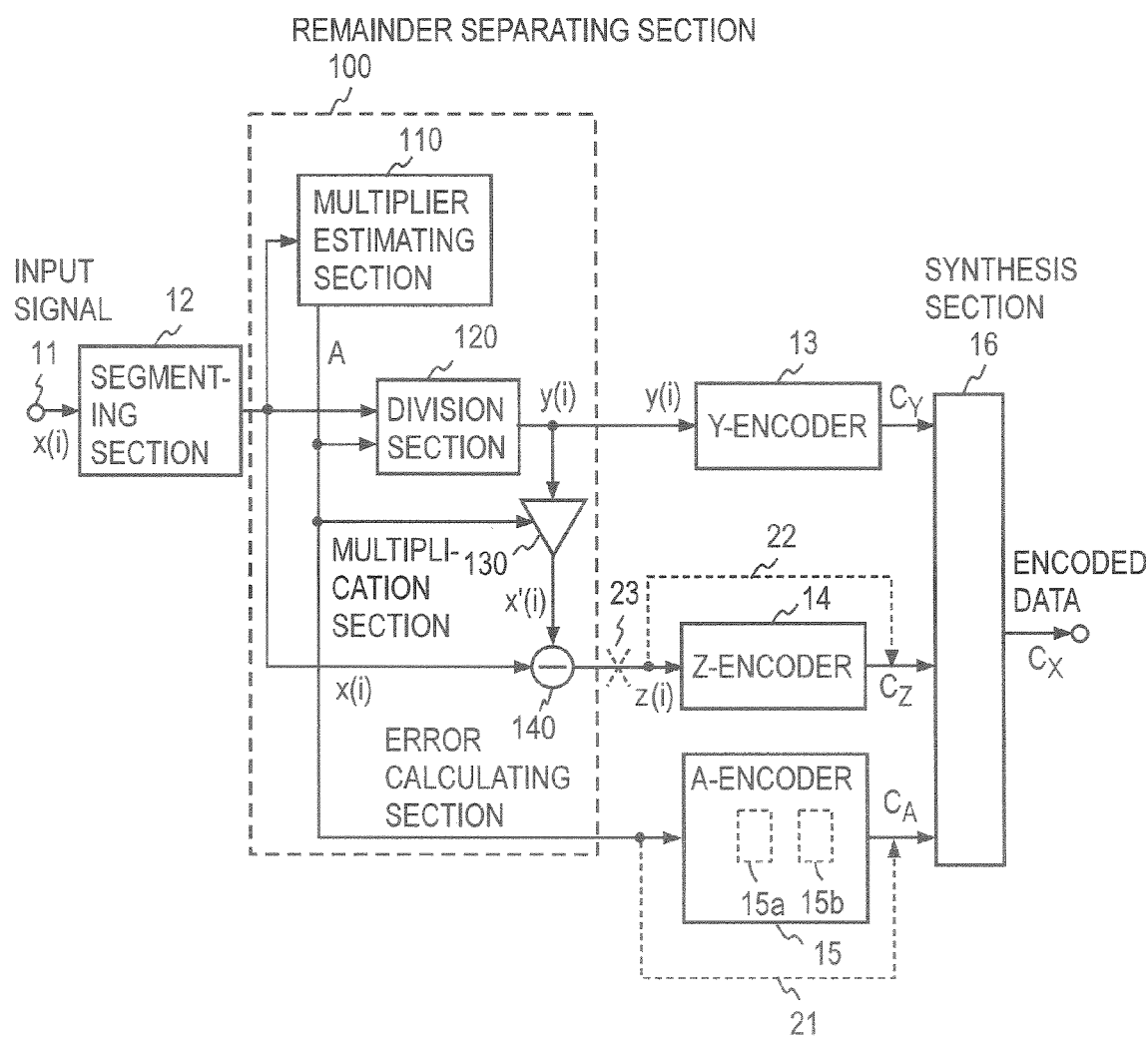
FIG. 2 shows an exemplary functional configuration of an encoding apparatus according to a first example.
Figure 3:
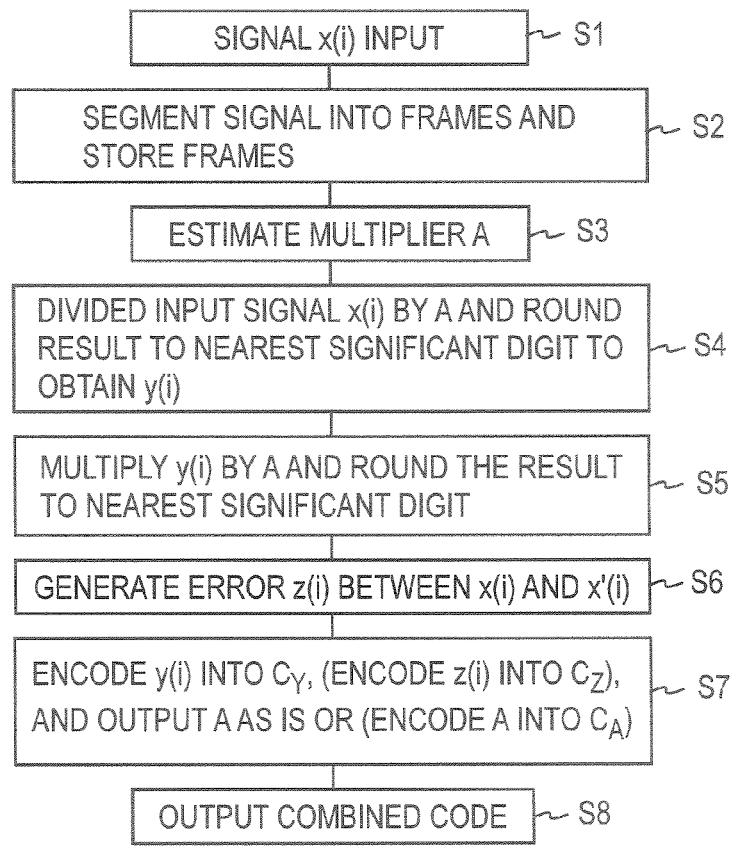
FIG. 3 is a flowchart of an exemplary process performed by the encoding apparatus.

FIG. 2 shows an exemplary functional configuration of an encoding apparatus according to a first embodiment of the present invention FIG. 3 shows a process performed by the encoding apparatus.

When an input signal sequence $X=(x(0), x(1), \ldots)$, which is a digitized sample sequence, is inputted t rough an input terminal 11 (step S1), it is divided into sequences consists of a predetermined number N of samples (for example 1,024 samples) in a segmenting (frame) section 12 and temporarily stored in a memory (not shown) (step S2). In the case of an audio signal, the sample sequence may be a integer sample sequence quantized by using a quantifying bit number of 24 bits or a 32-bit single-precision floating-point format sample sequence. In the case of a color video signal, the sample sequence may be a digitized sample sequence of pixel information obtained by raster scanning color information elements into which the color video signal is split.

A set of samples $x(i)$ ($i=0, 1, \ldots, N-1$), which is an input signal in each frame, is separated into at least a multiplier A and the quotient $y(i)$ of $x(i)$ divided by the multiplier A in a remainder separating section 100. In this example, the remainder (error) $z(i)$ of $x(i)$ divided by A is also separated.

For example, an input signal sequence X is provided frame by frame to a multiplier estimating section 110, where a multiplier A common to all the samples $x(i)$ ($i=0, 1, \ldots, N-1$) is estimated (step S3). For example, if all samples $x(i)$ are divisible by a common value, for example 99.0, then the common multiplier A is set as 99.0. There are several methods for estimating a common multiplier A. For example, a rational approximation of ACF (Approximate Common Factor) may be used. It is assumed here that an appropriate multiplier A is given.

The multiplier A determined in the multiplier estimating section 110 is provided to a division section 120, a multiplication section 130, and an A-encoder 15.

The division section 120 uses the multiplier A provided from the multiplier estimating section 110 and N samples $x(i)$ as inputs to calculate n quotient signals $y(i)=x(i)/A$ (step S4). Here, $y(i)$ may be in any of integer, floating-point, and fixed-point form. When converting into predetermined form rounding such as truncation, round-up, half-adjust, or nearest tie to even may be applied.

For example, $x(i)$ is converted into a double-precision floating-point number here a 64-bit floating-point number) which is then divided by the multiplier A. The resulting double-precision quotient is rounded to the nearest single-precision (32-bit) floating-point number to give quotient signal $y(i)$.

The sequence $Y=(y(0), y(1), \ldots, y(N-1))$ of N quotient signals $y(i)$ obtained in the division section 120 is provided to a Y-encoder 13 and also to a multiplication section 130 in this example.

The multiplication section 130 multiplies each of the N signals $y(i)$ in the quotient signal sequence Y provided from the division section 120 by the multiplier A provided from the multiplier estimating section 110 to obtain N restored samples $x'(i)$ (step S5).

The restored sample $x'(i)$ is rounded to a value in a range that can be represented in 32-bit floating-point representation. For example, $y(i)$ multiplied by A may be held as a double-precision (64-bit) floating-point number and the double-precision product may be rounded to the nearest single-precision (32-bit) floating-point number, $x'(i)$. The resulting sample sequence $X'=(x'(0), x'(1), \ldots, x'(N-1))$ is provided to an error calculating section 140.

The error calculating section 140 subtracts each of the N restored samples $x'(i)$ provided from the multiplication section 130 from each of the N samples $x(i)$ extracted from the input signal to obtain a sequence of N error signals $z(i)$, $Z=(z(0), z(1), \ldots, z(N-1))$ (step S6). The error signals may be calculated by bitwise exclusive OR (XOR) of 32-bit numbers of $x(i)$ and $x'(i)$, instead of subtraction. In essence, any calculation can be used that can provide the difference between $x(i)$ and $x'(i)$.

The obtained error signal sequence Z is provided to a Z-encoder 14 in this example.

The multiplier A provided from the multiplier estimating section 110 is also inputted into the A-encoder 15.

The Y-encoder 13, Z-encoder 14, and A-encoder 15 compression-encode the input signal sequences Y, Z, and A, respectively, using a conventional information compression scheme and output resulting codes $C_Y$, $C_Z$, and $C_A$, respectively (step S7). The codes $C_Y$, $C_Z$, and $C_A$ are combined in a synthesis section 16 into a bit string in each frame and outputted as coded data $C_X$ (step S8). The Y-encoder 13 may use a high-compression encoding scheme that uses correlation between waveform values, such as lossless compression schemes described in Non-patent literature 1 or lossy coding schemes such as MPEG 4, AAC or TwinVQ. The A-encoder 15 uses a lossless compression encoding scheme.

If the amount of information of the multiplier A is vanishingly small compared with the quotient signal sequence Y and the error signal sequence Z, the A-encoder 15 may be omitted and the multiplier A may be directly inputted in the synthesis section 16 as indicated by dashed line 21.

Depending on the nature of the input signal x(i), compression of the error signal sequence Z may not provide a sufficient gain and the impact of the increase in the amount of computation may be significant. In such a case, the Z-encoder 14 may be omitted and the error signal sequence Z may be directly inputted in the synthesis section 16 as indicated by dashed line 22.

The Z-encoder 14 uses an entropy coding scheme, for example. Just higher order bits in the error signal z(i) may be encoded using an entropy coding scheme that is, the error signal z(i) may be lossily encoded. Depending on the nature of the input signal x(i) it may be known that the error signal z(i) can definitely be reduced to 0 or reduced to a value so small that it does not practically affect the reproduction quality. In such a case, the error signal sequence Z may be discarded as indicated by the dotted "X" mark 23. In that case, Z-encoder 14 is omitted and the code $C_Z$ is not included in the coded data $C_X$.

Decoding

Figure 4:
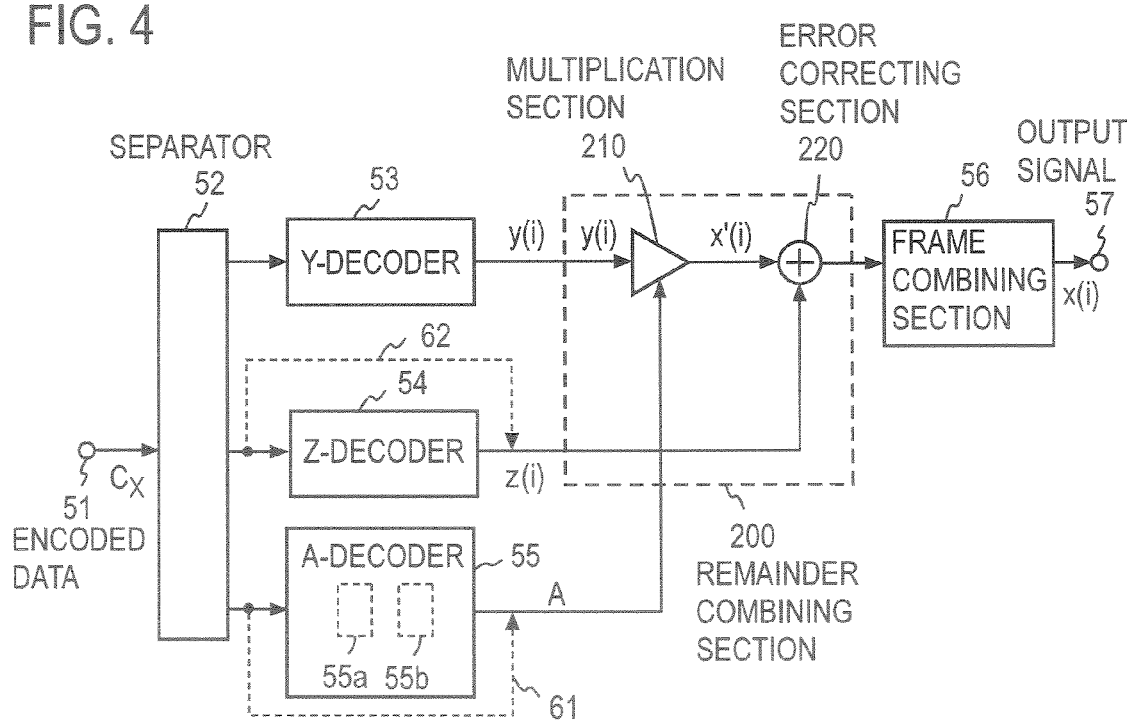
FIG. 4 shows an exemplary functional configuration of a decoding apparatus according to the first example.

FIG. 4 shows an exemplary functional configuration of a decoding apparatus according to the first embodiment, FIG. 5 shows an example of a decoding method (process).

The coded data $C_X$ from an input terminal 51 is processed flame by frame, each frame consisting of the same number of samples as that in the encoding apparatus. When coded data $C_X$ is inputted (step S11) a separator 52 separates the coded data $C_X$ in each frame into three codes, $C_Y$, $C_Z$, and $C_A$, and provides them to a Y-decoder 53, a Z-decoder 54, and an A-decoder 55, respectively (step S12). The Y-decoder 53, Z-decoder 54, and A-decoder 55 use decompression-decoding schemes that correspond to the compression encoding schemes used by the Y-encoder 13, Z-encoder 14, and A-encoder 15, respectively.

The decoders 53, 54 and 55 decode the input codes to obtain a quotient signal sequence Y, an error signal sequence Z and a common multiplier A which correspond to the inputs of the encoders 13, 14 and 15 respectively (step S13). It is assumed in this example that the encoders 13 to 15 use lossless coding schemes.

A remainder combining section 200 combines the decoded signals.

A multiplication section 210 multiplies N quotient signals y(i) provided from the Y-decoder 53 by the multiplier A provided from the A decoder 55 in the same way as that in the multiplication section 130 of the encoding apparatus to obtain N signals x'(i) (step S14). Here, x'(i) is rounded to a value in a range that can be represented in 32-bit floating-point representation. For example: y(i) multiplied by A is held as a double-precision (64-bit) floating-point number The double-precision product is rounded to the nearest single-precision (32-bit) floating-point number, x'(i). The rounding is performed in the same way as that used in the multiplication section 130 of the encoding apparatus. Thus, x'(i) consisting of a predetermined number of significant digits is obtained.

An error correcting section 220 corrects N samples x'(i) provided from the multiplication section 210 by using the error signals z(i) from the Z-decoder 54 to restore the original signals x(i). That is, if x'(i) has been subtracted from x(i) in the encoding apparatus an error signal z(i) corresponding to each x'(i) is added. If x(i) has been bit-wise XORed with x'(i) in the encoding apparatus, each corresponding bit of the error signal z(i) is referred to and the bit of x'(i) in the position where z(i) is 1 is inverted to obtain x(i).

A frame combining section 56 combines the restored N samples x(i) (i=0, 1, . . . , N−1) provided from the error correction section 220 and outputs the combined samples (step S16).

If the encoding apparatus has not encoded the multiplier A, the multiplier A separated at the separator 52 is directly inputted in the multiplication section 210 as indicated by dashed line 61 in FIG. 4. Likewise, if the error signal z(i) has not been encoded in the encoding apparatus, z(i) separated at the separator 52 is directly inputted in the error correcting section 220 as indicated by dashed line 62. If z(i) has been discarded in the encoding apparatus, no counterpart to the code $C_Z$ can be obtained at the separator 52 and therefore nothing is inputted in the error correcting section 220. In other words, 0 is inputted in the error correcting section 220.

It should be noted that if the multiplier A is the same as the multiplier A obtained in the preceding frame, the encoding apparatus can further reduce the amount of information. Specifically, a register 15a and a determining section 15b are provided in the encoding apparatus as shown in the A-encoder 15 in FIG. 2. The multiplier A of the preceding frame is stored in the register 15a and the multiplier A of the current frame is compared with the multiplier A of the previous frame in the determining section 15b. If they match, only one bit that indicates the mach is outputted as the code $C_A$. This arrangement can reduce the volume of information of coded data $C_X$. In the decoding apparatus, there may be provided in the A-decoder 55 in FIG. 4 a register 55a for storing the multiplier A of the previous frame and a determining section 55b that determines whether a code $C_A$ is a bit which indicates the multiplier is the same as the multiplier of the previous frame and, if match, outputs the multiplier A stored in the register 55a to the multiplication section 210 without decoding the code $C_A$. In that case, the code $C_A$ may be only one bit that indicates whether the multiplier A is the same as that of the previous frame and therefore the amount of information can be reduced as compared with an uncoded multiplier A.

Referring to FIG. 6, how the present invention can improve the compression ratio will be described. FIG. 6 shows exemplary input signals x(i) in binary representation. If input signal sample sequences x(1) x(2), and x(3) are 250, 50, and 350, respectively, in decimal representation as shown in FIG. 6A, their binary representations are relatively randomly arranged 0s and 1s.

If the samples x(1), x(2), and x(3) are divided by a common number A=1.5625, the quotient signals y(1), y(2), and y(3) will be 160, 32, and 224, respectively, in decimal representation as shown in FIG. 6B.

The binary representations of the quotient signals y(1) y(2) and y(3) are sequences of 0s and 1s in which more series of 0s appear as shown in FIG. 6C. These quotient signals y(1) y(2), and y(3) can be coded at a high compression ratio. While multipliers A must be sent together, the total amount of information in compressed codes can significantly be reduced when a large number of samples are to be sent and the most of them are quotients that can be compressed at a high compression ratio.

Figures 7A, 7B, 8:
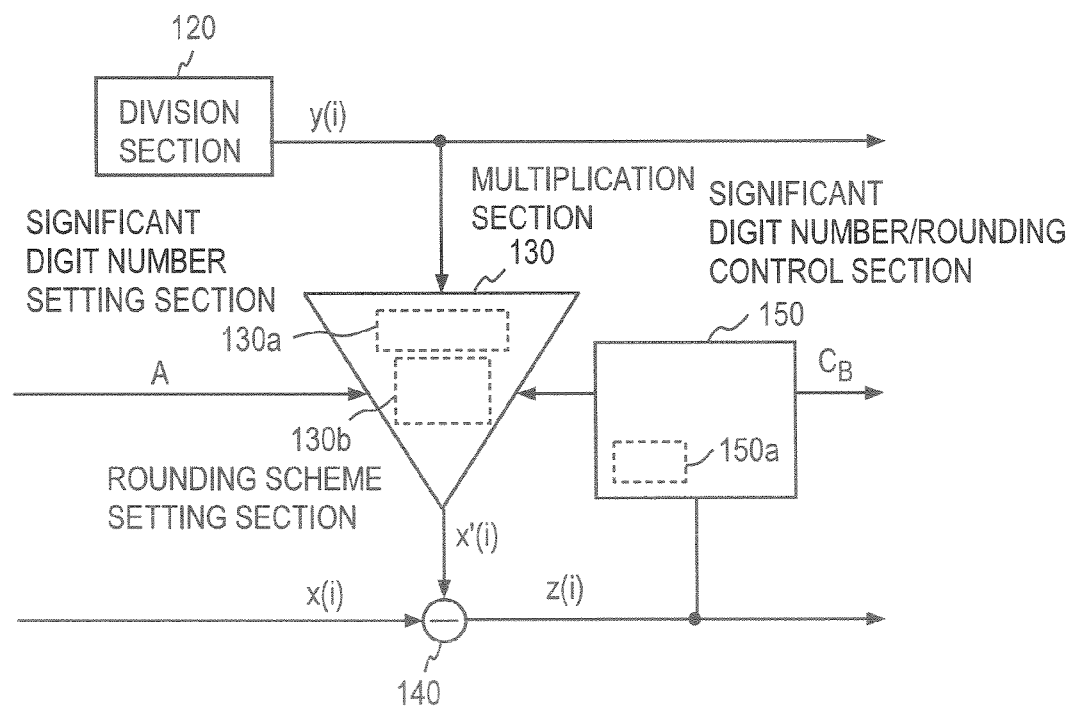
FIG. 7A shows specific exemplary values of other exemplary sample sequences for illustrating an effect of the present invention.
FIG. 7B shows specific exemplary values of other exemplary sample sequences resulting from the division for illustrating an effect of the present invention.
FIG. 8 shows an exemplary functional configuration of a relevant part of an encoding apparatus in a second example.

FIG. 7 shows an example in which the present invention has been applied to sequences of samples compliant with IEEE-754 floating-point number. The floating-point representations of decimal numeric values 478.4, 95.68, 669.76 have mantissas that are 23-bit sequences of rather randomly arranged 1s and 0s as shown in FIG. 7A. However, by dividing these numbers by a common multiplier, 2.99, the decimal representations of the resulting quotient signals, 160, 32, and 224, respectively, can be obtained as shown in FIG. 7B. When these values are represented in floating-point representations, the 23-bit sequences of 1s and 0s of the mantissas will be as follows for the first value, only the second highest-order bit of the mantissa is 1 and the rest are 0s; for the second value, all bits of the mantissa are 0s; and for the third value, only the highest and second highest-order bit are 1s. Thus, they can be compressed at significantly higher ratios than the case where the values shown in FIG. 7A are directly compressed.

SECOND EXAMPLE

Selecting the Number of Significant Digits and Rounding Scheme

The nature of x(i) varies depending on how many significant digits and what kind of rounding have been used in generating the input signal. In floating point calculations, typically single-precision numbers can directly be used or the products of multiplications of double-precision numbers can be rounded to single-precision numbers.

There are different methods for rounding numbers, such as rounding down to a predetermined number of significant digits, half-adjust, nearest tie to even, and rounding up. When a quotient signal y(i) is multiplied by a multiplier A to generate x'(i) the same rounding scheme that has been used in generating the input signal x(i) is estimated and used, thereby minimizing the error z(i). In particular, available calculation precisions (the number of significant digits) and available rounding schemes are tried and the method that provides the minimum error z(i) is selected. A specific example of this will be described below.

Figure 9:
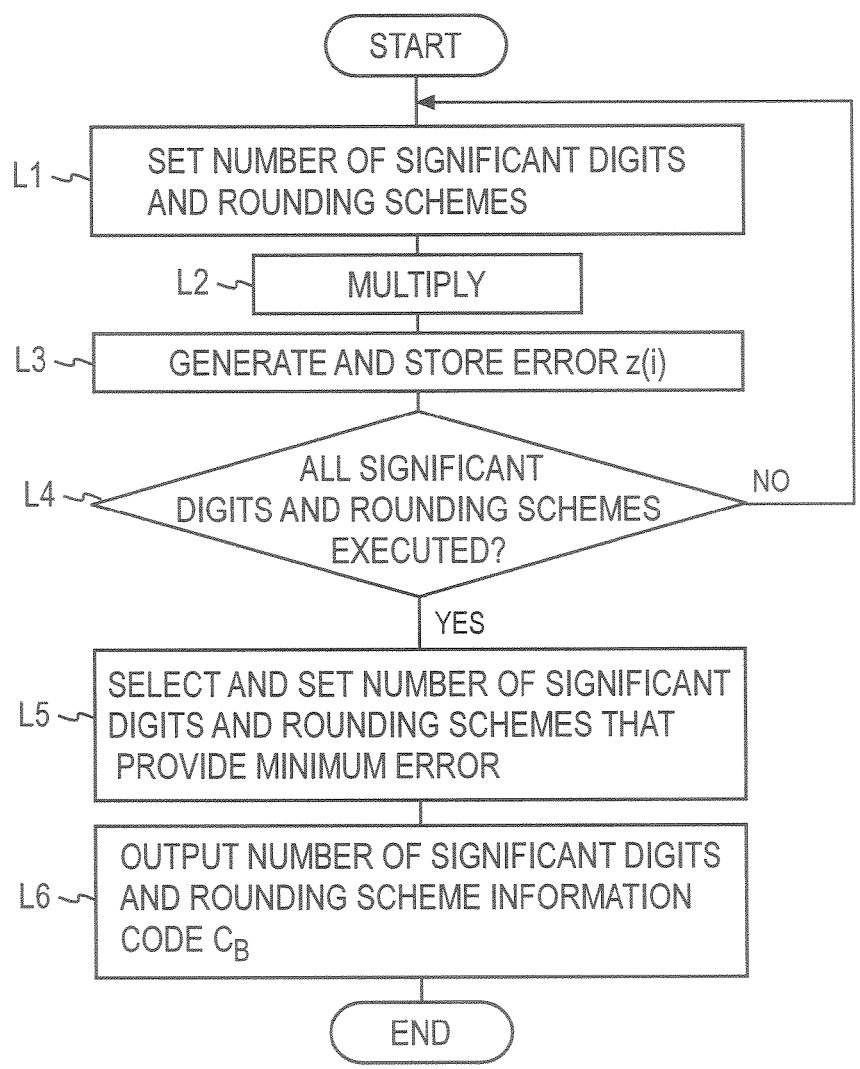
FIG. 9 is a flowchart of an exemplary process performed by the encoding apparatus.

In the example, the number of significant digits (the precision of calculation) of a quotient signal y(i) and a rounding scheme are selected in the multiplication section 130 in FIG. 2. FIG. 8 shows an exemplary configuration of the relevant part and FIG. 9 shows an exemplary process performed in the relevant part. Provided in the multiplication section 130 of the remainder separating section 100 are a significant digit number setting section 130a and the rounding scheme setting section 130b. A significant digit number/rounding control section 150 sets a number of significant digit and a rounding scheme in the significant digit number setting section 130a and the rounding scheme setting section 130b, respectively (step L1). In the multiplication section 130, multiplication of a quotient signal y(i) by a multiplier A is performed using a double precision with the set number of significant digits and the product is rounded to a single precision by using the set rounding scheme (step L2). The difference between the resulting x'(i) and the input signal x(i) is calculated in the error calculating section 140 and the error signal z(i) is stored in a memory 150a in the significant digit number/rounding control section 150 (step L3).

The significant digit number/rounding control section 150 then determines whether the processing in the multiplication section 130 has been performed for all of the assumed numbers of significant digits and the assumed rounding schemes (step L4). If No, the process returns to step L1. If Yes the significant digit number/rounding control section 150 sets in the multiplication section 130 the number of significant digits and rounding scheme that have provided the smallest one of the error signals z(i) in the memory 150a (step L5). The error signals z(i) of all samples in the frame are calculated. Information indicating the set number of significant digits and rounding scheme is inputted in the synthesis section 16 as an auxiliary code $C_B$ (step L6).

Figure 10:
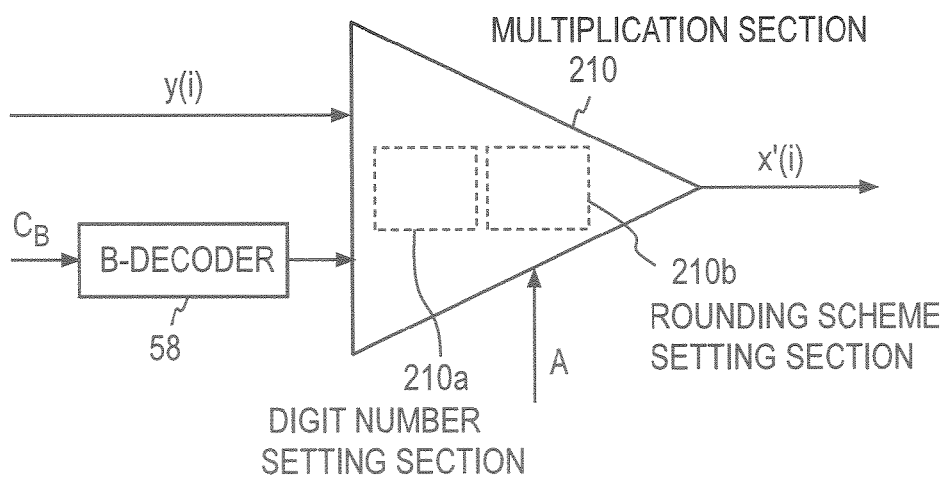
FIG. 10 shows an exemplary functional configuration of a relevant part of a decoding apparatus in the second example.

The remainder combining section 200 of the decoding apparatus has a B-decoder 58 and a multiplication section 210 including a digit number setting section 210a and a rounding scheme setting section 210b as shown in FIG. 10 in a simple manner. The B-decoder 58 decodes a code $C_B$ separated by the separator 52. The number of significant digits and rounding scheme in the code $C_B$ are set in the digit number setting section 210a and the rounding scheme setting section 210b, respectively, in the multiplication section 210. The multiplication section 210 multiplies a decoded quotient signal y(i) by a decoded multiplier A on the basis of the set information.

Second Embodiment

THIRD EXAMPLE

Quotient Signal Transformation

Figure 11:
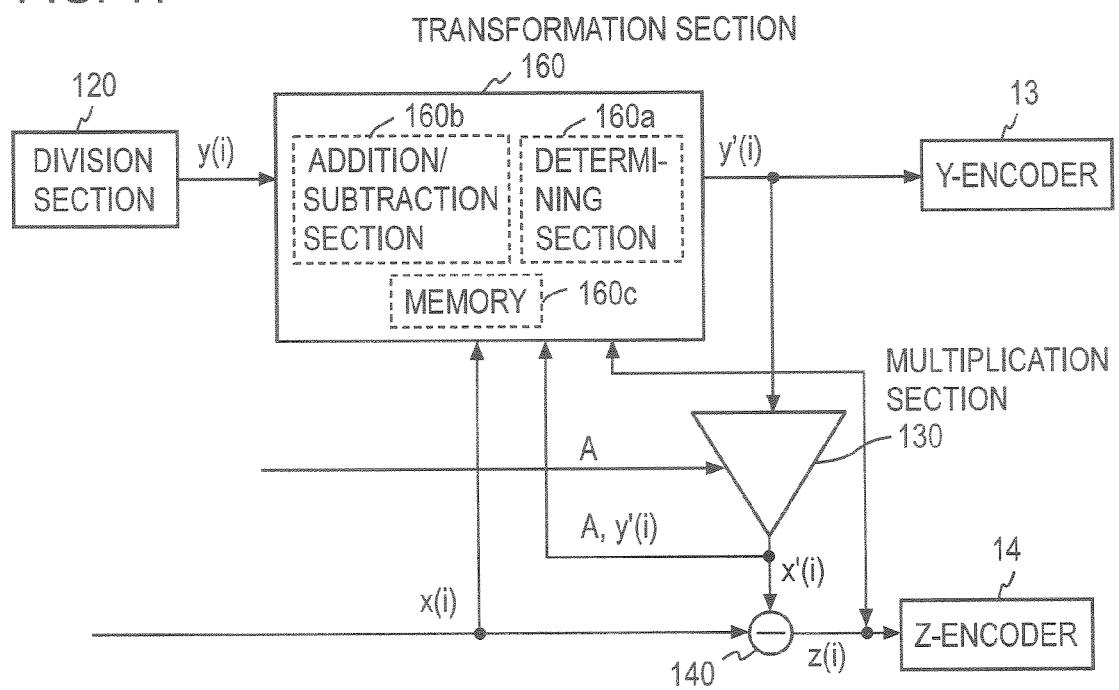
FIG. 11 shows an exemplary functional configuration of a relevant part of an encoding apparatus in a third example.
Figure 12:
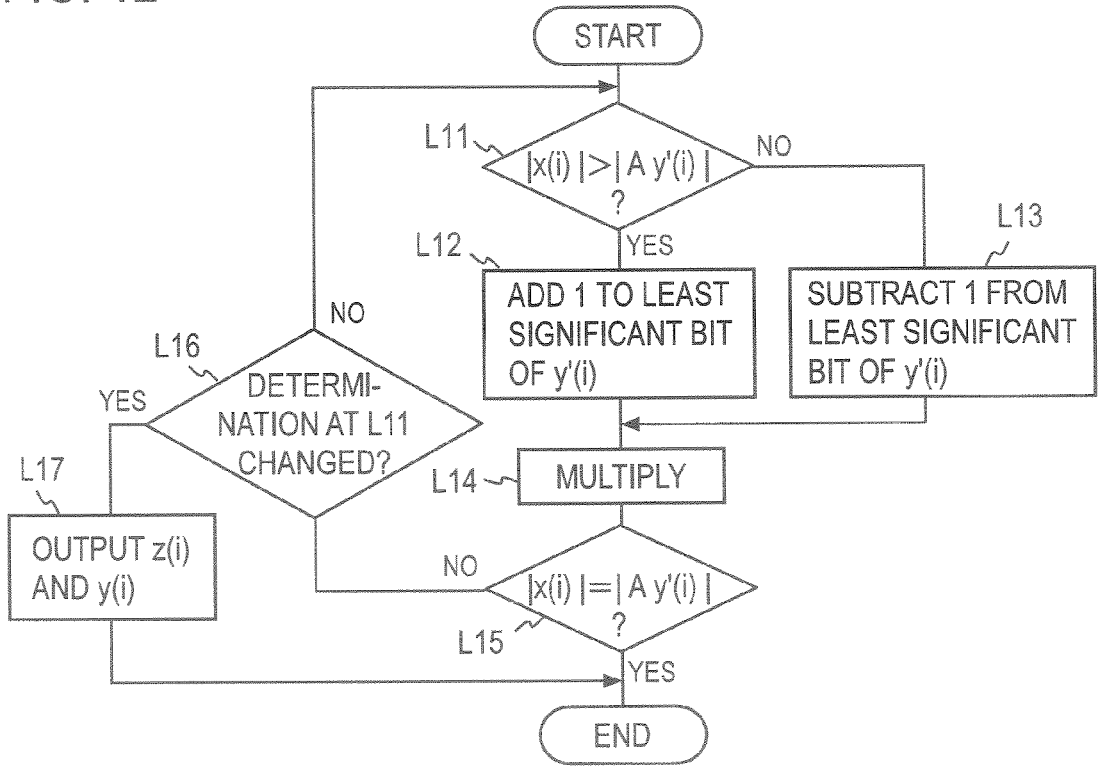
FIG. 12 is a flowchart of an exemplary process performed by the encoding apparatus.

Another example will be described in which the amount of information of error signals z(i) is reduced by transforming quotient signals y(i). FIG. 11 shows an exemplary configuration of the relevant part used for the transformation and FIG. 12 shows an exemplary process.

The example differs from the first example (FIG. 2) in that a quotient signal y(i) obtained in a division section 120 is transformed so that the error signal z(i) outputted from an error calculating section 140 in the encoding apparatus is minimized.

For example, if y(i) is calculated to a predetermined number of significant digits in the division section 120, by rounding down or off to the significant digits, the y(i) contains a round-off error. Similarly when decoded y(i) decoded in the multiplication section 210 is multiplied by a decoded multiplier A in a decoding process in a decoding apparatus (FIG. 4), a round-off error can be produced. The second rounding may accumulate errors, which may result in a large error signal z(i).

In this example, y(i) is transformed to y'(i) beforehand by taking into consideration rounding errors produced by the multiplications in decoding thereby reducing the amount of information of error signals z(i).

A quotient signal y(i) of each input sample x(i) for each input sample x(i) is individually transformed and the transformed error signal that provides the minimum error signal z(i) is chosen as y'(i). This can reduce the impact of an error included in a multiplier A estimated in the multiplier estimating section 110. For example, if most of the 1,024 samples x(i) in one frame is divisible by a multiplier A in the range of the number of significant digits and only the rest of the samples x(i) is indivisible by the multiplier A, the amount of information of error signals z(i) can be reduced by the transformation of y(i).

The division section 120 divides x(i) by A and provides a rounded quotient signal y(i) to a transformation section 160.

The transformation section 160 transforms y(i) provided from the division section 120 and determines y'(i) transformed so that z(i) is minimized. The process for determining y'(i) will be briefly described with reference to FIG. 12 (details will be described later). Determination is made as to whether the absolute value of an input signal sample x(i) is greater than the absolute value of the product of multiplication performed in a multiplication section 130, |Ay'(i)| (step L11). If so, 1 is added to the least significant bit of y'(i) (step L12). For example, if y'(i) in binary representation is

+1.0000000000000000111111×2^0.

adding 1 to the least significant bit of y'(i) provides the value 1.0000000000000001000000×2^0.

If |x(i)| is not greater than |Ay'(i)| at step L11, 1 is subtracted from the least significant bit of y(i) (step L13). After step L12 or L13, the transformed y'(i) is multiplied by a multiplier A in the multiplication section 130 (step L14). Determination is made as to whether the absolute value |Ay'(i)| of the product is equal to the absolute value |x(i)| of the input sample (step L15). If not determination is made as to whether the determination at step L11 has changed (step L16). For example if the previous determination is |x(i)|>|Ay'(i)| and current determination is |x(i)|<|Ay'(i)|, the previous error signal z(i) or the current error signal z(i) whichever is smaller is provided to a Z-encoder 14 and the corresponding y(i) is provided to a Y-encoder 13 (step L17). Therefore the previous error signal z(i) from the error calculating section 140 is always held so that it can be compared with the current one and be outputted. It should be noted that the initial value of y'(i) is y(i).

If it is determined at step L16 that the determination at step L11 has not been changed, the process returns to step L11. If the values compared at step L15 are matched, then the error signal z(i)=0 and the transformation process to y(i) for the input sample x(i) will end. Provided in the transformation section 160 are a determining section 160a that make determinations at steps L11, L15, L16 and L17, an addition/subtraction section 160b that transforms and holds the previous y'(i) at steps L12 and L13 and a memory 160c for storing an error signal required at step L17.

The error signal z(i) may be fed back to the transformation section 160 so that transformation similar to step L12 or L13 can be performed on the basis of the polarity (code) of the output z(i) from the error calculating section 140 to determine y'(i) that provides the minimum error signal z(i). The processing by the transforming section 140 in essence is to increase or decrease the least significant digits of y(i) by a minimum unit to determine y'(i) such that the error signal z(i) is minimized.

If there is more than one candidate y'(i) that minimizes the error signal z(i), the y'(i) whose non-zero bit closest to the LSB (least significant bit) is closest to the MSB (most significant bit) among the candidates is selected (because the compression efficiency of the encoding apparatus may be improved by decreasing the number of non-zero bits of y'(i)).

Alternatively, if there is more than one y'(i) that minimizes the error, the y'(i) that contains the least 1s in bits may be selected.

The y'(i) transformed from y(i) as described above is inputted in the Y-encoder 13. It should be noted that the quotient of division in the division section 120 may be obtained to a precision with more significant digits of y(i) than a desired number without rounding and y'(i) may be obtained by transforming y(i) so that the entire error signal z(i) including errors due to rounding of the product of multiplication in the multiplication section 130 is minimized. That is, rounding may be performed in the division section 120 or may be performed in the transformation section 160 at the same time as transformation, provided that the multiplication in the multiplication section 130 in the encoding apparatus provides the same result as that of multiplication performed in the multiplication section 210 of the decoding apparatus.

FOURTH EXAMPLE

Quotient Signal Transformation

While quotient signals y(i) are transformed also in a fourth example, the fourth example differs from the third example in that a different measure for evaluation is used to determine y'(i). When a Y-encoder 13 and a Z-encoder 14 use a lossless coding scheme, y(i) is transformed into y'(i) in a transformation section 170 so that the total volume of codes $C_Y$ and $C_Z$ is minimized. For example, the number of significant digits of y'(i) may be varied in a predetermined range to find y'(i) that results in the smallest total size of an output code.

Figure 13:
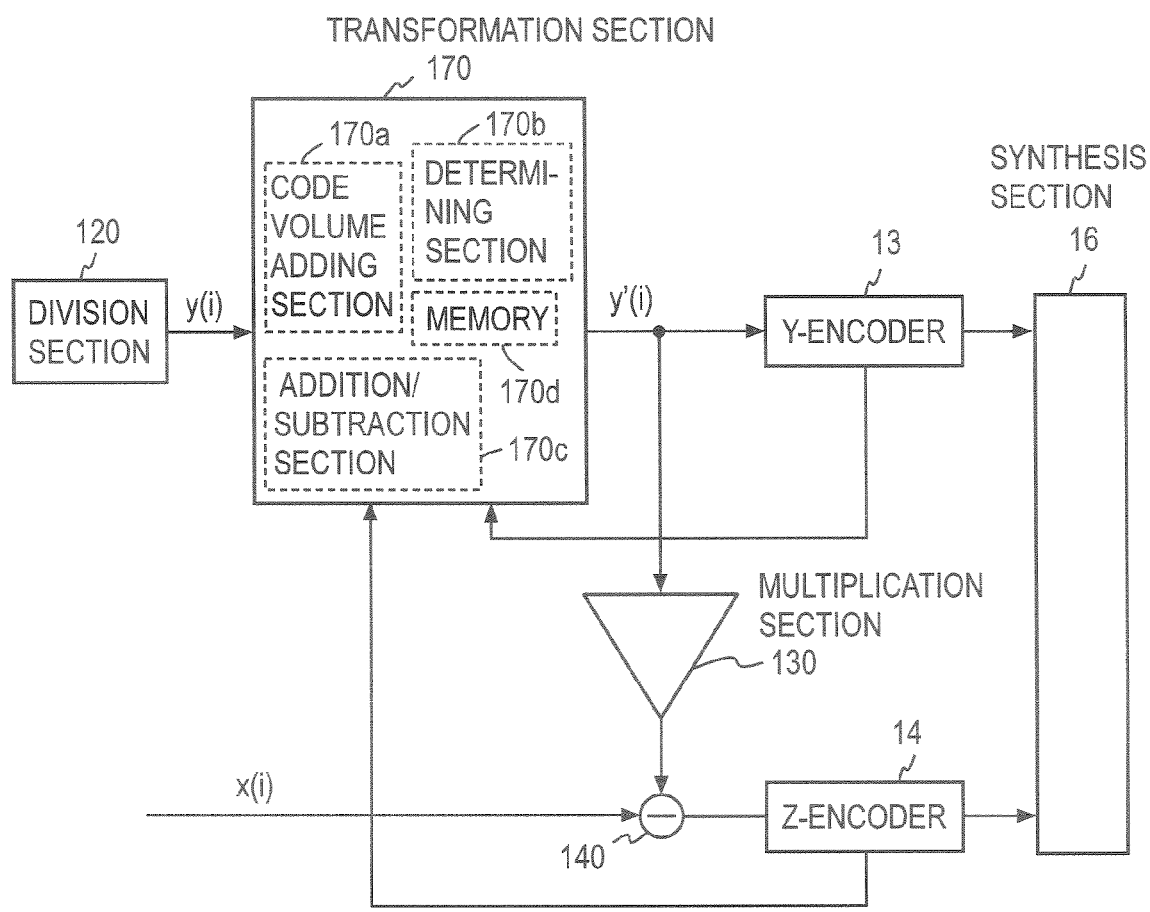
FIG. 13 shows an exemplary functional configuration of an encoding apparatus in a fourth example.
Figure 14:
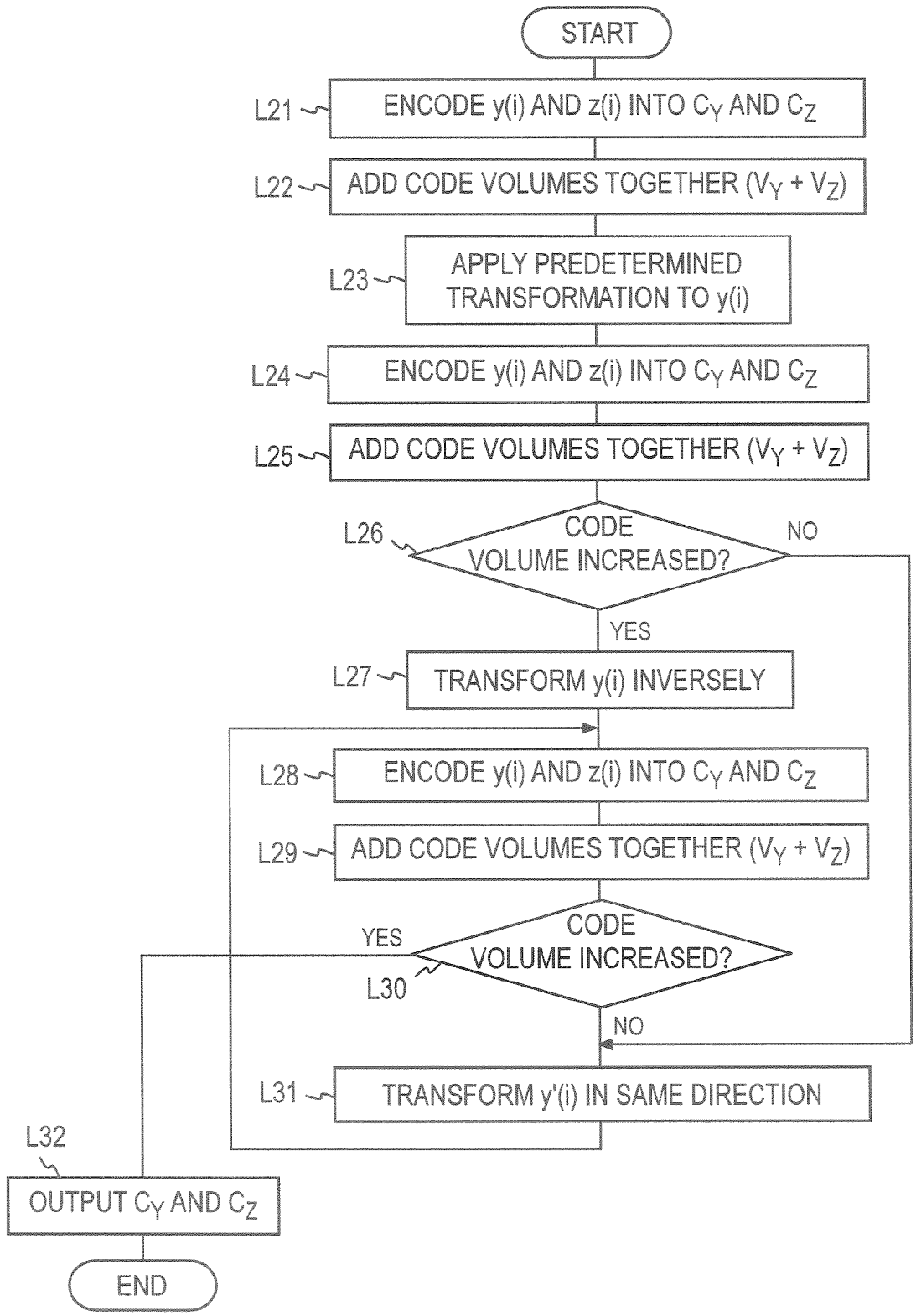
FIG. 14 is a flowchart of an exemplary process performed by the encoding apparatus.

FIG. 13 shows an exemplary functional configuration of the relevant part and FIG. 14 shows an exemplary process. A quotient signal y(i) from a division section 120 is inputted in a transformation section 170. First, y(i) and its corresponding error signal z(i) are individually encoded (step L21). The volume $V_Y$ of code $C_Y$ and the volume $V_Z$ of code $C_Z$ are added together to obtain the sum (the number of bits) $V_Y+V_Z$ (step L22). Then, a predetermined minimum unit transformation for example addition of 1, is applied to the least significant bit of the significant digits of y(i) (step L23). The transformed quotient signal y'(i) and an error signal z(i) obtained on the basis of y'(i) are coded in the Y-encoder 13 and Z-encoder 14, respectively (step L24). The sum (the number of bits) of the volumes of code $C_Y$ and $C_Z$ is calculated (step L25).

Determination is made as to whether the volume of codes has increased from the previous value (step L26). If it has increased the inverse of the transformation applied to y(i) is performed. That is, if 1 has been added to the least significant bit at step L23, 1 is subtracted from the least significant bit. The transformed y(i) and its corresponding z(i) are coded (step L28), the sum of the volumes of these codes is calculated (step L29), and determination is made as to whether the volume of codes has been increased or decreased (step L30).

If the volume has not increased, y(i) is transformed in the same direction, then the process returns to step L28 (step L31). If the volume of codes has not increased at step L26, the process proceeds to step L31. If it is determined at step L30 that the volume of codes has increased, the codes $C_Y$ and $C_Z$ that correspond to the previous volume of codes or the current volume of codes whichever is smaller, are provided to the synthesis section 16 (step L32).

Provided in the transformation section 170 are a code volume adding section 170a that adds the volumes of $C_Y$ and $C_Z$ together at steps L22, L25, and L29, a determining section 170b that makes determination at steps L26 and L30 and comparison of volumes at step L32, an addition/subtraction section 170c that transforms y(i) at steps L24, L27, and L31, and a memory 170d used in comparison of the volumes of codes at step L32 and also used for outputting the previous $C_{Y'}$ and $C_Z$.

If a bit sequence of y(i) contains successive 1s, for example, they can be transformed to successive 0s by adding 1 to generate carries. In that case the volume of the error signal z(i) increases by the added 1 multiplied by A. However, the efficiency of coding of y'(i) is improved and therefore the entire volume of the codes decreases.

FIFTH EXAMPLE

Quotient Signal Transformation

Figure 15:
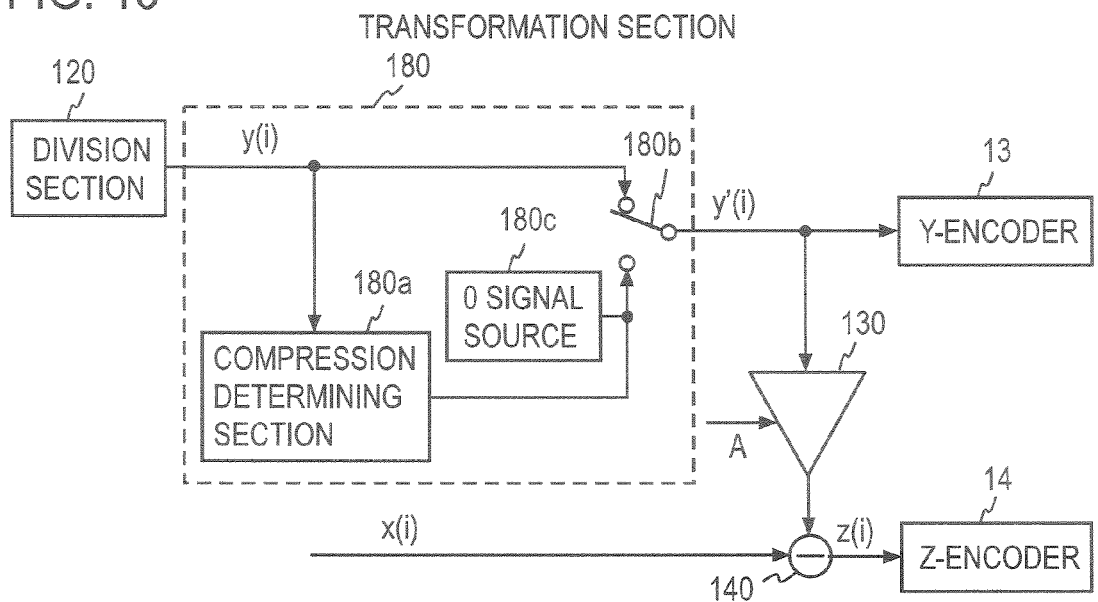
FIG. 15 shows an exemplary functional configuration of a relevant part of an encoding apparatus in a fifth example.

In a fifth example, the quotient signal y(i) of x(i) divided by A is observed in a compression determining section 180a in the transformation section 180 as schematically shown in FIG. 15 for example. Determination is made in a Y-encoder 13 as to whether the signal meets a condition for efficient compression. For samples that do not meet the condition, y'(i)=0 is set. If a sample does not meet the condition, the compression determining section 180a provides an output to turn a switch 180b to a 0 signal source 180c to transform the sample to y'(i)=0. When y'(i)=0 a multiplication section 130 outputs 0 and an error calculating section 140 outputs z(i)=x(i). If the compression determining section 180a determines that y'(i) meets the condition, the switch 180b is switched and connected to a division section 120 and y(i) is outputted from the transformation section 180 as y'(i).

In this way, if x(i) of a sample can be efficiently compressed than y (i) of the sample, the total compression ratio can be improved by compressing x(i).

It can be said that both in the fourth and fifth examples y(i) is transformed so that x(i) minus x'(i) is minimized.

Third Embodiment

SIXTH EXAMPLE

Lossy Encoding

In a sixth example, quotient signals y(i) are encoded using a lossy coding scheme. An exemplary functional configuration is shown in FIG. 6 A quotient signal y(i) from a division section 120 is encoded in lossy Y-encoder 31 using a lossy compression encoding scheme. The encoded code $C_Y$ is decoded in a decoder 32, the decoded signal y(i) is multiplied by a multiplier A, and the resulting x'(i) is subtracted from x(i) to obtain an error signal z(i).

Processing in the decoding apparatus may be performed in the same manner that is shown in FIG. 4, except that the Y-decoder 53 uses a lossy decompression decoding scheme corresponding to the lossy compression encoding scheme used in the lossy Y-encoder 31.

When a lossy Y-encoder 31 and Y-decoder that use a known lossy coding scheme are used in this way, the entire signal can be losslessly coded by using a lossless coding scheme and the corresponding lossless decompression decoding scheme in encoders 14 and 15 and decoders 54 and 55. If lossy coding is also used in the Z-encoder 14 and the Z-decoder 54 the entire signal will be lossily coded.

Figure 16:
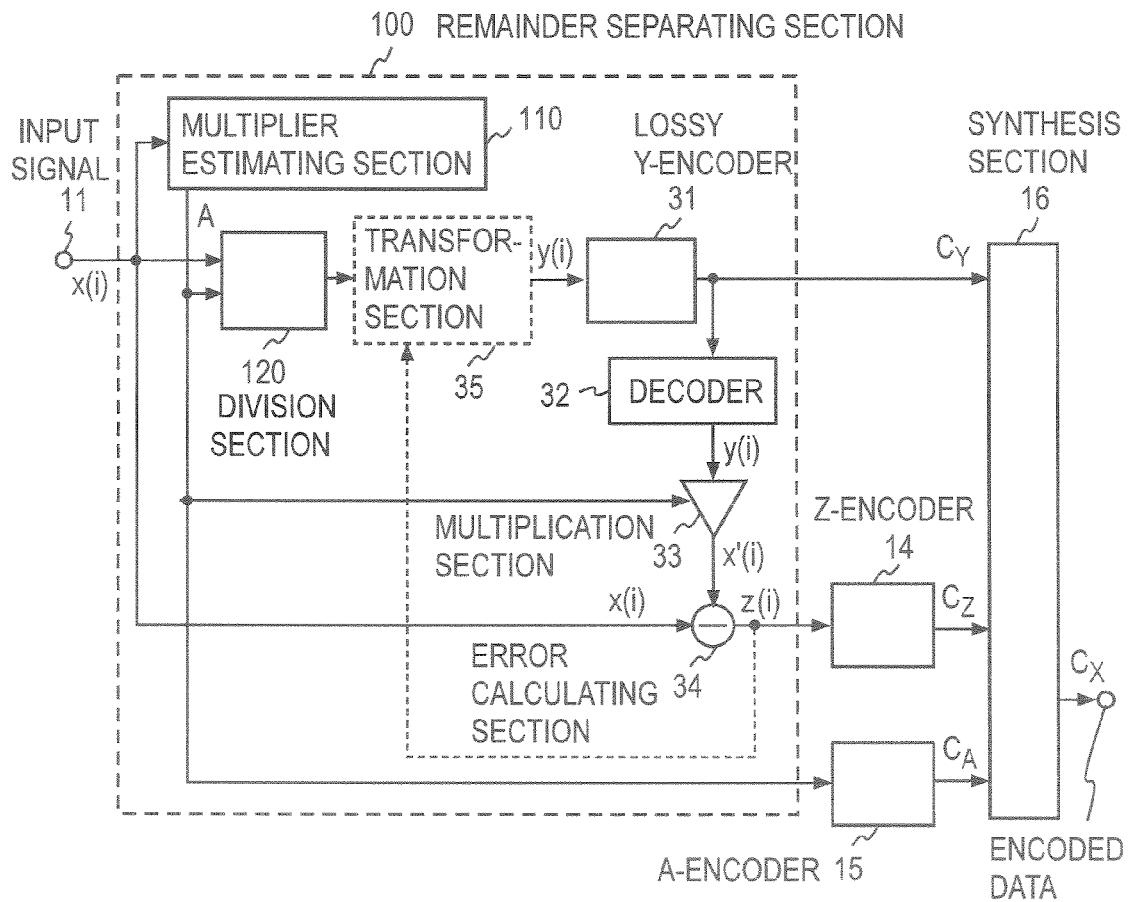
FIG. 16 shows an exemplary functional configuration of a relevant part of an encoding apparatus in a sixth example.

A transformation section 35 may be provided between the division section 120 and the lossy Y-encoder 31 as indicated by the dashed line in FIG. 16 and an error signal z(i) from an error calculating section 34 may be inputted in the transformation section 35, where y(i) may be transformed in such a manner that the error signal z(i) is minimized, and the transformed y(i) may be inputted in the lossy Y-encoder 31. Similarly, y(i) may be transformed on the basis of the size of coded data $C_X$ in the transforming section so that the size of the entire code, namely the volume of the coded data $C_X$, is minimized, and the transformed y(i) may be provided to the lossy Y-encoder 31.

Fourth Embodiment

SEVENTH EXAMPLE

In a fourth embodiment if x(i) can be efficiently compressed by separating it into a quotient signal y(i), an error signal z(i), and a multiplier A and encoding them individually rather than by directly encoding x(i), x(i) is separated before encoding; otherwise, x(i) is directly compression-encoded. An exemplary encoding apparatus according to the fourth embodiment is shown in FIG. 17 and a decoding apparatus is shown in FIG. 18

Figure 17:
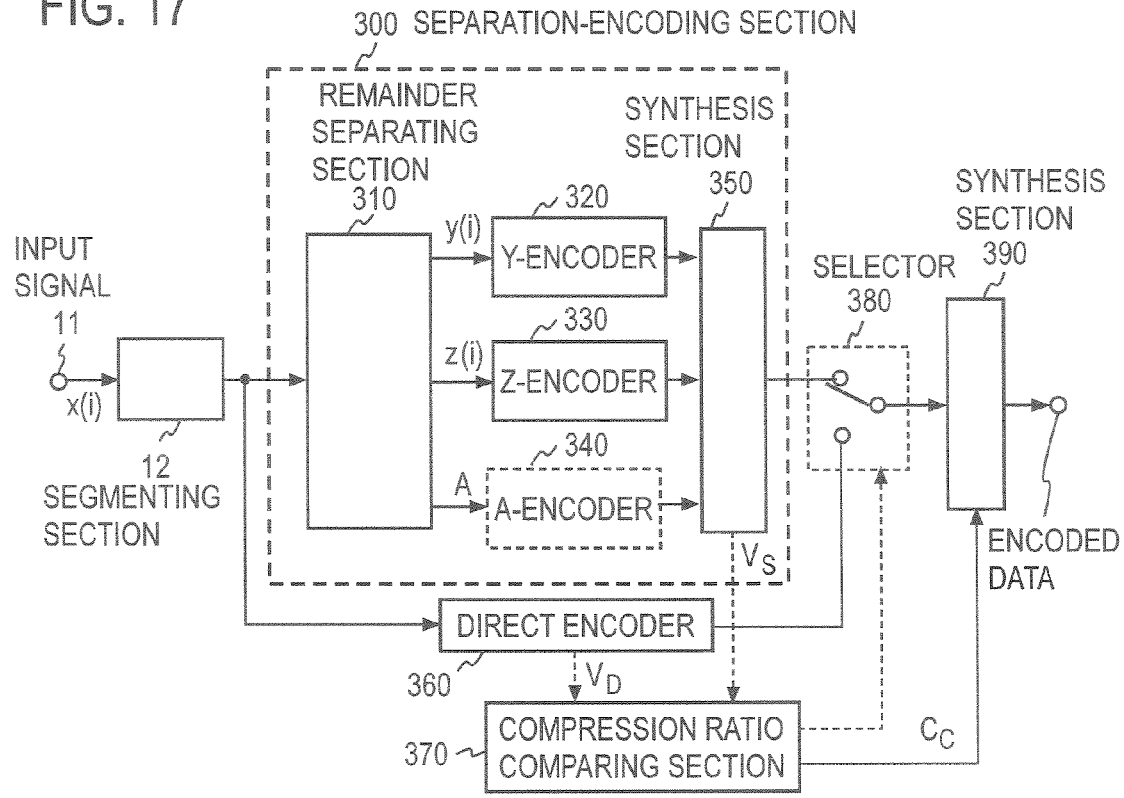
FIG. 17 shows an exemplary functional configuration of a relevant part of an encoding apparatus in a seventh example.
Figure 18:
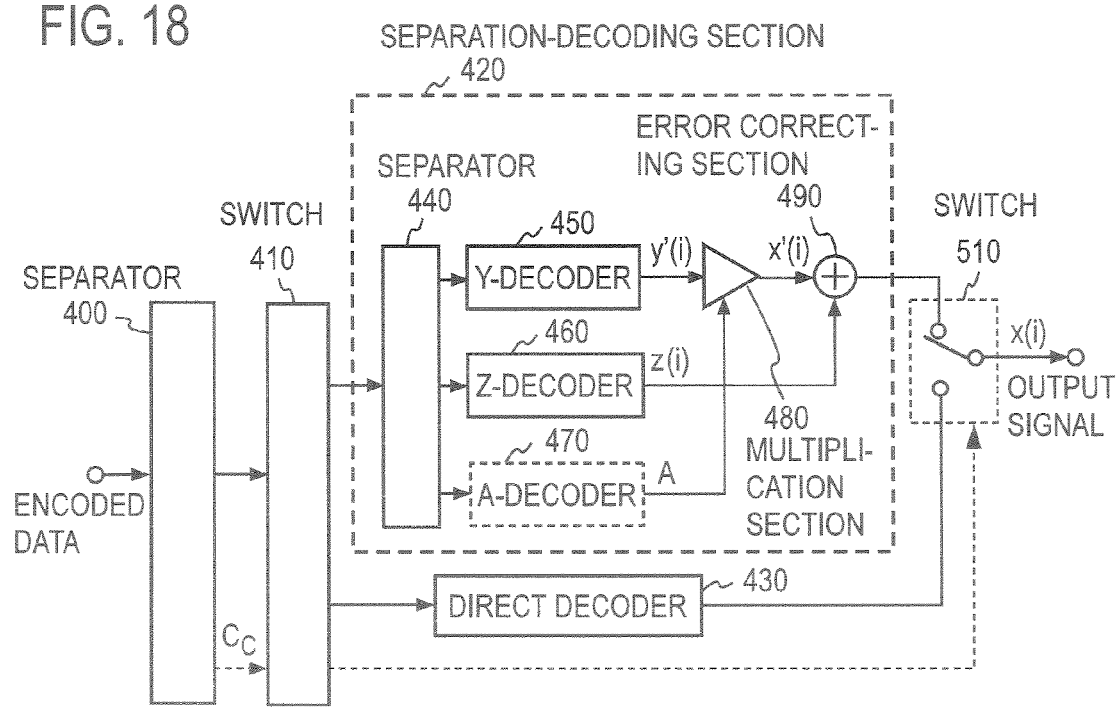
FIG. 18 shows an exemplary functional configuration of a relevant part of a decoding apparatus in the seventh example.
Figure 19:
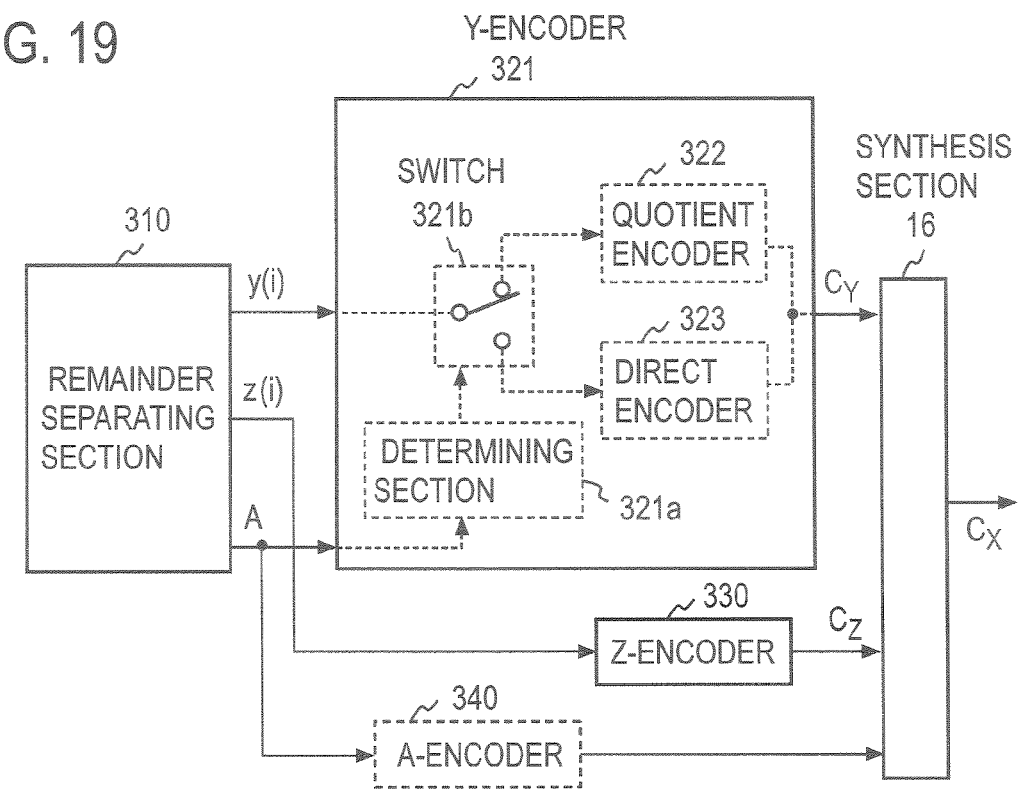
FIG. 19 shows an exemplary functional configuration of a relevant part of an encoding apparatus in a variation of the seventh example.

A separation-encoding section 300 in FIG. 17 includes a remainder separating section 310, a Y-encoder 320 that uses a lossless coding scheme, a Z-encoder 330 that uses a lossless coding scheme, and an A-encoder 340, which is provided as required, and a synthesis section 350. The set of elements correspond to any of the sets shown in the first to fifth example. A direct encoder 360 directly encodes an input signal x(i). The volume of data (amount of information or the number of bits) $V_s$ of data $C_{SX}$ coded in the separation-encoding section 300 is compared in a compression ratio comparing section 370 with the volume $V_D$ of data $C_{DX}$ coded in the direct encoder 360. A selector 380 selects one of the coded data that has a smaller volume. A synthesis section 390 combines the selected coded data with a selection code (1 bit) $C_C$ indicating which of the coded data is selected and outputs the combined data as coded data $C_X$.

In the decoding apparatus, a separator 400 separates the coded data $C_X$ into the coded data and the selection code $C_C$. If the code $C_C$ indicates that the data is separation-coded data $C_{SX}$, a switch 410 is controlled to input the coded data $C_{SX}$ in a separation-decoding section 420. If the code $C_C$ indicates that the data is directly coded data $C_{DX}$, the switch 410 is controlled to input the directly coded data $C_{DX}$ in a direct decoder 430.

The set of a separator 440, a Y-decoder 450 that uses a lossless decoding scheme, a Z-decoder 460 that uses a lossless decoding scheme, and an A-decoder 470 which is provided as required, a multiplication section 480, and an error correcting section 490 in the separation-decoding section 420 corresponds to any of the decoding apparatuses in the first to fifth example. A switch 510 outputs a decoded signal from the separation-decoding section 420 or a decoded signal from the direct decoder 430 in accordance with the selection code $C_C$. The switch 510 may be omitted and the outputs of the separation-decoding section 420 and the decoder 430 may be interconnected so as to output a decoded signal.

The direct encoder 360 may not separately be provided and the selection code $C_C$ may be omitted. For example, a multiplier A is inputted in the Y-encoder 321 in addition to a quotient signal y(i) from the remainder separating section 310 as shown in FIG. 9. In that case, a determining section 321a in the Y-encoder 321 determines whether the multiplier A is 1.0 or not. If the multiplier A is not 1.0, a switch 321b is controlled to input the quotient signal y(i) in a quotient encoder 322, where encoding suitable to the quotient signal y(i) is performed. If the determining section 321a determines that the multiplier A=1.0, the switch 321b is controlled to input the quotient signal y(i), that is, the input signal x(i), in the direct encoder 323. Since A is 1.0 in this case the division section 120 outputs the quotient signal y(i)=x(i). Therefore, a coding scheme suitable for encoding x(i) is performed in the direct encoder 323. The selection code $C_C$ is not outputted. Also, the selector 380 and synthesis section 390 are omitted and the configuration shown in FIG. 17 is simplified accordingly.

Figure 20:
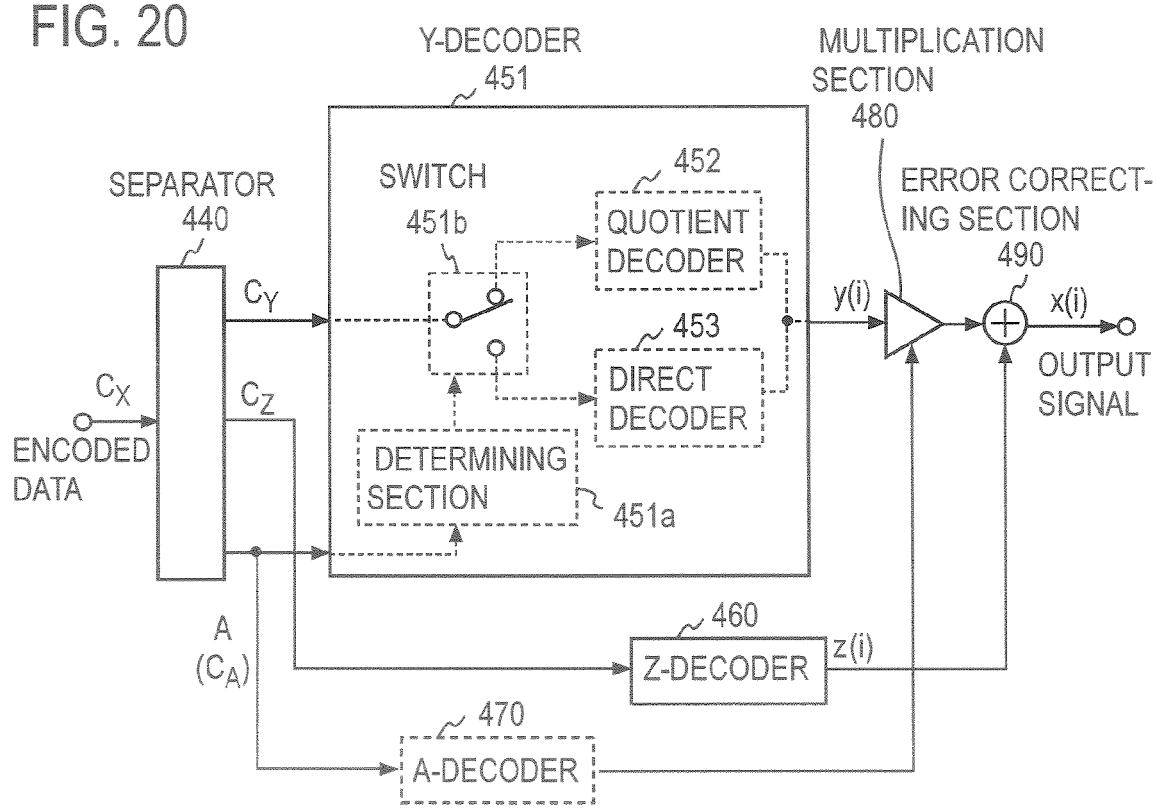
FIG. 20 shows an exemplary functional configuration of a decoding apparatus corresponding to the encoding apparatus in FIG. 19.

FIG. 20 shows a corresponding decoding apparatus. Code $C_Y$ separated in a separator 440 is inputted in a Y-decoder 451 and a separated multiplier A (or code $C_A$) is also inputted in the Y-decoder 451. If it is determined in a determining section 451a that a multiplier A is not 1.0, a switch 451b causes the code $C_Y$ to be inputted in a quotient decoder 452. The quotient decoder 452 performs decoding suitable for the code $C_Y$. If it is determined in the determining section 451a that A=1.0 the switch 451b causes the code $C_Y$ to be directly inputted in a direct decoder 453, which then performs decoding suitable to the code $C_Y$. The decoded signal y(i) outputted from the Y-decoder 451 is inputted in a multiplication section 480, where y(i) is multiplied by the multiplier A. This configuration is simpler than the one shown in FIG. 18.

EIGHTH EXAMPLE

Figure 21:
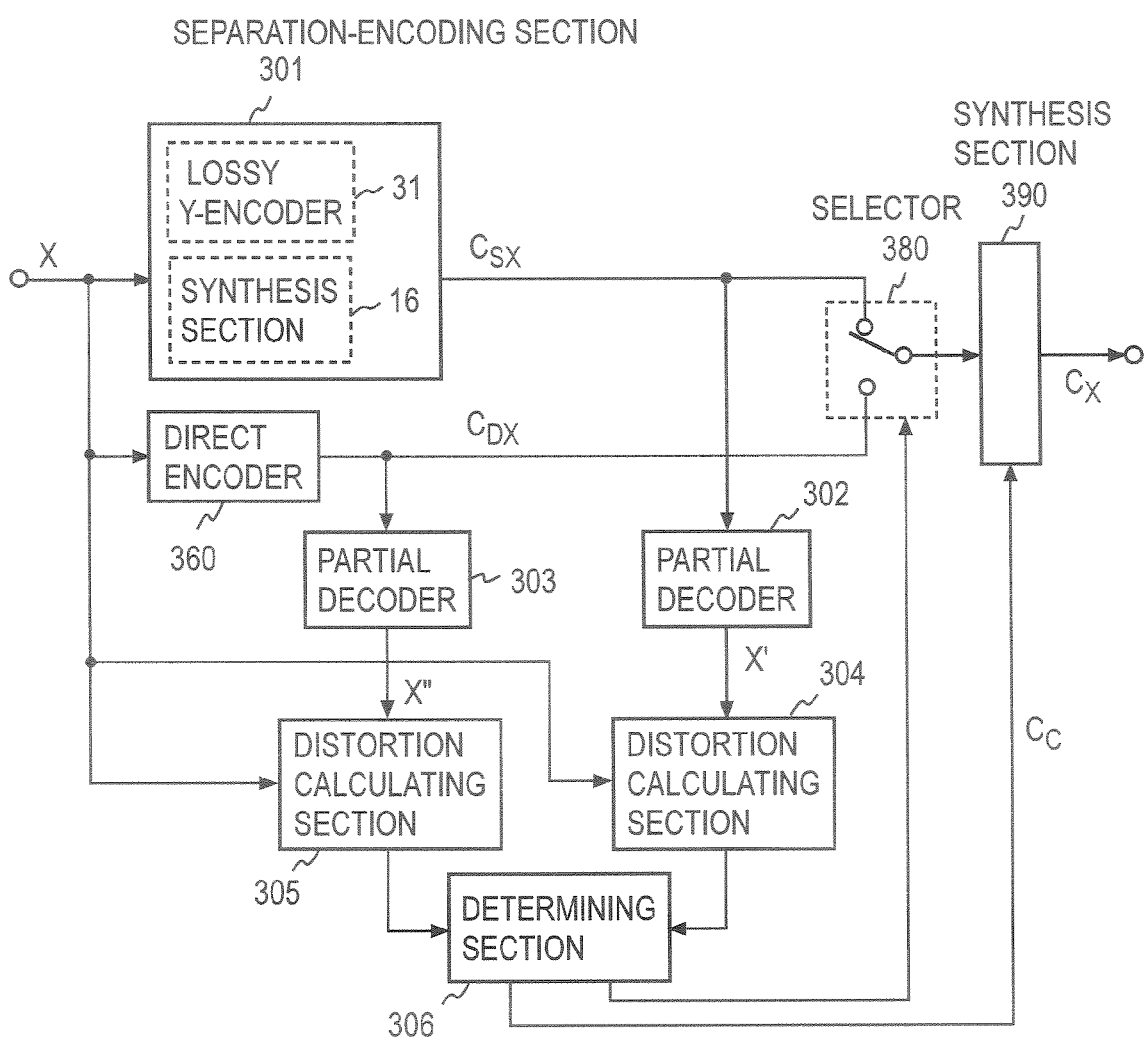
FIG. 21 shows an exemplary functional configuration of an encoding apparatus in an eighth example.

An eighth example, which is another example in which separation coding and direct coding are performed, is schematically shown in FIG. 21. A separation-encoding section 301 used in this example uses lossy compression encoding in a lossy Y-encoder 31. It is more important for the decoding end that the distortion of a coded waveform become small than the size of a code (the volume of the code) become small.

Coded data $C_{SX}$ consisting of a Y code $C_Y$, an error code $C_Z$, and a multiplier A (or its code $C_A$) from the separation-encoding section 301 is decoded in a partial decoder 302 to obtain a decoded signal sequence X'. Coded data $C_{DX}$ from a direct encoder 360 is decoded in a partial decoder 303 to obtain a decoded signal sequence X". A distortion calculating section 304 calculates a waveform distortion between partial decoded signal sequence X' and the original input signal sequence X. A distortion calculating section 305 calculates a waveform distortion between a partial decoded signal sequence X" and the original input signal sequence X. A determining section 306 determines which of the distortions is smaller. A selector 380 selects the coded data having the smaller distortion according to the result of the determination. A synthesis section 390 combines the coded data from the selector 380 with a selection code $C_C$ indicating the selected coded data in the determining section 306 and outputs coded data $C_X$.

Fifth Embodiment

In a fifth embodiment, remainder isolation is recursively applied to a quotient signal sequence Y and or an error signal sequence Z obtained through remainder isolation.

NINTH EXAMPLE

Coding 1

Figure 22:
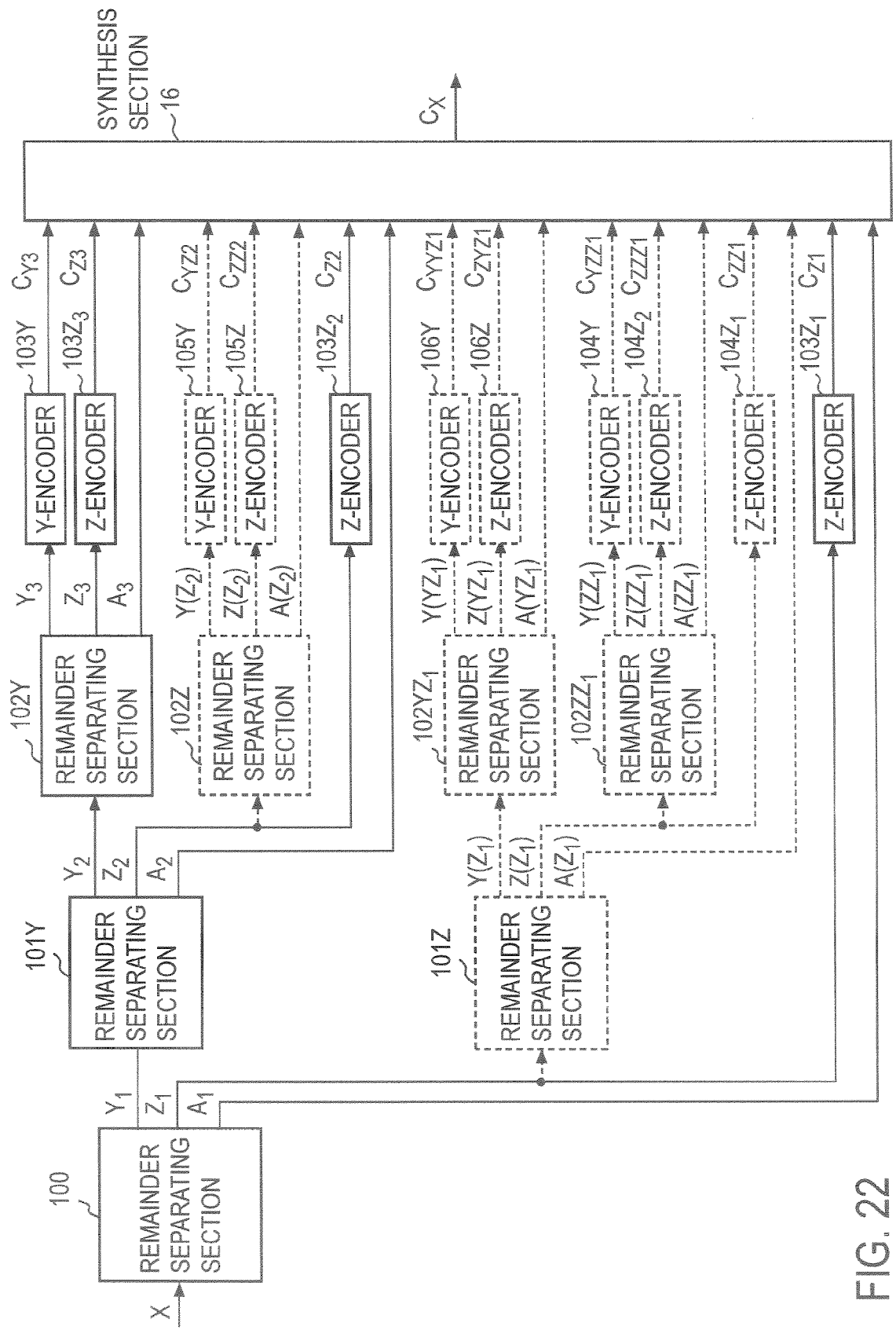
FIG. 22 shows an exemplary functional configuration of an encoding apparatus in a ninth example.

FIG. 22 shows an exemplary functional configuration. An input signal sequence X is inputted in a remainder separating section 100, where it is separated into a quotient signal sequence $Y_1$, an error signal sequence $Z_1$, and a multiplier $A_1$. The quotient signal sequence $Y_1$ is further separated in a remainder separating section 101Y into a quotient signal sequence $Y_2$, an error signal sequence $Z_2$, and a multiplier $A_2$. The quotient signal sequence $Y_2$ is separated in a remainder separating section 102Y into a quotient signal sequence $Y_3$, an error signal sequence $Z_3$, and a multiplier $A_3$.

Three recursive isolations have been performed in this example. The final quotient signal sequence $Y_3$ is encoded using lossless compression encoding in a Y-encoder 103Y and is outputted as a code $C_{Y3}$. The error signal sequences $Z_1$, $Z_2$ and $Z_3$ are lossless-compression-coded in Z-encoders $103Z_1$, $103Z_2$, and $103Z_3$, respectively, and are outputted as codes $C_{Z1}$, $C_{Z2}$, and $C_{Z3}$, respectively. The multipliers $A_1$, $A_2$, and $A_3$ are outputted directly or losslessly coded and outputted as $C_{A1}$, $C_{A2}$, and $C_{A3}$. A synthesis section 16 combines codes $C_{Y3}$, $C_{Z1}$, $C_{Z2}$, $C_{Z3}$, and $A_1$ (or $C_{A1}$), $A_2$ (or $C_{A2}$), and $A_3$ (or $C_{A3}$) together and outputs the combined codes as coded data $C_X$.

The error signal sequence $Z_1$ may also be recursively coded. An example is indicated by dashed boxes and lines in FIG. 22. The error signal sequence $Z_1$ is separated in a remainder separating section 101Z into a quotient signal sequence $Y(Z_1)$, an error signal sequence $Z(Z_1)$ and a multiplier A $(Z_1)$. The error signal sequence $Z(Z_1)$ is separated in a remainder separating section $102ZZ_1$ into a quotient signal sequence $Y(ZZ_1)$, an error signal sequence $Z(ZZ_1)$, and a multiplier A $(ZZ_1)$. The synthesis section 16 combines a losslessly encode code $C_{YZ1}$ of the quotient signal $Y_1$, a code $C_{YZZ1}$ of the quotient signal sequence $Y(ZZ_1)$ encoded by a lossless encoder 104Y, and codes $C_{ZZ1}$ and $C_{ZZZ1}$ of error signal sequences $Z(Z_1)$ and $Z(ZZ_1)$ losslessly encoded by encoders $104Z_1$ and $104Z_2$, respectively and multipliers $A(Z_1)$ (or its code $C_{AZ1}$) and $A(ZZ_1)$ (or its code $C_{AZZ1}$) together and outputs coded data $C_X$.

Furthermore, both of the quotient signal and error signal separated in the remainder separating section may be recursively separated and coded. In that case the error signal $Z_2$ is separated in a remainder separating section 102Z into a quotient signal sequence $Y(Z_2)$, an error signal sequence $Z(Z_2)$, and a multiplier $A(Z_2)$ as indicated by dashed box and lines in FIG. 22. $Y(Z_2)$ and $Z(Z_2)$ are losslessly encoded in encoders 105Y and 105Z, respectively, and codes $C_{YZ2}$ and $C_{ZZ2}$ are outputted. The quotient signal sequence $Y(Z_1)$ separated in the remainder separating section 101Z is separated in a remainder separating section $102YZ_1$ into a quotient signal sequence $Y(YZ_1)$ an error signal sequence $Z(YZ_1)$, and a multiplier $A(YZ_1)$. The quotient signal sequence $Y(YZ_1)$ and the error signal sequence $Z(YZ_1)$ are encoded in encoders 106Y and 106Z, respectively, and lossless-encoded codes $C_{YYZ1}$ and $C_{ZYZ1}$ are output.

Finally, the synthesis section 16 combines codes $C_{Y3}$, $C_{Z3}$, $C_{YZ2}$, $C_{ZZ2}$, $C_{Z2}$, $C_{YYZ1}$, $C_{ZYZ1}$, $C_{YZZ1}$, $C_{ZZZ1}$, and $C_{ZZ1}$ and multipliers $A_3$, $A(Z_1)$, $A_2$, $A(YZ_1)$, $A(ZZ_1)$, $A(Z_1)$, and $A_1$ or their codes into coded data $C_X$.

TENTH EXAMPLE

Coding 2

Recursive separation coding is repeated until a quotient signal or an error signal to be encoded becomes indivisible or the code can no longer be reduced in size (the number of bits of coded data $C_X$) by separation.

Figure 23:
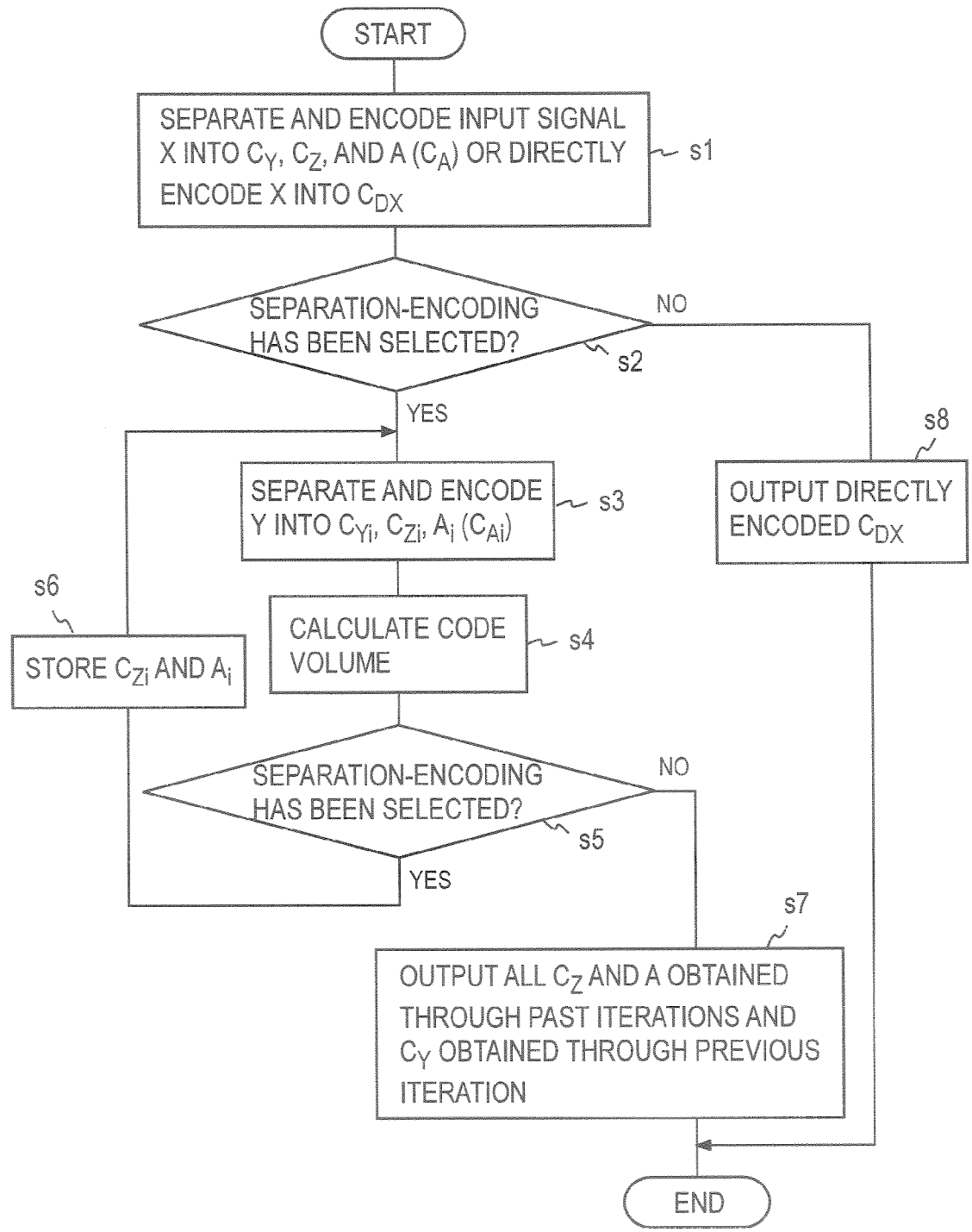
FIG. 23 is a flowchart of an exemplary process performed by an encoding apparatus in a tenth example.

In a tenth example, a quotient signal sequence Y is recursively divided. FIG. 23 shows a process for this. First, remainder separation is applied to an input signal sequence X and separation coding is used to obtain coded data $C_{SX}$ consisting of $C_Y$, $C_Z$, and A (or $C_A$). The input signal sequence X is also directly encoded to obtain coded data $C_{DX}$ (step s1). The size of the coded data $C_{SX}$ is compared with the size of the coded data $C_{DX}$ to determine whether separation coding should be chosen (step s2). If $C_{SX}$ is smaller in the volume of data and therefore separation coding is selected, remainder separation is applied to the separated quotient signal sequence Y and separation coding is used to obtain coded data $C_{Xi}$ consisting of a quotient code $C_{Yi}$, an error code $C_{Zi}$, and a multiplier $A_i$ or its code $C_{Ai}$) (step s3).

To obtain the volume of the coded data $C_X$ outputted at this point, the sum $V_{Si}$ (the volume of the coded data) of the number of bits of $C_{Yi}$ obtained through the current iteration and the numbers of bits of all error signals $C_{Zi}$ and multipliers $A_i$ obtained until now in the iterations is calculated (step s4). The data volume $V_{Si}$ is compared with the volume $V_D$ of the directly encoded data $C_{DX}$ to determine whether the data volume $V_{Si}$ is smaller than $V_D$ and is also smaller than the volume of the data $V_{Si-1}$ obtained through the previous iteration (step s5). If this condition is satisfied, $C_{Zi}$ and $A_i$ obtained through the current iteration are stored in a memory (step s6) and then the process returns to step s3.

If it is determined at step s5 that $V_{Si}$ is smaller than $V_D$ but greater than $V_{Si-1}$ or is not smaller than $V_D$, $C_{Yi}$ obtained in the previous iteration and all $C_{Zi}$ and $A_i$ obtained through the previous and past iterations are outputted as coded data $C_X$ (step s7). If it is determined at step s2 that the data volume $V_D$ is smaller, the directly coded data $C_{DX}$ is outputted as coded data $C_X$ (step s8).

ELEVENTH EXAMPLE

Decoding 1

Figure 24:
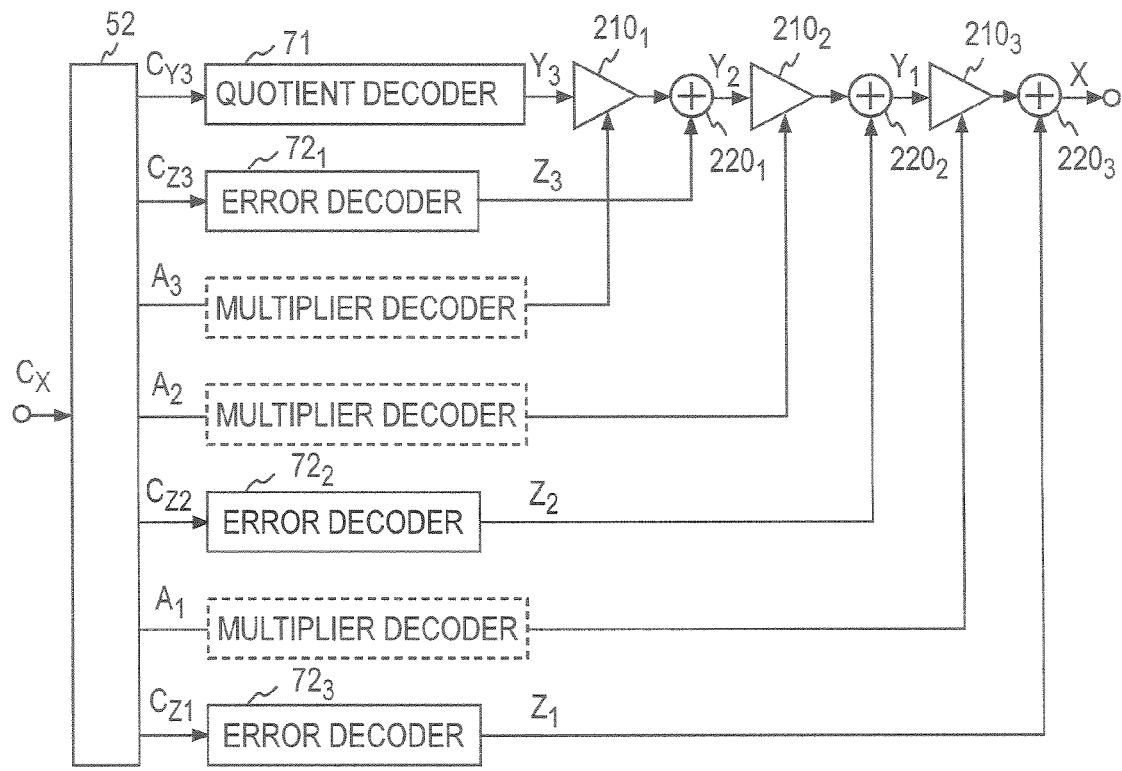
FIG. 24 shows an exemplary functional configuration of a decoding apparatus in an eleventh example.

FIG. 24 shows an example in which the coded data $C_X$ obtained by recursively encoding the quotient signal sequence Y shown in FIG. 22 is decoded. Code $C_{Y3}$ from the separator 52 is decoded in a quotient decoder 71 and $Y_3$ is outputted. A multiplication section $210_1$ multiplies $Y_3$ by multiplier $A_3$ from the separator 52. An error decoder $72_1$ decodes error code $C_{Z3}$ into an error signal sequence $Z_3$. A correcting section $220_1$ corrects the output from the multiplication section $210_1$ using the decoded error signal sequence $Z_3$ to obtain the quotient signal sequence $Y_2$.

The multiplication section $210_2$ multiplies $Y_2$ by a multiplier $A_2$ provided from a separator 52. An error decoder $72_2$ decodes an error signal $C_{Z2}$ provided from the separator 52 to obtain an error signal sequence $Z_2$. A correcting section $220_2$ corrects the output from the multiplication section $210_2$ with the error signal $Z_2$ to obtain a quotient signal sequence $Y_1$. The quotient signal sequence $Y_1$ is multiplied in a multiplication section $210_3$ by a multiplier $A_1$ provided from the separator 52. An error decoder $72_3$ decodes an error code $C_{Z1}$ provided from the separator 52 to obtain an error signal sequence $Z_1$. A correction section $220_3$ corrects the output from the multiplication section $210_3$ with the error signal sequence Z to output the original signal sequence X.

TWELFTH EXAMPLE

Decoding 2

Figure 25:
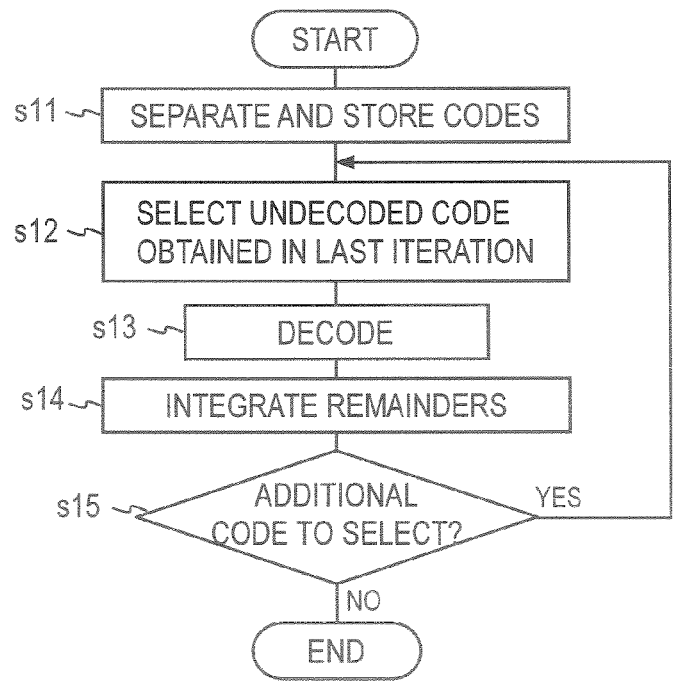
FIG. 25 is a flowchart of an exemplary process performed by a decoding apparatus in a twelfth example.

An example of a typical process for decoding the recursively encoded code will be described with reference to FIG. 25. First, an input coded data $C_X$ is separated into codes and the codes are stored in a memory (step s11). Then, the codes obtained at the last iteration of encoding that have not yet been decoded are selected from the memory (step s12). These codes are decoded (step s13). At first, a quotient signal an error signal and a multiplier are obtained. Subsequently, error signals and multipliers are obtained in the example shown in FIG. 24.

These decoded signals are used to perform a remainder integration (step s14). In particular, the decoded quotient signal (or the quotient signal obtained through the previous iteration) is multiplied. The result is corrected by using a decoded error signal.

Then, the memory is searched for whether there are codes that have not been selected. If so, the process returns to step s12; otherwise the process will end (step s1). Thus, the original input signal sequence X is restored by the decoding.

Sixth Embodiment

EXAMPLE 13

Figure 26A:
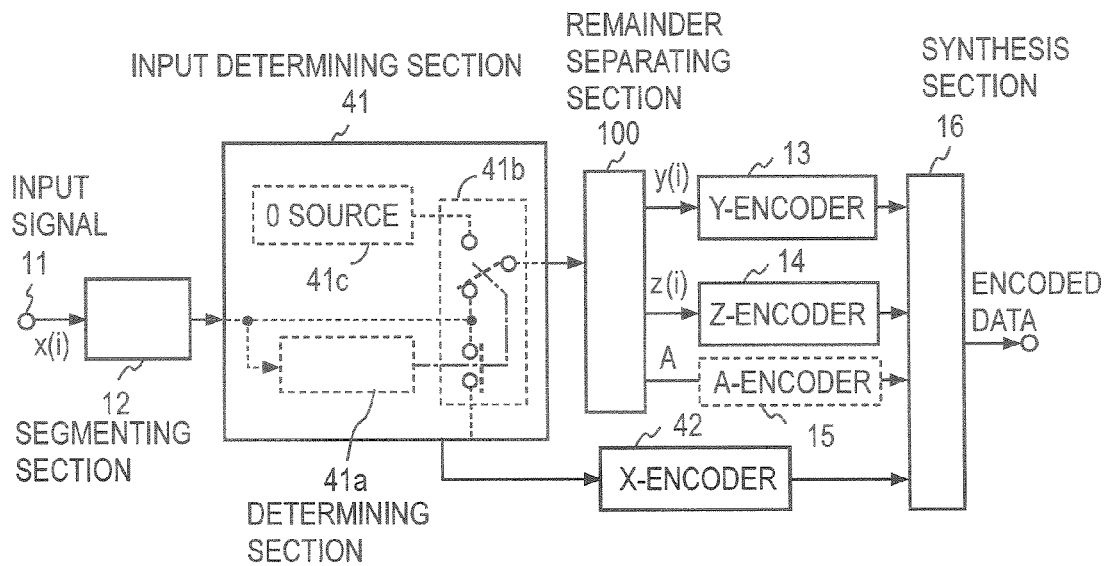
FIG. 26A is an exemplary functional configuration of an encoding apparatus in a thirteenth example.

In the foregoing examples, a signal is inputted in the remainder separating section 100 frame by frame. In a thirteenth example, x(i) is checked in an input determining section 41 to see whether it should be inputted in a remainder separating section 100 before it is inputted in the remainder separating section 100 as shown in FIG. 26A. For example, if an input sample is represented by a single-precision floating-point number, it may be an infinite value or a value called a NaN, that cannot be represented by a numeric value. If a determining section 41a of the input determining section 41 determines that x(i)=NaN, a switch 41b is controlled to cause a 0 source 41c to output 0 in stead of x(i) to the remainder separating section 100 and output x(i) to an X-encoder 42.

If a sample x(i) is 0, the input determining section 41 outputs 0 to the remainder separating section 100 and at the same time outputs 0 to the X-encoder 42.

The X-encoder 42 encodes x(i) and outputs the obtained code to a synthesis section 16.

Figure 26B:
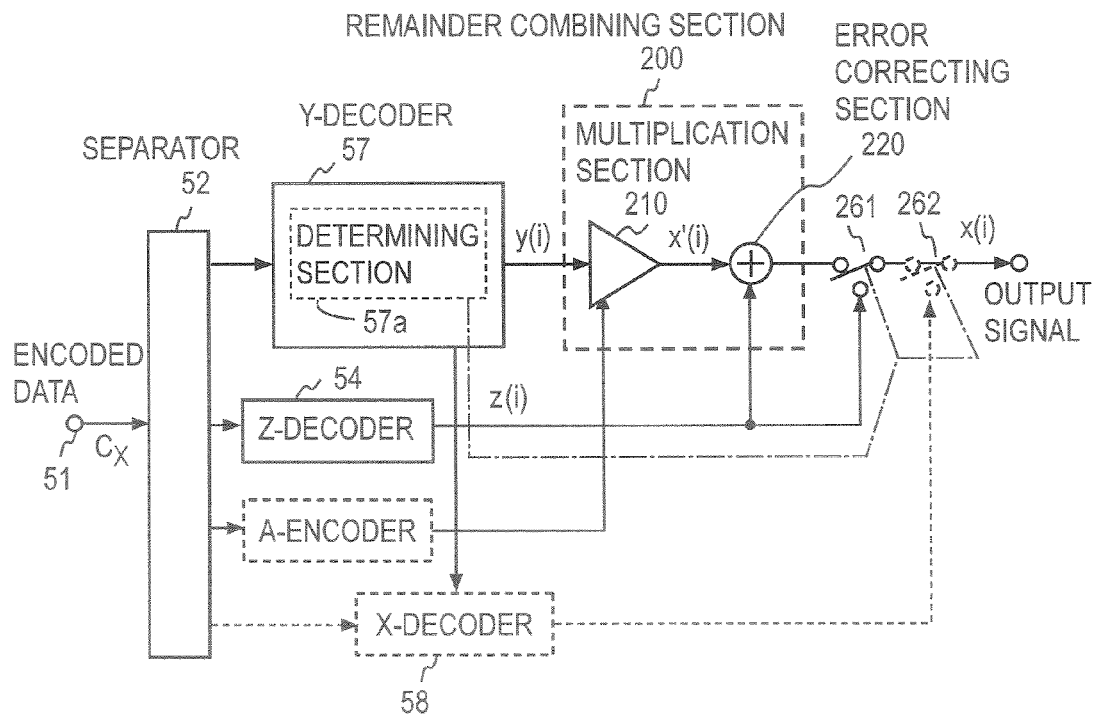
FIG. 26B shows an exemplary functional configuration of a decoding apparatus in the thirteenth example.

In a decoding apparatus, a Y-decoder 57 restores y(i) by decoding as shown in FIG. 26B. If a determining section 57a determines y(i)=0, the determining section 57a notifies it to an X-decoder 58. The X-decoder 58 decodes a code separated in a separator 52 that corresponds to y(i) and outputs x(i). Then x(i) is inputted in an error correcting section 220. The error correcting section 220 adds the decoded x(i) to x'(i)=0 that corresponds to the input y(i)=0.

FOURTEENTH EXAMPLE

In the third example (FIG. 11) a transformation y'(i) of y(i) is obtained that reduces error z(i) to the minimum.

An input sample x(i) can be a value to which division cannot be applied or division of which by a multiplier A results in too large an error. For example, an input sample represented by a single-precision floating-point number can be an infinitive value or a NaN, which cannot be represented by numeric value.

If an input signal x(i) is a NaN, y(i) obtained by division of x(i) by a multiplier A will also be a NaN. The encoding apparatus in this example has a transforming section 161 shown in FIG. 27 in place of transforming section 160 shown in FIG. 11. If a determining section 161a determines that y(i) provided from a division section 120 is a NaN, the transforming section 161 controls a switch 161b to cause y'(i)=0 to be outputted from a 0 source 161c to a Y-encoder 13 and a multiplication section 130.

The multiplication section 130 multiplies y'(i) by a multiplier A to provide x'(i). Since y'(i)=0, the output from the multiplication section 130 will be x'(i)=0 and the output z(i) from an error calculating section 140 will be x(i)=NaN. Then an error calculating section 140 calculates error. In the third example, x'(i) is subtracted from x(i) to obtain the error. However, if x(i)=NaN, subtraction cannot properly performed because no subtraction is defined for x(i)=NaN.

Therefore x(i) is set as an error signal z(i) without performing subtraction if y'(i)=0 in this example. It should be noted that a processing section 161*d* in the transforming section 161 in FIG. 27 has a function similar to that of the transforming section 160 in FIG. 11.

In an error correcting section 220 in a decoding apparatus, the reverse of the process described above must be performed.

That is, if restored y'(i)=0, x'(i) obtained by multiplication of y'(i) by a multiplier A will also be 0. Since x'(i) is 0, the error correcting section 220 outputs z(i)=x(i) restored by decoding in a Z-decoder 54 without correction.

A switch 261 may be controlled to output the decoded output z(i)=x(i) from the Z-decoder 54 as x(i) if the determining section 57*a* determines that y(i)=0, as shown in FIG. 26B. In that case, processing in multiplication section 130 and the error calculating section 140 is not required and the process is simplified.

Figure 27:
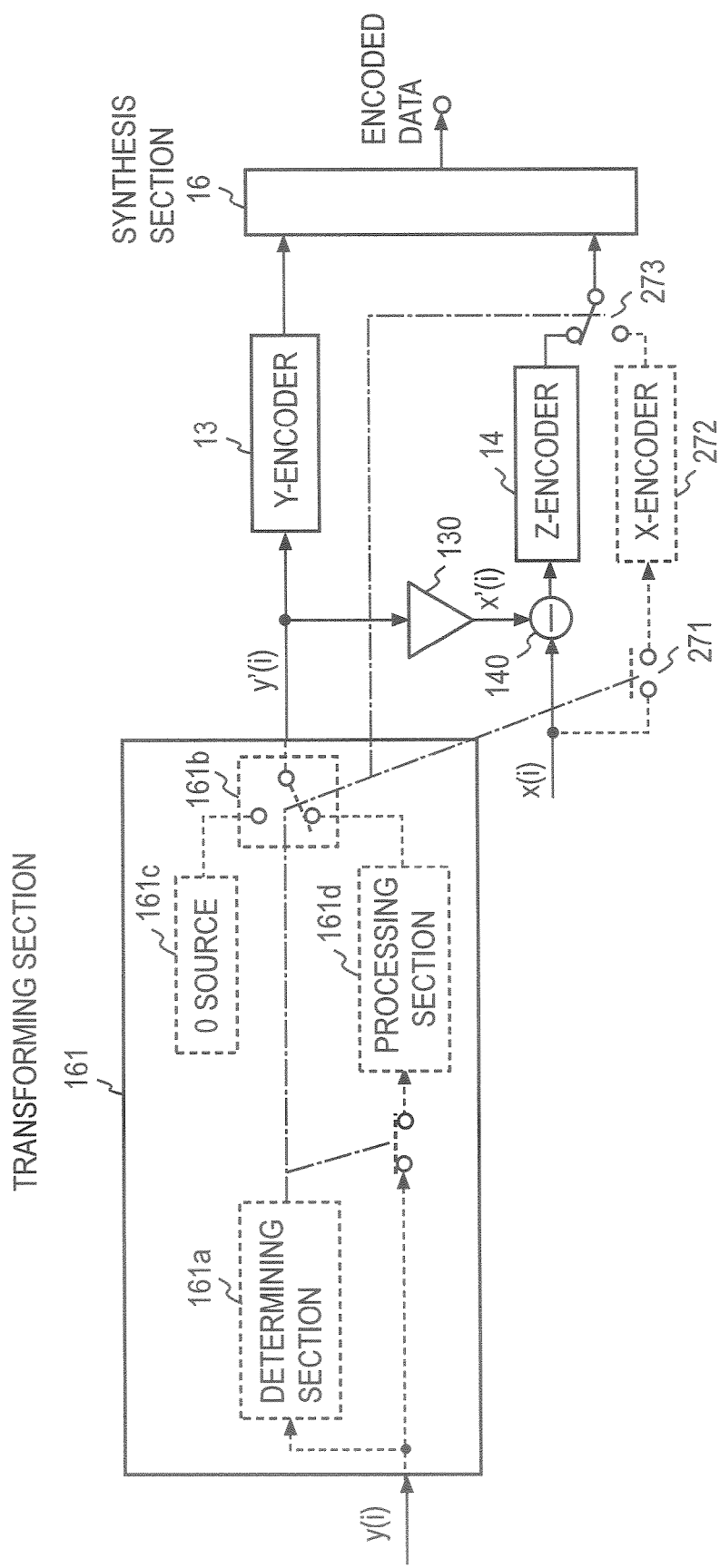
FIG. 27 shows an exemplary functional configuration of a relevant part of an encoding apparatus in a fourteenth example.

If the determining section 161*a* determines that y(i) is a NaN in FIG. 27, y'(i)=0 is provided. A switch 271 turns on and an X-encoder 272 encodes the input signal x(i). The encoded output $C_Z$ may be inputted in a synthesis section 16 through a switch 273. In that case, the decoding apparatus inputs the code $C_Z$ separated at the separator 52 into an X-encoder 58 as well, as shown in FIG. 26B. If the determining section 57*a* determines that decoded y(i) is 0, a switch 262 may be controlled to output the result of decoding by the X-decoder 58 as decoded x(i).

For the Z-encoder 14, coding schemes such as the Rice coding and algebraic coding are suitable. For the X-encoder 272, Huffman coding and LZ coding are suitable. The Z-decoder 54 and the X-decoder 26B1 use decoding schemes corresponding to the coding schemes used in their corresponding encoders.

In normalized form, a floating-point number is represented as 1 . . . , where the 23 bits in the decimal places are the mantissa. The minimum value of the exponent is −127. An exponent of −127 represents 0 or a denormal number. If an exponent is −126 and only the least significant bit of the mantissa is 1, the number is the minimum absolute value that can be represented in normalized for using a floating point. Numeric values less than this value in absolute value cannot be normalized for floating-point representation. If an input signal x(i) is a sample sequence represented in floating point form, x(i) can be a NaN or a denormal number. That is, if the exponent is −127 and the bit immediately preceding the most significant bit of the mantissa is not 1 (the value smaller than the minimum value that can be represented in normalized form of a binary floating point representation in the IEEE-754 format). If x(i) is a denormal number, further division of x(i) by a multiplier A causes underflow and information will be lost. Consequently, efficient compression encoding into y(i) cannot be attained.

One approach to avoiding this situation is to allow the determining section 161*a* in the transforming section 161 to determine whether x(i) is a denormal number. In that approach, if it is determined that x(i) is a denormal number the transforming section 161 transforms y(i) into y'(i)=0 and outputs it to a Y-decoder 13 and the multiplication section 13.

The multiplication section 130 multiplies y'(i) by a multiplier A to obtain x'(i). Thus, x'(i)=0, and decoded z(i)=x(i) is inputted in the Z-encoder 14. If x(i) is found to be a denormal number and y(i) is transformed to y'(i)=0, switches 271 and 273 may be controlled to set decoded z(i)=x(i) as decoded x(i) without modification as in the case described above. Processing in the decoding apparatus in that case is the same as the processing described with reference to FIG. 26B.

If the input signal x(i) is an integer and the multiplier A is smaller than 1, a quotient signal y(i) obtained by dividing x(i) by the multiplier A can exceed the range that can be represented and cause overflow. Therefore, or example the determining section 161*a* of the transforming section 161 in FIG. 27 determines y'(i)=0 if overflow of y(i) is detected. In that case, if a quotient signal y'(i) restored in the decoding apparatus is 0, the signal z(i) decoded from code $C_Z$ is provided as the decoded signal x(i) without modification as described earlier.

Seventh Embodiment

A seventh embodiment that is the combination of the present invention and the technique described in Non-patent literature 2 will be described below.

FIFTEENTH EXAMPLE

Encoding

Figure 28:
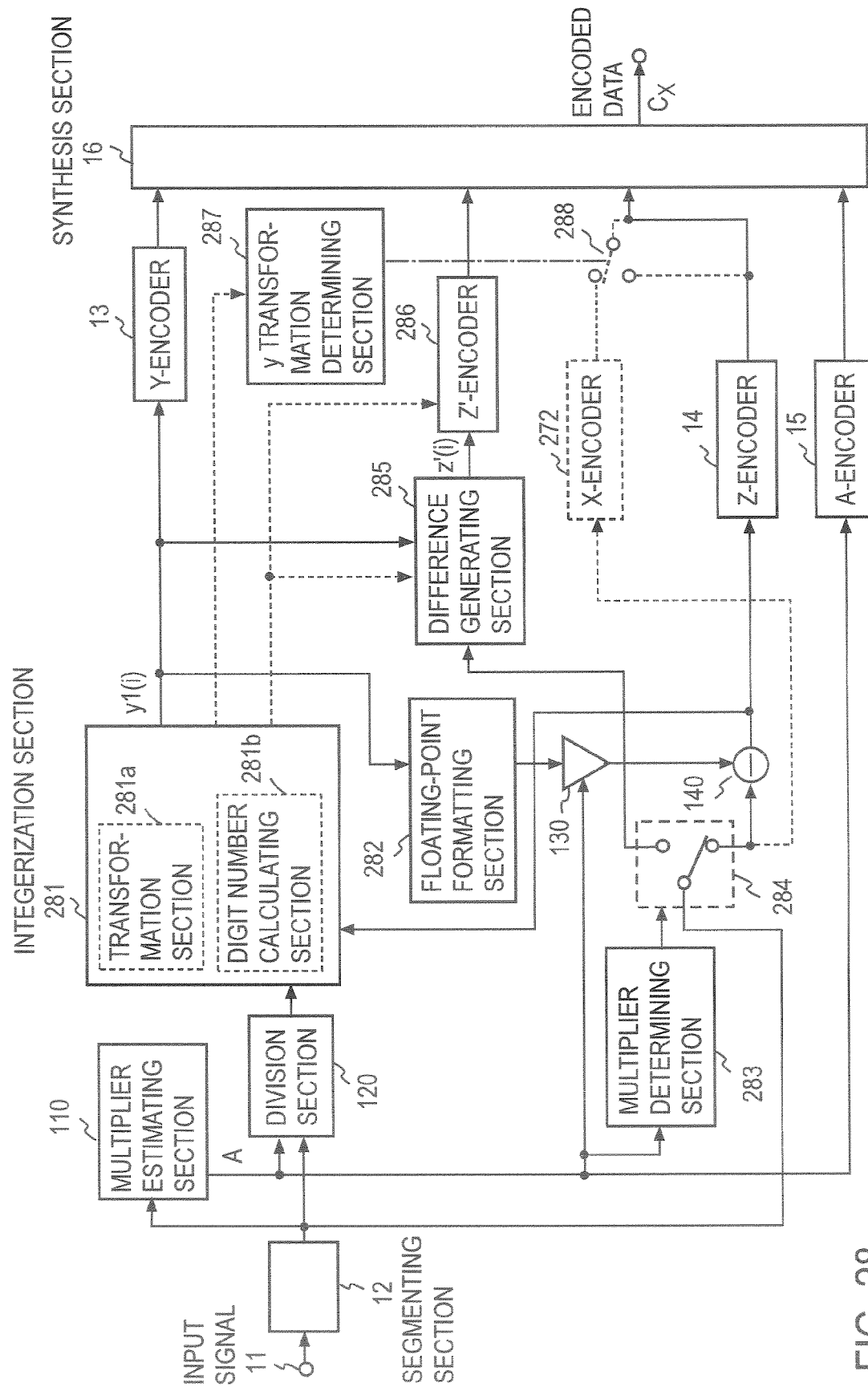
FIG. 28 shows an exemplary functional configuration of an encoding apparatus in a fifteenth example.

FIG. 28 shows an exemplary functional configuration of an encoding apparatus in a fifteenth example. In the fifteenth example, an output y(i) from a division section 120 is inputted in an integerization section 281. The integerization section 281 converts y(i) to a signal y1(*i*) in integer form. The output y(i) may be transformed in a transforming section before the conversion, rather than directly converting y(i) into integer form. In some cases, the maximum amplitude output from the integer signal y1(*i*) is limited to 24 bits or 16 bits. In such a case, the lowest-order digit of the integer signal y1(*i*) is rounded.

The rounded integer signal y1(*i*) is outputted to a Y-decoder 13 as in the examples described above.

In this example, a floating-point formatting section 282 converts y1(*i*) into a floating-point representation and outputs it to a multiplication section 130, where the integer in floating-point form is multiplied by a multiplier A. An error calculating section 140 uses the result of the multiplication to generate an error signal as described earlier.

In this example, a multiplier determining section 283 determines whether a multiplier A is 1.0. If A=1.0, a switch 284 is turned to input the input signal x(i) in a difference generating section 285 instead of the error calculating section 140. A digit number calculating section 281*b* provided in the integerization section 281 counts the number of digits n of an integer signal. The number of digits n is also inputted in the difference generating section 285. The difference generating section 285 changes upper n bits of the mantissa M of a floating-point input signal x(i) to 0s, and leaches the sign S, the exponent E, and the lower (23−n) bits of the mantissa unchanged to generate an output signal z'(i). It should be noted that the number of digits n=E−$E_0$ of the integer part of the mantissa is equal to the number of the digits lower than the highest digit, "1", of the integer signal y1(*i*).

The error signal z'(i) is losslessly encoded in a Z'-encoder 286.

Thus, codes $C_Y$, $C_A$ (or A) and $C_Z$ (the output from the Z'-encoder 286 if A is 1.0 or the output from a Z-encoder 14 if A is not 1.0) are inputted in a synthesis section 16.

SIXTEENTH EXAMPLE

Decoding

Figure 29:
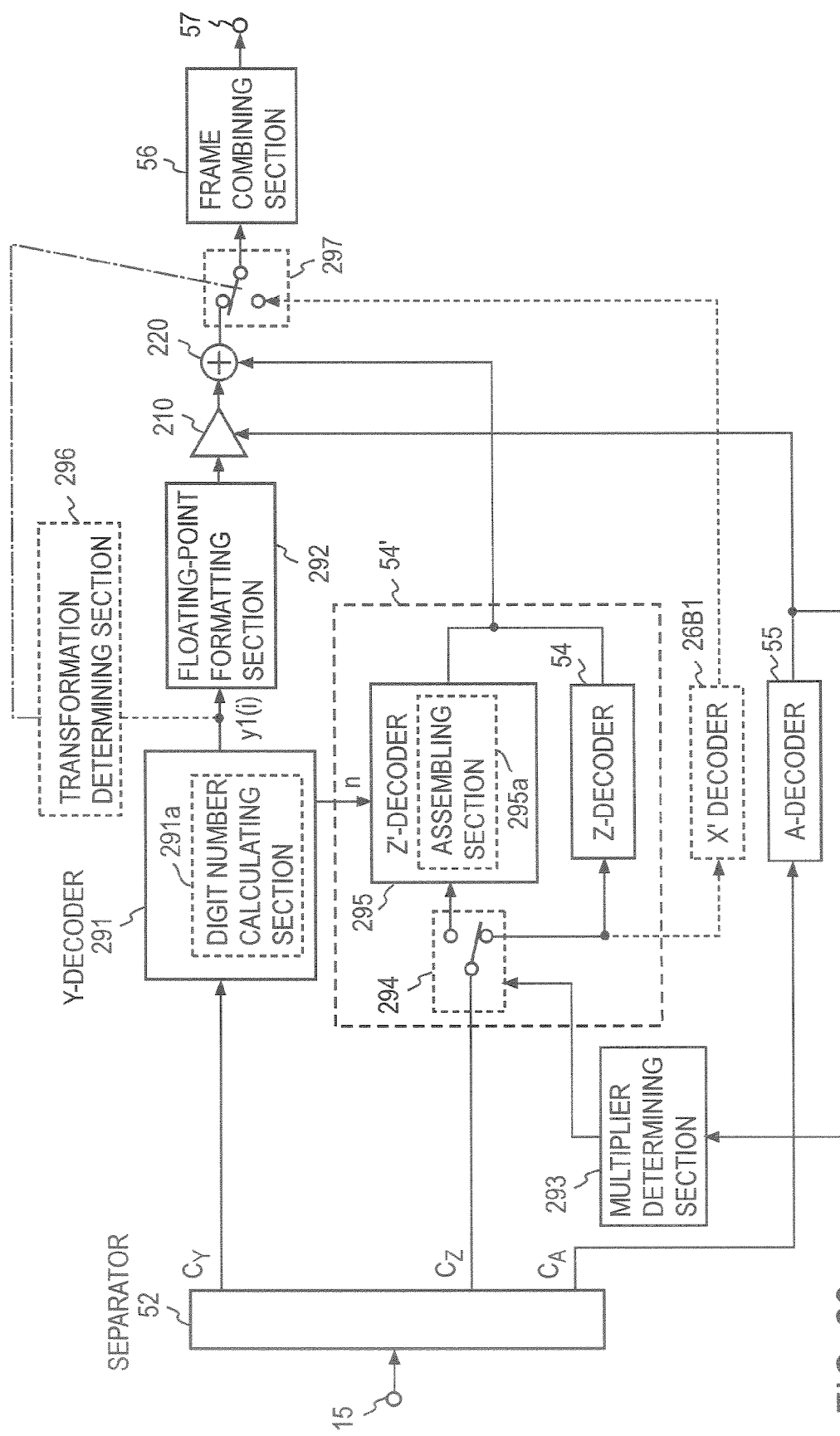
FIG. 29 shows an exemplary functional configuration of a decoding apparatus in a sixteenth example.

FIG. 29 shows a decoding apparatus corresponding to the encoding apparatus shown in FIG. 28. Code $C_Y$ separated in a separator 52 is decoded in a Y-decoder 291 into an integer signal y1(*i*). The integer signal y1(*i*) is transformed into a floating point signal in a floating point formatting section 292.

Determination is made in a multiplier determining section 293 as to whether a multiplier A from a A-decoder 55 is 1.0. If A is not 1.0, a switch 294 is turned to a Z-decoder 54 and an error signal z(i) decoded in the Z-decoder 54 is provided to a correcting section 220.

If A is 1.0 the switch 294 is turned to a Z'-decoder 295, where code $C_Z$ is decoded. Also inputted in the Z'-decoder 295 is the number n of the digits of the integer signal calculated in a digit number calculating section 291a in a Y-decoder 291. The Z-decoder 295 pads higher n bits of the 23-bit mantissa of a floating-point representation with 0s and sets in the lower 23−n bits a signal decoded from code $C_Z$. An assembling section 295a assembles a difference signal (error signal) z(i) in floating-point form from the mantissa M, the decoded sign bit S and the decoded exponent $E-E_0$. The error signal z(i) is inputted in a correction section 220.

The switch 2947 the Z-decoder 543 and the Z'-decoder may be integrated into a Z-decoder 54'. In that case, the multiplier determining section 293 may be a separate component as shown in FIG. 29 or may be a part of the Y-decoder 291 and the value of the multiplier A may be provided to the Z-decoder 54' along with the number n of the digits of the integer signal.

If y(i) is transformed to 0 in a transformation section 281a shown in FIG. 28, a switch 288 may be controlled upon determination in a y transformation determining section 287 that transformation has been performed such that y1(i)=0 as shown with dashed line in FIG. 28, so that the input signal x(i) is directly encoded in an X-encoder 272 and the result of the encoding may be provided to a synthesis section 16 as $C_Z$.

As represented by a dashed box in FIG. 29, a transformation determining section 296 determines whether the decoded y1(i) is 0. If it is determined that y1(i)=0 a switch 297 is switched from the correcting section 220 side to an X'-decoder 26B1 side. A code z(i) decoded in X'-decoder 26B1 is outputted as decoded signal x(i).

SEVENTEENTH EXAMPLE

Coding

Figure 30:
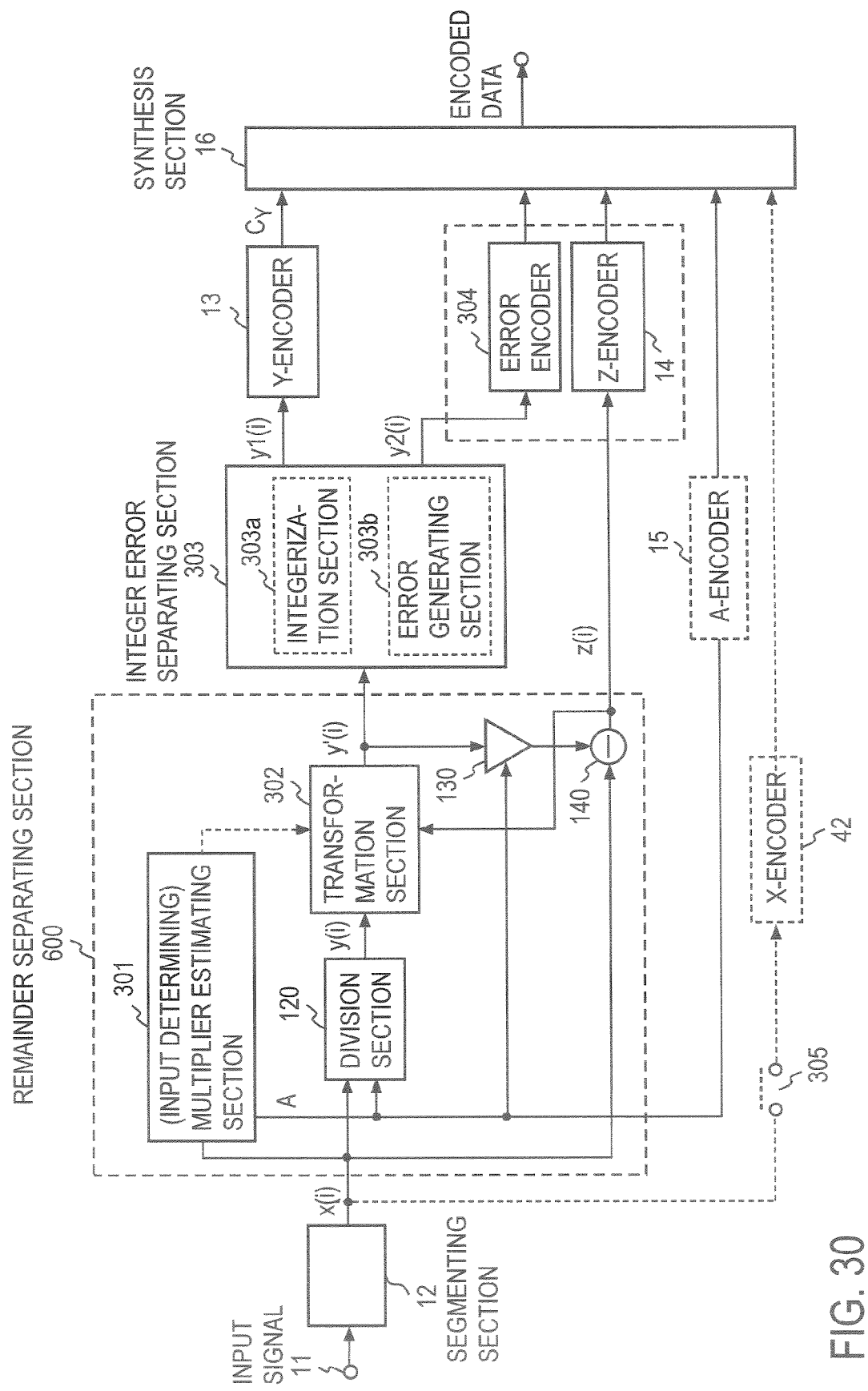
FIG. 30 shows an exemplary functional configuration of an encoding apparatus in a seventeenth example.

In a seventeenth example, the method described in Non-patent literature 2 is applied to an output from a remainder separating section 600. FIG. 30 shows an exemplary functional configuration of an encoding apparatus in this example. An (input determining) multiplier estimating section 301 in the remainder separating section 600 estimates a multiplier A. A division section 120 applies division to an input signal. A transformation section 302 transforms the result y(i) of the division and outputs the result of transformation y'(i). A multiplication section 130 multiplies y' (i) by the multiplier A. An error calculating section 140 calculates the difference between the result of the multiplication and the input signal and outputs an error signal z(i).

A integerization section 303a in an integer error separating section 303 coverts transformed y'(i) into an integer signal y1(i) having a predetermined maximum amplitude as required. The fractional portion of y'(i) is outputted as a floating-point error signal y2(i). A Y-encoder 13 encodes the integer signal y1(i) into a code $C_Y$. An error encoder 304 losslessly encodes the floating-point error signal y2(i) and outputs the result as a code $C_{2Z}$. An error signal sequence Z from a remainder separating section 600 is inputted into a Z-encoder 14. A multiplier A is encoded as required and is inputted in a synthesis section 16.

EIGHTEENTH EXAMPLE

Decoding

Figure 31:
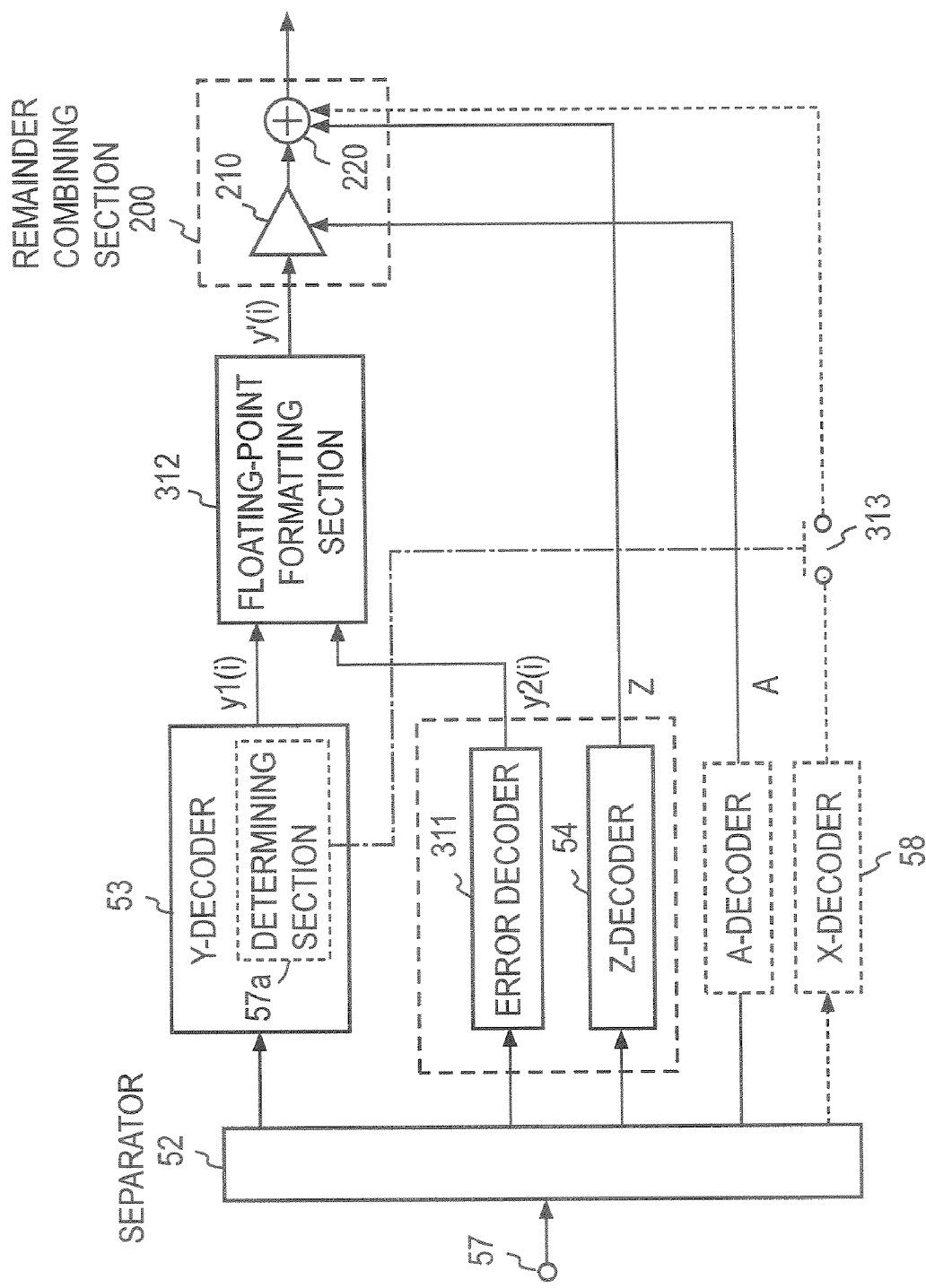
FIG. 31 shows an exemplary functional configuration of a decoding apparatus in an eighteenth example.

FIG. 31 shows an exemplary functional configuration of a decoding apparatus corresponding to the encoding apparatus in the seventeenth example. A Y-decoder 53 provides a decoded signal y1(i) which is an integer signal, to a floating-point formatting section 312. An error decoder 311 decodes a code $C_{2Z}$ from a separator 52 into a decode signal y2(i) in floating-point form and outputs it to a floating-point formatting section 312. The floating-point formatting section 312 combines y1(i) with y2(i) to generate a floating-point signal y'(i) having a predetermined maximum amplitude A remainder combining section 200 multiplies y'(i) by a multiplier A and adds an error signal decoded in a Z-decoder 54. The remaining part of the processing is the same as that in the foregoing example.

The error signals y2(i) and z(i) in FIG. 30 have small amplitudes and are of a nature relatively similar to each other. Therefore, the error encoder 304 and Z-encoder 14 may be implemented by a single entropy encoder as indicated by a dashed box. For example, all y2(i) in a frame may be encoded and then z(i) may be encoded. If a single encoder is used in this way, a single corresponding decoder may be used for decoding as indicated by a dashed box in FIG. 31.

The transformation section 281a in FIG. 28 and the transformation section 302 in FIG. 30 may use one or some of the transformation methods descried in the second to seventh examples and the ninth to fourteenth examples at the same time. Furthermore, as in the input determining section 41 in the thirteenth example (FIG. 26A), if an input signal x(i) is an infinite value or a NaN, the (input determining) multiplier estimating section 301 recognizes it, sets x(i)=0, and estimates a multiplier. That is, a remainder separating section 600 outputs y'(i)=0. In addition, a switch 305 is turned on and the current x(i) is directly encoded in an X-encoder 42, and the result is outputted to a synthesis section 16. In the decoding apparatus, if a determining section 57a determines that the encoded y(i) is 0, it turns a switch 313 on as in the example shown in FIG. 26B. An X-decoder 58 decodes codes separated in a separator 52 and outputs x(i). A transformation section 302 in the remainder separating section 600 performs processing similar to that described in the second to seventh and the ninth to fourteenth examples. Processing corresponding to this is performed also in the decoding apparatus as in the example shown in FIG. 29.

The fifteenth to eighteenth examples have been described with respect to lossless coding. The lossy coding described in the sixth example (FIG. 16) and the eighth example (FIG. 21) can be applied to the fifteenth to eighteenth examples as well. The recursive processing in the ninth to twelfth examples (FIGS. 22 to 25) can also be applied to the fifteenth to eighteenth examples. Codes Z and Z may be outputted as the difference signal and error signal without re-encoding them. That is, encoding of them has little compression effect.

Eighth Embodiment

An embodiment of an approach in which a multiplier A is determined using rational approximation will be described below.

NINETEENTH EXAMPLE

Figure 32:
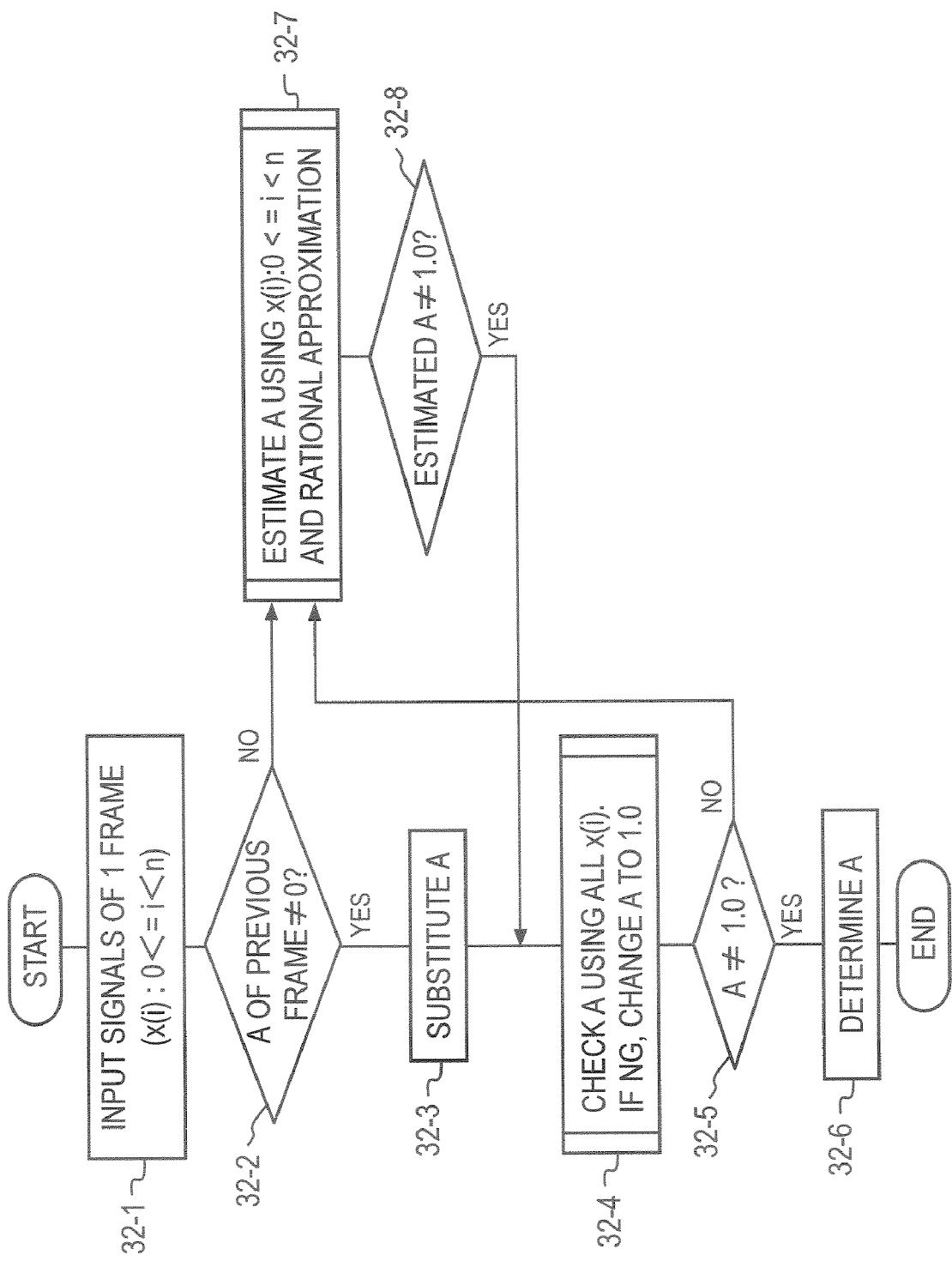
FIG. 32 is a flowchart of an exemplary process for searching for a common multiplier in a nineteenth example.

FIG. 32 shows a process for determining a common multiplier of a set of numeric values. First, determination is made as to whether a new multiplier A should be estimated for each frame. All input signals x(i) in the current frame are inputted (step 32-1). Determination is made as to whether the multiplier A of the previous frame is 1.0 (step 32-2). If not 1.05 the multiplier A is chosen as a candidate of the multiplier A for the current fame (step 32-3). Determination is made as to whether the multiplier A is appropriate to all input signals x(i) and, if not, the multiplier A is changed to 1.0 (step 32-4). Determination is made as to whether the multiplier A is 1.0 (step 32-5). If not 1.0, the candidate multiplier of the frame is chosen for the multiplier A of the current frame (step 32-6).

If the multiplier A of the previous frame at step 32-2 is 1.0 or the multiplier A at step 32-5 is 1.05 a multiplier A is estimated by using input signals and rational approximation (step 32-7). Determination is made as to whether the estimated multiplier A is 1.0 (step 32-8) and, if not, the process proceeds to step 32-4.

Figure 33:
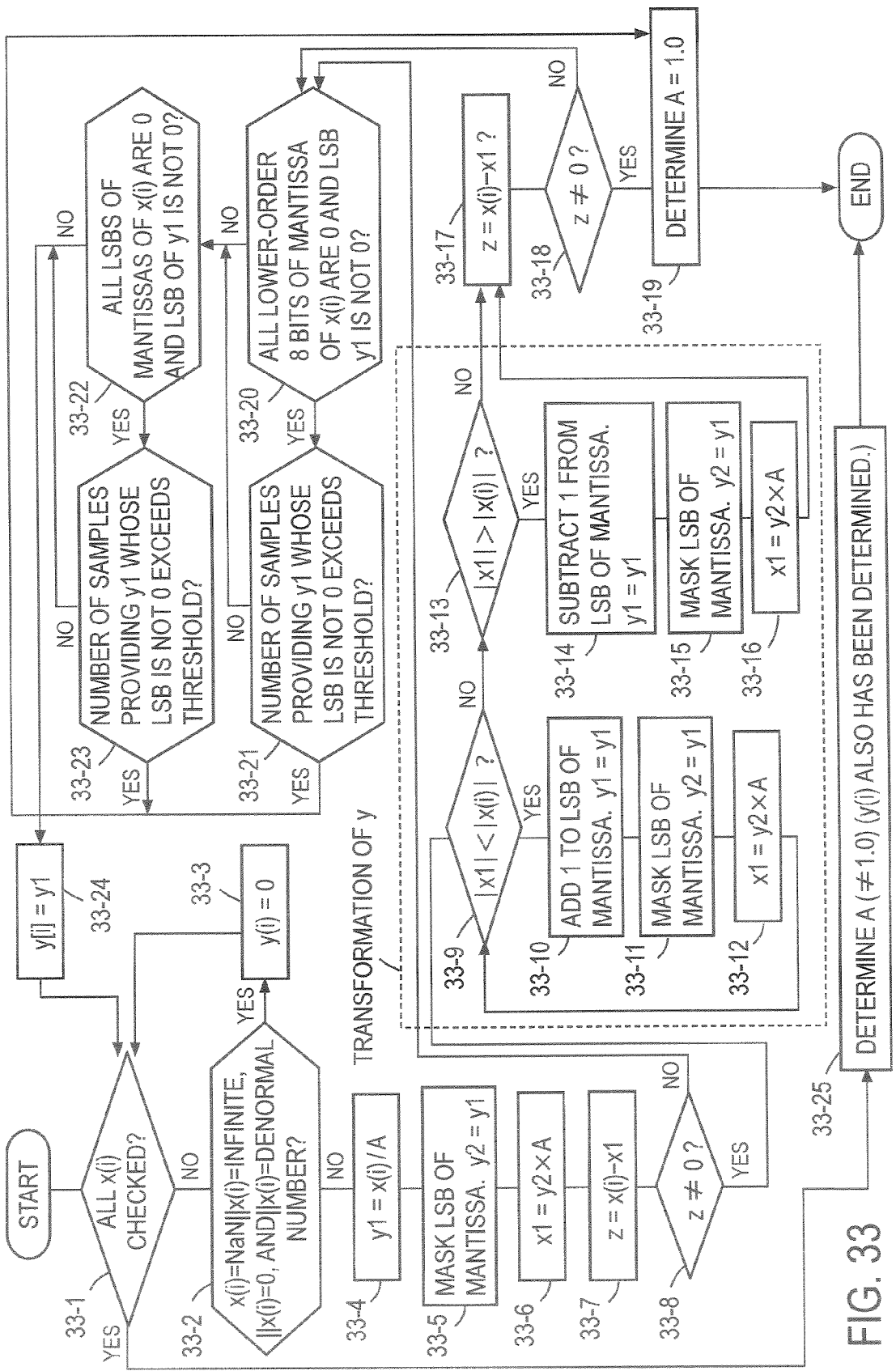
FIG. 33 is a flowchart showing a process for checking the common multiplier and transforming a quotient signal.

An exemplary process for examining the multiplier A estimated at step 32-7 in FIG. 32 and transforming the result of division y(i) will be described with reference to FIG. 33. Determination is made as to whether all input signals x(i) have been checked (step 33-1). If there remains an input signal x(i) that has not yet been checked, determination is made as to whether the input signal x(i) is any of a NaN, an infinite number, 0, and a denormal number (step 33-2). If Yes, y(i) is changed to 0 and then the process returns to step 33-1 (step 33-3).

If it is determined at step 33-2 that the condition is not met (x(i) is not an exceptional value), the signal x(i) is divided by the estimated multiplier A to obtain y1 (step 33-4). The least significant bit (LSB) of the mantissa of y1 is masked with 0 to provide y2 (step 33-5). Then y2 is multiplied by the multiplier A and the result is outputted as x1 (step 33-6). Then x1 is subtracted from signal x(i) and the result is outputted as z (step 33-7).

Determination is made as to whether the result z of the subtraction is 0 (step 33-8). If not 0, determination is made as to whether the absolute value of x1 is smaller than the absolute value of x(i) (step S33-9). If the absolute value of x1 is smaller, 1 is added to the LSB of the mantissa of y1 and the resulting value is substituted for y1 (step 33-10). The LSB of the mantissa of y1 is masked with 0 and the result is provided as y2 (step 33-11). The value y2 is multiplied by the multiplier A and the result is provided as x1 (step 33-12) and the process returns to step 33-9.

If the absolute value of x1 is not smaller than the absolute value of x(i) at step S33-9 determination is made as to whether the absolute value of x1 is greater than the absolute value of x(i) (step 33-13). If the absolute value of x1 is greater, 1 is subtracted from the LSB of the mantissa of y1 and the result is provided as y1 (step 33-14). The LSB of y1 is masked with 0 and the result is provided as y2 (step 33-15). Then y2 is multiplied by the multiplier A and the result is provided as x1 (step 33-16). Then x1 is subtracted from signal x(i) and the result is provided as z (step 33-17). Determination is made as to whether the result z of the subtraction is 0 (step 33-18). If z≠0 the current multiplier A is changed to 1.0 and the process will end (step 33-19). If the absolute value of x1 is not greater, the process proceeds to step 33-17.

If z=0 at any of step 33-8 and 33-18, the process proceeds to step 33-20. At step 33-20, determination is made as to whether the condition that the lower-order 8 bits of the mantissas of the signal x(i) are all 0 and the least significant bit of y1 is not 0 is satisfied (step 33-20). If the condition is met determination is made as to whether the number of samples (signals x(i)) that provide y1 whose least significant bit is not 0 exceeds a threshold (for example 10) (step 33-21). If so, the process proceeds to step 33-19 otherwise the process proceeds to step 33-22. At step 33-22, determination is made as to whether the condition that the least significant bits of the mantissas of all signals x(i) are 0 and the least significant bits of y1 are not 0 is met (step 33-22).

If the condition at step 33-22 is met, determination is made as to whether the number of samples (signals x(i)) that provide y1 whose least significant bit is not 0 exceeds a threshold (for example 100) (step 33-23). If the threshold is exceeded the process proceeds to step 33-19.

If the condition at step 33-22 is not met, y1 is substituted for y(i) (step 33-24) and then the process proceeds to step 33-1. If z is 0 at step 33-8, the process proceeds to step 33-20. If it is determined at step 33-1 that the multiplier has been checked using all signals x(i) it is determined that the multiplier A is proper (step 33-25). At this point y(i) has been determined as well. Steps 33-9 to 33-16 are the steps of transforming y. Steps 33-9 to 33-12 and steps 33-13 to 33-16 are the steps of minimizing the dynamic range of each y(i).

Figure 34:
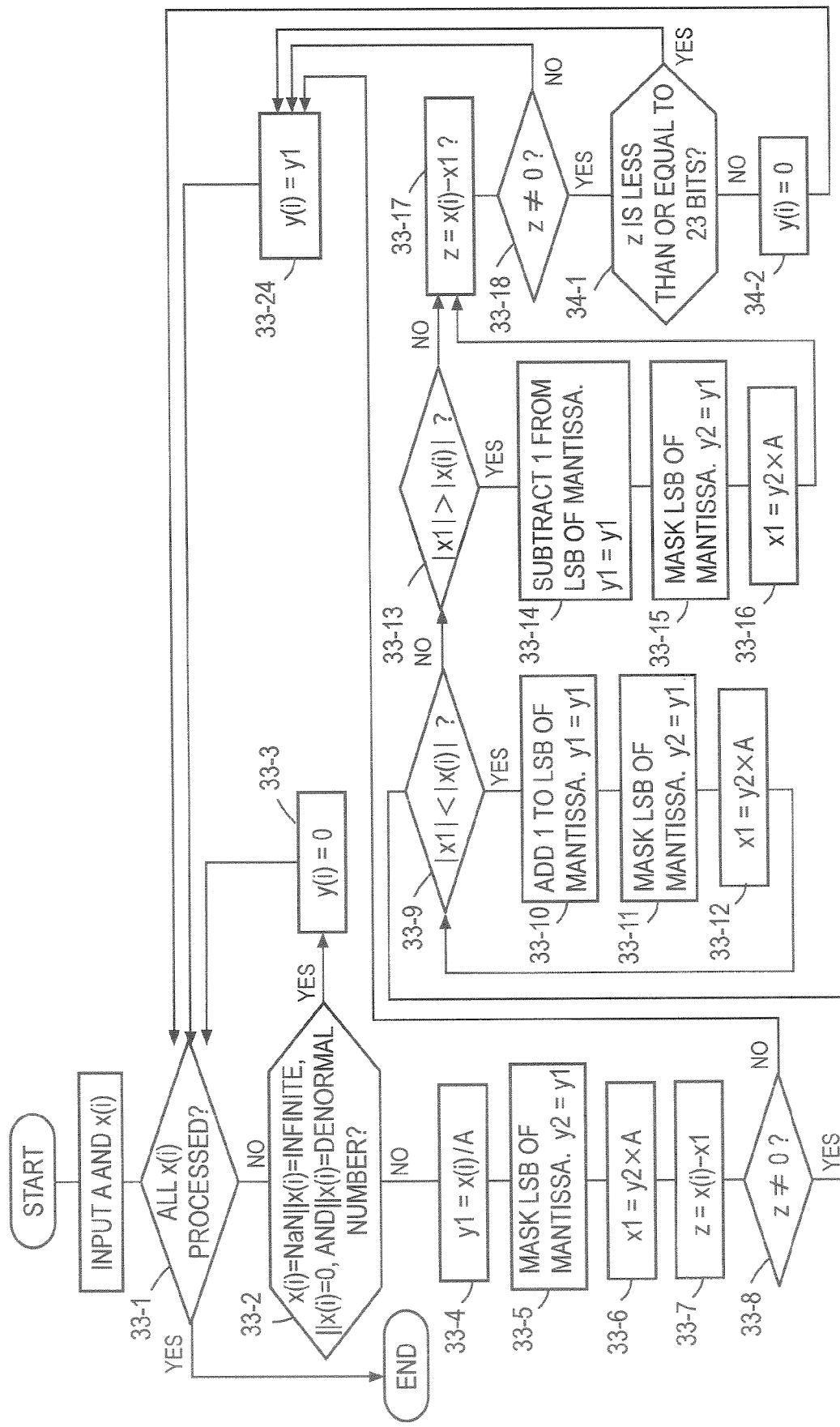
FIG. 34 is a flowchart of a process for applying quotient signal transformation to floating-point form.

FIG. 34 shows a basic process for transforming y. Only the differences from the process shown in FIG. 33 will be described. If z is 0 at step 33-8, the process directly proceeds to step 33-24. Likewise, if z is 0 at step 33-18, the process directly proceeds to step 33-24. If z is not 0 at step 33-18, determination is made as to whether z can be represented by using a predetermined number of bits (for example 23 bits) or less (step 34-1). If yes, the process directly proceeds to step 33-24; otherwise, the process proceeds to step 34-2. At step 34-2, y(i) is changed to 0 (step 34-2) and the process proceeds to step 33-1. If it is determined at step 33-1 that the process has been completed for all signals x(i), the process for transforming y(i) will end.

An example of a process for converting a floating-point number to an integer will be described with reference to FIG. 35. The process can be applied to the integerization section 281 in the fifteenth example (FIG. 28) and the integerization section 303a in the seventeenth example (FIG. 30).

A multiplier A, a signal x(i) and the result y(i) of division that has been transformed in FIG. 34 (which is also denoted by y(i)) are inputted (step 35-1). A shift coefficient $S_C$ is calculated from the maximum absolute value of y(i) (step 35-2). A quantizing bit number assumed by the encoding apparatus is denoted by BMA and a scale factor $S_F$ is calculated according to the equation given below (step 35-3).

$$S_F = 2^{(BMA-1+S_c)}$$

Determination is made as to whether the process has been completed to all x(i) (step 35-4). If not, determination is made as to whether y(i) is 0 (step 35-5). If so, y'(i) is changed to 0 (step 35-6) and then the process returns to step 35-4. If y(i) is not 0 at step 35-5, determination is made as to whether y(i) is positive (step 35-7). If y(i) is positive, integerization to be used for positive y(i) is applied to y(i) to obtain y'(i) (step 35-8) and then the process returns to step 35-4. If y(i) is not positive at step 35-7, integerization to be used for negative y(i) is applied to y(i) to obtain y'(i) (step 35-9) then the process returns to step 35-4. If it is determined at step 35-4 that the process has been completed for all x(i), the process for obtaining y'(i) will end.

Figure 35:
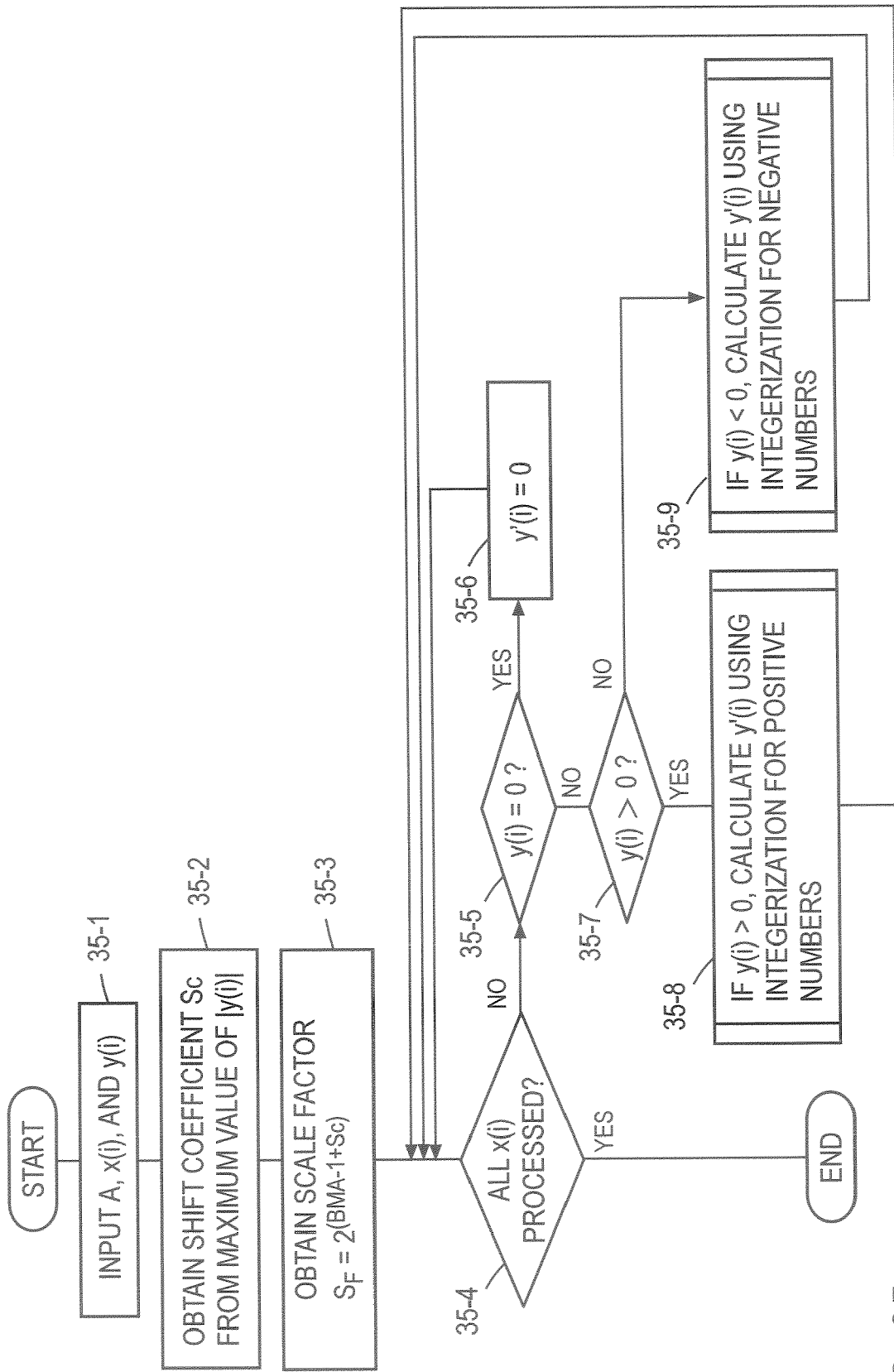
FIG. 35 is a flowchart of an exemplary process for converting floating-point form to integer form.
Figure 36:
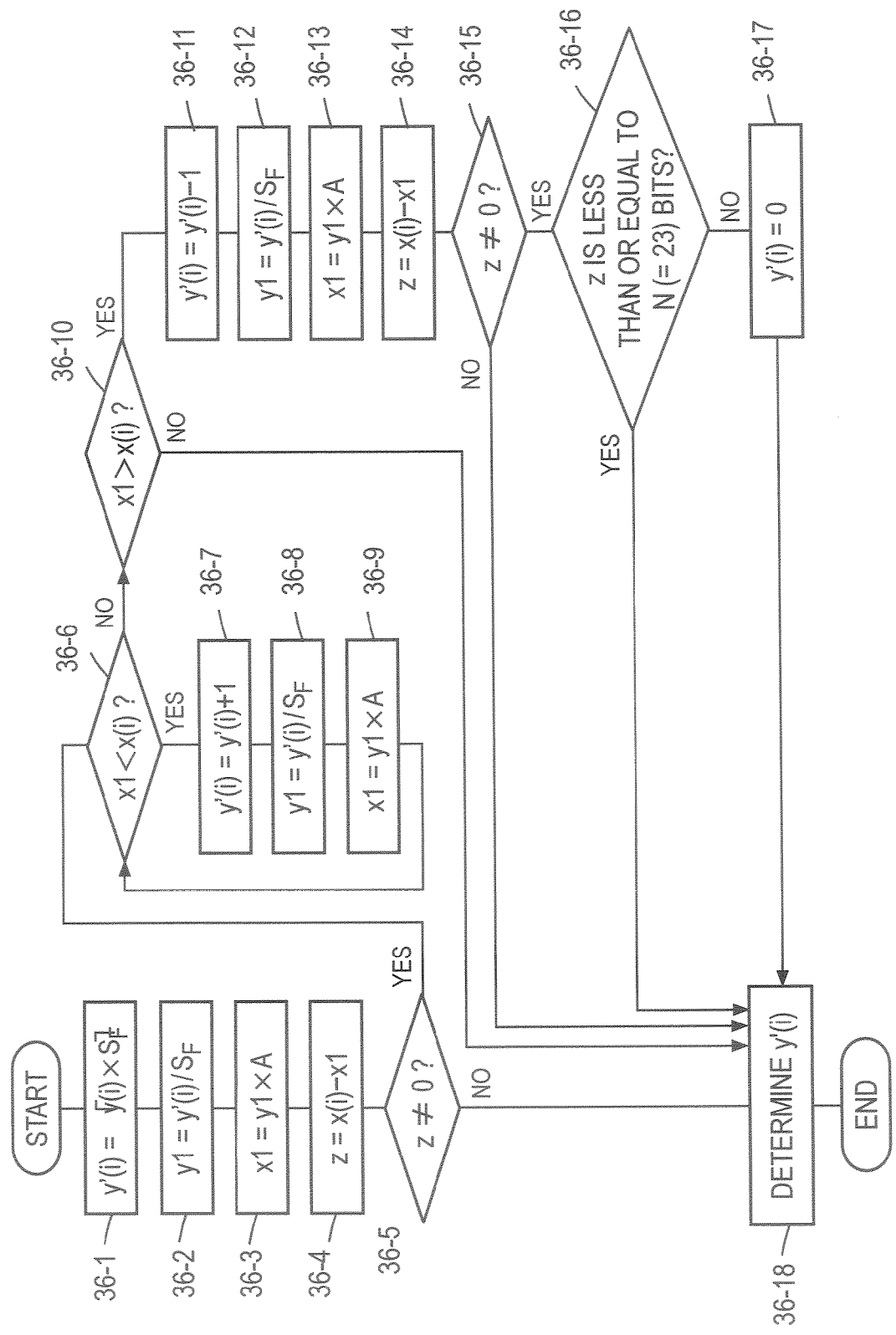
FIG. 36 is a flowchart of an exemplary process for transforming a positive quotient signal.

An example of an integerization process performed if y(i) at step 35-8 in FIG. 35 is positive will be described with reference to FIG. 36. First, y(i) is multiplied by the scale factor $S_F$ and the fractional part of the resulting number is discarded to obtain y'(i) (step 36-1). Here,

[A] [Formula 2]

represents that the fractional part of A is discarded. Then y'(i) is divided by the scale factor $S_F$, the result is provided as y1 (step 36-2) and y1 is multiplied by the multiplier A to provide the result as x1 (step 36-33). Then x1 is subtracted from the signal x(i) to obtain z (step 36-4). Determination is made as to whether z is 0 (step 36-5). If z is not 0, determination is made as to whether x1 is less than x(i) (step 36-6). If x1 is smaller, 1 is added to y'(i) and the result is substituted for y'(i) (step 36-7). The resulting y'(i) is divided by the scale factor $S_F$ to obtain y1 (step 36-8). Then y1 is multiplied by the multiplier A to obtain x1 (step 36-9) and then the process returns to step 36-6.

If x1 is not less than x(i) at step 36-6, determination is made as to whether x1 is greater than x(i) (step 36-10). If x1 is greater than x(i), 1 is subtracted from y'(i) to obtain the result y'(i) (step 36-11). Then y'(i) is divided by the scale factor $S_F$ to obtain the result y1 (step 36-12). The result y1 is multiplied by the multiplier A to obtain the result x1 (step 36-13). Then x1 is subtracted from the signal x(i) to obtain the result z (step 36-14). Determination is made as to whether z is 0 (step 36-15). If z is not 0, determination is made as to whether z can be represented by a predetermined number of bits (for example 23 bits) or less (step 36-16). If not, y'(i) is changed to 0 (step 36-17) and then the process proceeds to step 36-18. If z is 0 at step 36-5, y'(i) at that point is the value of y'(i) to be obtained. If x1 is not greater than x(i) at step 36-10, the process proceeds to step 36-18. If z is 0 at step 36-15, the process proceeds to step 36-18. If it is determined at step 36-16 that z can be represented by a predetermined number of bits N or less, the process proceeds to step 36-18.

It should be noted that if it is determined at step 36-16 that z cannot be represented by N bits (23 bits in this example) or less, the multiplier A may be changed to 1.0, instead of changing y'(i) to 0. In that case, y'(i) is newly obtained from x(i) using the method performed in the sixteenth or seventeenth example.

Figure 37:
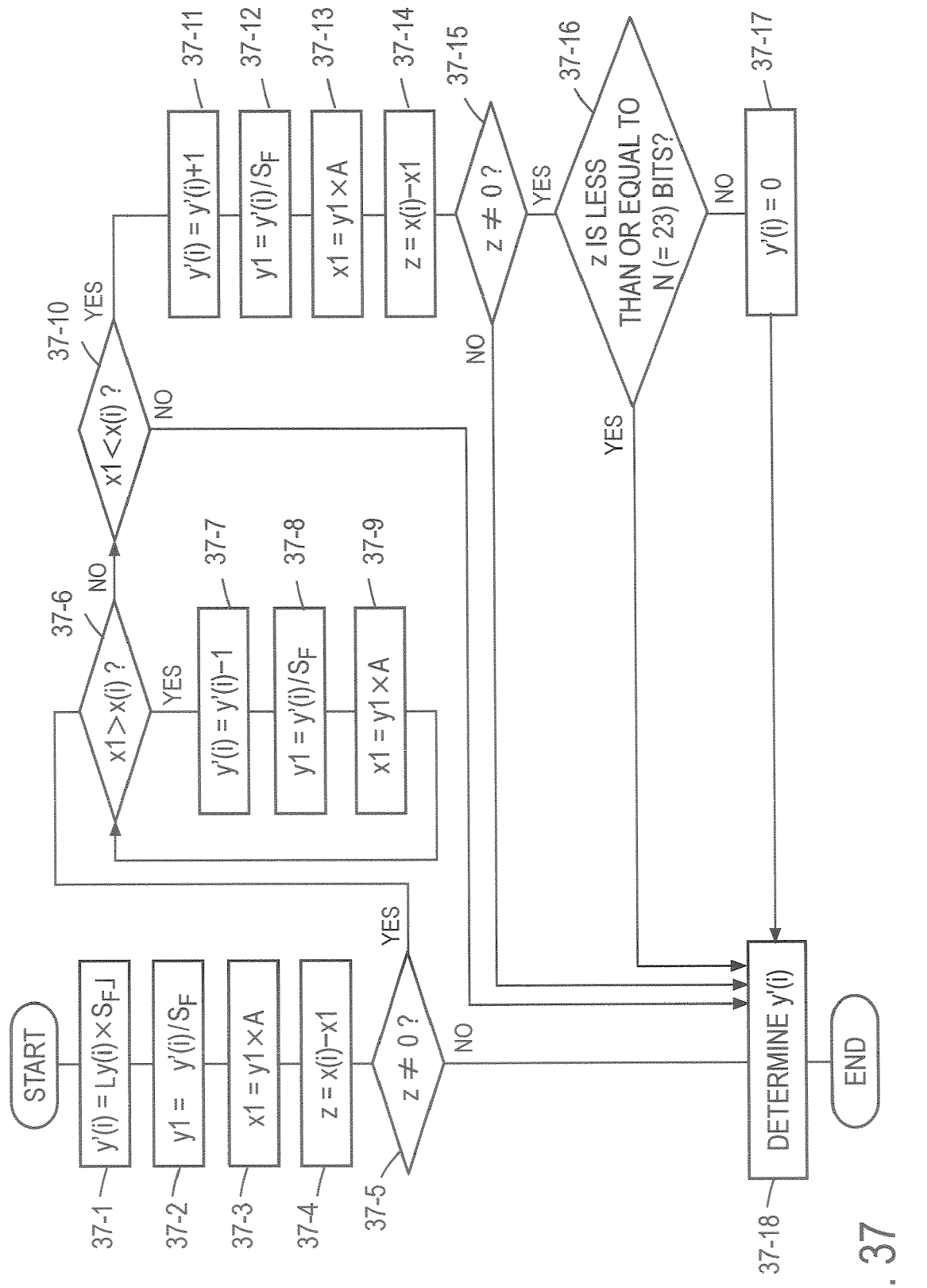
FIG. 37 is a flowchart of an exemplary process for transforming a negative quotient signal.

An example of a transformation process of y(i) used if y(i) is negative will be described with reference to FIG. 37. First, y(i) is multiplied by the scale factor $S_F$ and the fractional part of the product is rounded up to obtain an integer y'(i) (step 37-1). Here, $$\lceil A \rceil \qquad \text{[Formula 3]}$$

represents that the fractional part of A is rounded up. Then y'(i) is divide by the scale factor $S_F$ to obtain y1 (step 37-2). The resulting y1 is multiplied by a multiplier A to obtain x1 (step 37-3). Then x1 is subtracted from the signal x(i). The result is denoted by z (step 37-4). Determination is made as to whether z is 0 (step 37-5). If z is not 0 determination is made as to whether x1 is greater than x(i) (step 37-6). If x1 is greater 1 is subtracted from y'(i). The result is denoted by y'(i) (step 37-7). The result y'(i) is divided by the scale factor $S_F$ to obtain the result y1 (step 37-8). Then y1 is multiplied by the multiplier A to obtain x1 and then the process returns to step 37-6 (step 37-9).

If x1 is not greater at step 37-6, determination is made as to whether x1 is smaller than x(i) (step 37-10). If x1 is smaller, 1 is added to y'(i) to obtain y'(i) (step 37-11). The result y'(i) is divided by the scale factor $S_F$ to obtain y1 (step 37-12). Then y1 is multiplied by the multiplier A to obtain x1 (step 37-13). Then, x1 is subtracted from x(i) and the result is denoted by z (step 37-14). Determination is made as to whether z is 0 (step 37-15). If z is not 0, determination is made as to whether z can be represented by a predetermined number of bits (23 bits in this example) or less (step 37-16). If not, y'(i) is changed to 0 and then the process proceeds to step 37-18 (step 37-17). If z is 0 at step 37-15, the process proceeds to step 37-18. Similarly; if z=0 at step 37-15, the process proceeds to step 37-18. In either case, y'(i) obtained at this point is determined as y'(i) to be obtained. If x1 is not less than x(i) at step 37-10, the process proceeds to step 37-18. If it is determined at step 37-16 that z can be represented by the N bits or less, the process proceeds to step 37-18. Then, the process for transforming y'(i) will end.

If it is determined at step 37-16 that z cannot be represented by the N bits or less, A may be changed to 1.0, instead of changing y'(i) to 0. In that case, y'(i) is newly obtained from x(i) using the process described in the fifteenth or seventeenth example.

To obtain a common multiplier of an input signal x(i) that is represented in integer for rather than floating-point form, the sign of the input signal x(i) is determined first. If it is positive, y(i) is transformed by using the process shown in FIG. 36 if negative, y(i) is transformed by using the process shown in FIG. 37.

Ninth Embodiment

Determination of a multiplier A in the multiplier estimating section 110 described above will be descried below.

TWENTIETH EXAMPLE

Rational Approximation

Figure 38:
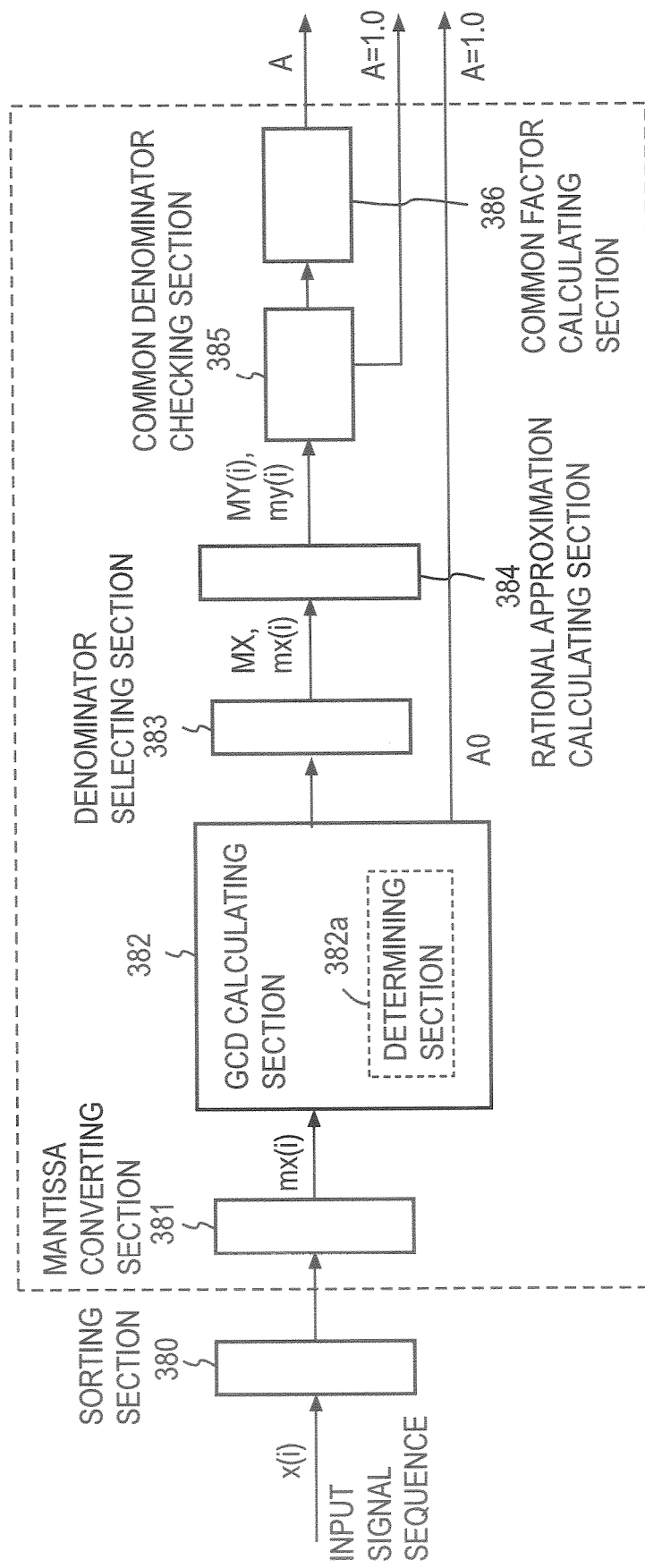
FIG. 38 shows an exemplary functional configuration for obtaining a common multiplier using rational approximation.

A method for estimating a multiplier A using rational approximation will be described with reference to FIG. 38. A mantissa converting section 381 sets 1 in the bit position immediately preceding the most significant bit (MSB) of the mantissa of each of inputted floating-point number x(i) to produce an unsigned 24-bit integer mx(i) (i=0, 1, . . . , N). If x(i) is a NaN or denormal number, the mantissa converting section 381 converts it to x(i)=0. In this case the input samples x(i) may be ordered in ascending order of absolute value and a number of samples (for example 512 samples) that are not 0 may be selected from among the samples (for example 2,048 samples) in one frame in a sorting section 380 and inputted in the mantissa converting section 381 instead of inputting all the input signals.

A GCD calculating section 382 calculates, as required, the greatest common divisor gcd by using the Euclidean algorithm, which is generally used. If the gcd is greater than a criterion value in a determining section 382a the gcd may be outputted as a multiplier. In this example, however, the gcd is outputted as A0. A denominator selecting section 383 divides mx(i) that is not an exceptional value (mx(i)=0) by A0 and outputs the result my(i). Then the following algorithm is used to estimate a multiplier A. In the calculation A0 may be used to make an adjustment to the estimated multiplier A.

There can be some ways to estimate the multiplier A.

First Method (Basic Method)

An exceptional value mx(i) is obtained in the same way described earlier.

(1) The denominator selecting section 383 selects the maximum one of mx(i). The value is denoted by X.

(2) Values mx(i) that are not exceptional values (mx(i)=0) are taken one by one and each value is used to calculate the following formula (2) in a rational approximation calculating section 384.

$$(mx(i)-½)/(X+½)<my(i)/Y(i)<(mx(i)+½)/(X-½) \quad (2)$$

The irreducible fraction my(i)/Y(i) having the smallest denominator that satisfies formula (2) is obtained.

A continued fraction expansion method is used here.

A process performed in the rational approximation calculating section 384 will be described below.

Step 1: Write irreducible fractions as $(mx(i)-½)/(X+½)$ =nlow/dlow, $(mx(i)+½)/(X-½)$=nhigh/dhigh Step 2: If nlow/dlow<1<nhigh/dhigh, output 1/1.

Step 3: Let dn=max {dlow, dhigh} and nm be the numerator corresponding to dn.

Step 4: Let n0=d1=0, n1=d0=1 and i=0.

Step 5: Let k=[nm/dn] (the maximum integer less than or equal to nm/dn) and r=(remainder of nm divided by dn), nm=dn, and dn=r.

Step 6: Let s=n0+n1×k, t=d0+d1×k, n0=n1, and d0=d1.

Step 7: Let nm (i)=n1=s and dn(i)=d1=t. If dn>0, increment i by 1 and return to step 5; if dn=0, proceed to step 8.

Step 8: Obtain the smallest i that satisfies the condition nlow/dlow<nm(i)/dn(i)<nhigh/dhigh (If dn=dlow examining only odd numbers will suffice, if dn=dhigh, examining only even numbers greater than or equal to 2 will suffice.)

Step 9: If i=1, obtain the smallest integer k that satisfies the condition (1+k×nm(0))/k<nhigh/dhigh, and output (1+k×nm (0))/k.

If i is an odd number greater than 1, obtain the smallest integer k that satisfies the condition (nm(i−2)+k×nm i−1))/ (dn(i−2)+k×dn(i−1))<nhigh/dhigh and return (nm(i−2)+k× nm(i−1))/(dn(i−2)+k×dn(i−1)).

If i is an even number, obtain the smallest integer k that satisfies the condition (nm(i−2)+k×nm(i−1))/(dn(i−2)+k×dn (i−1))>nlow/dlow, and return (nm(i−2)+k×nm(i−1))/(dn(i− 2)+k×dn(i−1)).

It will be understood that this process is possible from "Lecture on elementary number theory" version 2 by Sadaharu Takagi, Kyoritsu Shuppan, Sep. 15, 2003, pp. 124-145 (hereinafter referred to as Non-patent literature 3), as follows. From Theorem 2.7 on page 140 of Non-patent literature 3, the following condition holds:

If an error range $\epsilon>0$ is specified for a real number $\omega$, the fraction a/b having the smallest denominator that satisfies $$\omega-\epsilon<a/b<\omega$$

$$(\text{or } \omega<a/b<\omega+\epsilon)$$

is the principal or intermediate convergent of an odd (or even) numbered $\omega$. The foregoing is a paraphrase of the last three lines of the paragraph describing the proof that consists of four lines, located immediately under the Theorem 2.7 and starting with "or".

In the foregoing discussion $\omega$ is mn/dn in the rational approximation calculating section 384 and $\epsilon$ is mm/dn−low/ dlow or nhigh/dhigh−nm/dn).

In Chapter 2 containing Theorem 2.7, $\omega$ is an irrational number. However, the conclusion holds true or a rational number provided that care is taken on conditioning as described in the "Note" in the middle of page 140. "Step 3: Let dn be max {dlow, dhigh} and nm be the numerator corresponding to dn." in the rational approximation calculating section 384 corresponding to the "Note" (continued-fraction expansion is performed using the reaction having the greater denominator as $\omega$).

(3) The greatest value Y of obtained values Yi as many as the number of integers x(i) that are not exceptional values is obtained in a common denominator checking section 385.

(4) If the number N of values Yi that are divisors of Y satisfies a predetermined condition (show below) Y is shifted so that 1<=X/Y<2 and X/Y is calculated in floating point form in a common factor calculating section 386 and outputted as an estimated multiplier A.

If the condition is not satisfied, 1 is outputted as the multiplier A.

A specific example of the predetermined condition is

N≧C (a predetermined number)

N≧cm (0<c<1, which is predetermined)

where m is the number of pieces of data excluding exceptional values (mx(i)=0).

The probability of occurrence of carries in a certain type of input signal is known. If for example approximately 20% of the samples in one frame are likely to generate carries, N is set to a number equivalent to 70%. N may be set to a number equivalent to approximately 20% if smaller volumes of codes are desirable, since the volumes of codes can be minimized by using multipliers A as much as possible. If a higher precision of A is desirable, N is set to a number equivalent to 80%. The validity of A will be checked later.

Variation

If the condition given in (4) is satisfied, the average of mxi/Yi (after Yi is shifted so that the condition is met) for Yi that is the divisor of Y is outputted as A. The averaging can reduce error in A. If the condition is not satisfied, A=1.0 is outputted as described above.

The least common multiple Y of Yi obtained in (4) is less than or equal to X, X/Y calculated in floating-point representation (after Y is shifted) is outputted. It is uncertain that Yi will always be the greatest common divisor. However, the least common multiple of Yi calculated will always be the greatest common divisor of the entirety. Alternatively, the average of values mxi/yi calculated from Yi that is the divisor of Y is used. If the condition is not satisfied, A=1.0 is outputted as described above.

Thus, Yi can be selected from a wider range than before.

In operation (1) described above, M (a predetermined number greater than or equal to 2, preferably a number in the range between 3 and 50) integers mx(i) are selected in descending order, instead of the maximum value X. A for each of the M mx(i) is estimated and the one that is selected based on majority rule, that is, the one that can be used by most mxi in common is outputted.

This can avoid the problem that a single value selected turns out to be inappropriate data for example X of a mixture of samples some of which produced carries and the others not).

M (a predetermined number) samples are randomly selected in operation (1) and A of each of the samples is estimated as described above and one is selected based on majority rule.

The reason for doing this is the same as the reason why M greater samples are selected.

The M samples are selected in descending order in (1) instead of the maximum value and A of each sample is estimated.

Once M (predetermined number) estimated multiplies A other than 1 are obtained, they are outputted. If data is exhausted before M estimated A are collected, A=1 is outputted to cover the shortfall. Preferably, a checking routine is used to determine which of the multiple candidates is appropriate. For example, the transformation process described with respect to the third example (FIGS. 11 and 12) or the fourth example (FIGS. 13 and 14) may be applied to each multiplier A and the most appropriate multiplier A may be selected.

Figure 39:
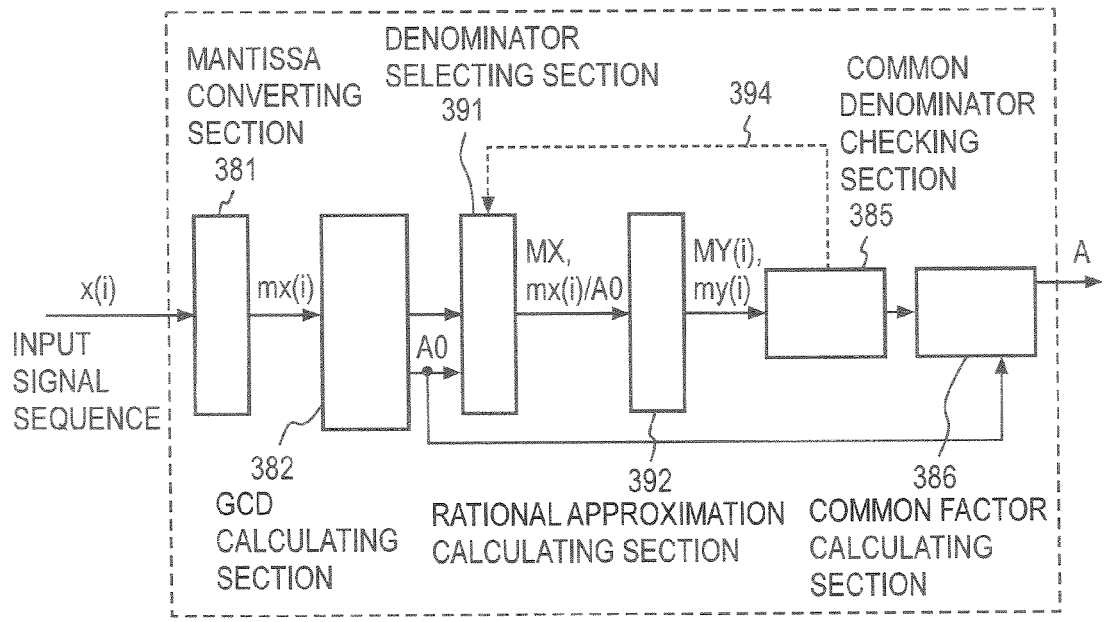
FIG. 39 shows another exemplary functional configuration for obtaining a common multiplier using rational approximation.

The process shown in FIG. 38 may be changed as shown in FIG. 39 and described below. A denominator selecting section 391 divides each mx(i) by gcdA0 obtained in the GCD calculating section 382. The reason for this is to avoid calculating a gcd obtained in the GCD calculating section 382 again in later processing in the denominator selecting section 391, that is, to reduce redundant processing A rational approximation calculating section 392 performs processing of mx(i)/A0 in a manner similar to that of mx(i) in the rational approximation calculating section 384. Since processing has been performed using mx(i)/A0, the common factor calculating section 386 multiples an obtained candidate multiplier by A0 to obtain a multiplier A.

Figure 40:
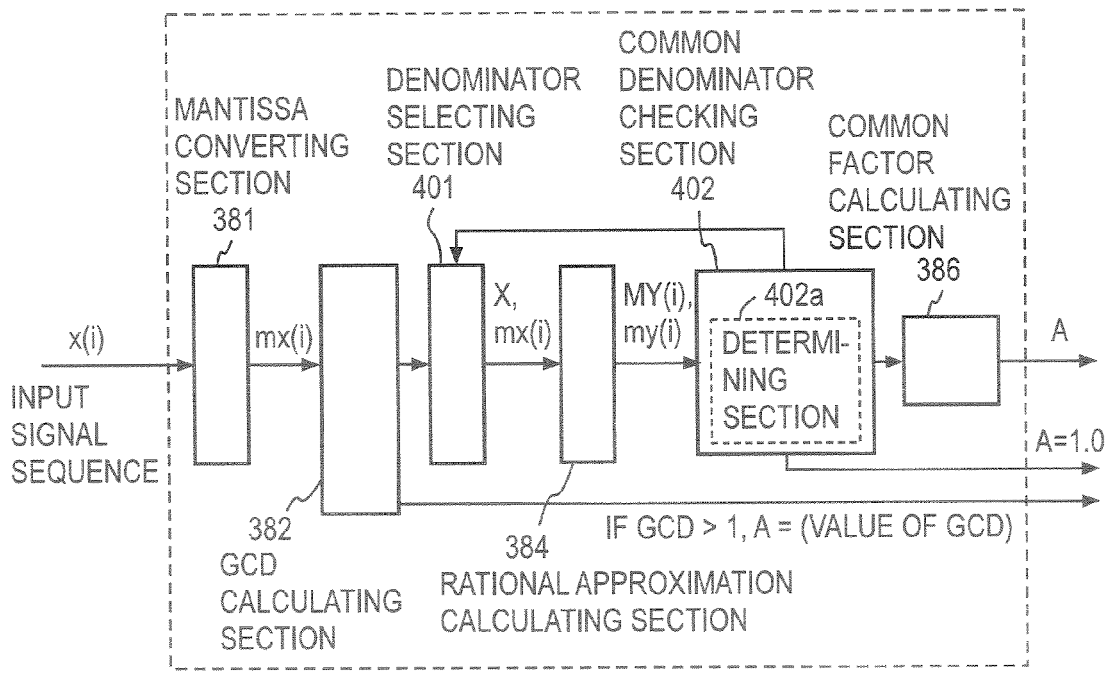
FIG. 40 shows yet another exemplary functional configuration for obtaining a common multiplier using rational approximation.

The process shown in FIG. 38 may be changed as shown in FIG. 40 and described below. When a determining section 402a of a common denominator checking section 402 determines that Yi cannot be found, the common denominator checking section 402 causes the denominator selecting section 401 to select another denominator X. The selection is made in descending order of value of mx(i) or randomly. If Yi cannot be found after a predetermined number of selections of denominator X, for example five selections, A=1.0 is outputted.

If Yi cannot be determined in the common denominator checking section 385 as shown with dashed line 394 in FIG. 39, the denominator selecting section 391 may select another denominator X as described with respect to FIG. 40. The denominator selecting section 391 selects one X, rather than a number M of X.

Figures 41, 42A, 42B:
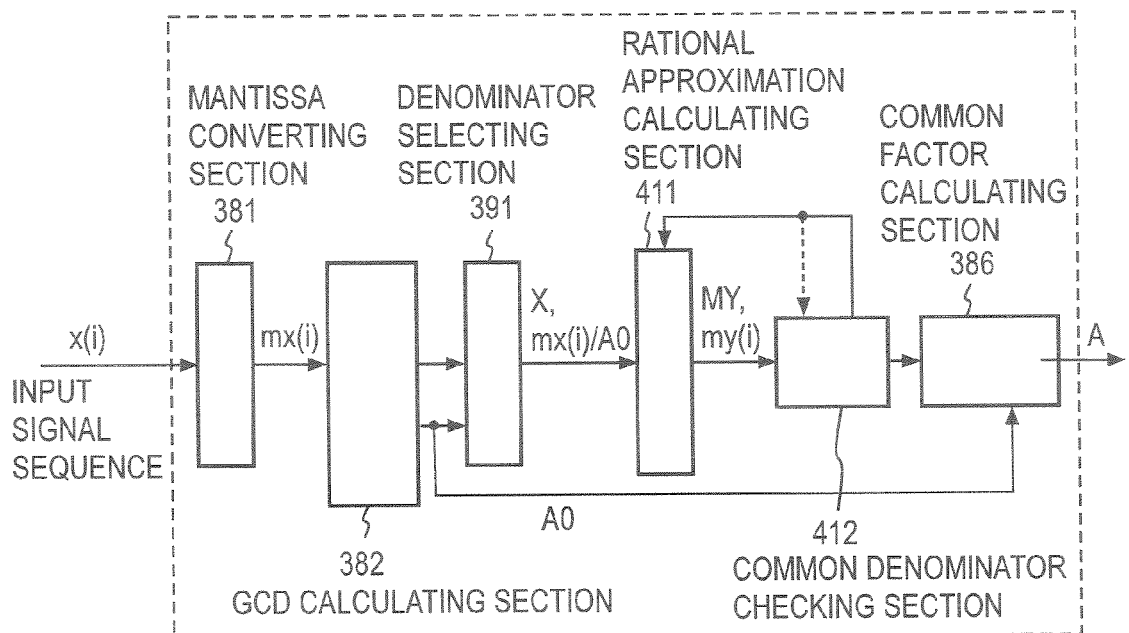
FIG. 41 shows another exemplary functional configuration for obtaining a common multiplier using rational approximation.
FIG. 42A shows exemplary values for obtaining a common multiplier using autocorrelation and shows the result of the autocorrelation shifted by one bit.
FIG. 42B shows an example of autocorrelation for obtaining a common multiplier in which the bit of the autocorrelation is 1.

In a variation shown in FIG. 41, a rational approximation calculating section 411 calculates my(i)/Yi that corresponds to each x(i). A multiplier A that minimizes the result y(i) of division is desirable. Therefore a common denominator checking section 412 selects the smallest one of denominators Y and checks to determine whether it can be a common denominator. If not, the rational approximation calculating section 411 selects a set of the second smallest Y and y(i). The common denominator checking section 412 checks the set to determine whether the denominator can be a common denominator. This process is repeated to determine the most appropriate set of y(i) and Y(i). If the greatest common denominator cannot be obtained as shown with dashed line in FIG. 4, Yi and yi inputted first may be incremented by one unit to find a common denominator.

Second Method (A Number of Values are Added Together to Generate a Group)

In a second method, a predetermined values x0, . . . , xn are added to reduce error as compared with the first method.

First, a mantissa is converted into a 24-bit integer form mx(i) having no sign and an exceptional value x(i) is changed to 0.

(1) mx(i) are arranged in descending order and M (a predetermined number) x(i) from the biggest one are added together to obtain the sum Xi (in a mantissa converting section 381).

(2) The maximum value X of Xi is selected (in a denominator selecting section 383).

(3) Xi is taken one by one and the irreducible fraction yi/Yi having the smallest denominator that satisfies the condition $$(Xi-1/(2\sqrt{M}))/(X+1/(2\sqrt{M}))<yi/Yi<(Xi+1/(2\sqrt{M}))/(X-1/(2\sqrt{M}))$$

is obtained (in a rational approximation calculating section 384).

Then, the processing (4) in the first method or its variation is performed.

Thus, error in data can be reduced as compared with the first method and therefore the probability of a proper Y being obtained is increased.

Third Method (First Exhaustive Search, Y-Based Search)

A third method also uses the same process to obtain mx(i).

(1) The maximum value X of mx(i) is selected.

(2) xi that is not an exceptional value, has the smallest i (mx(i)=0), and satisfies mx(i)<X is used and the irreducible fraction yi/Y having the smallest denominator that satisfies the condition $$(xi-½)/(X+½)<yi/Yi<(xi+½)/(X-½)$$

is obtained.

(3) All values xj other than exceptional values (mx(i)=0) are checked to see whether there is a fraction yj/Y that has a denominator Y that satisfies $$(xi-½)/(X+1;2)<yj/Y<(xi+½)/(X-½).$$

(4) If such a fraction yi/Y is found for all xj, X/Y or the average of xj/yj is outputted as an estimated value of A.

If there is a value j for which such a fraction is not found, a fraction is obtained that has a denominator that satisfies the condition $$(xi-½)/(X+½)<yi/Yi<(xi+½)/(X-½)$$

and is the next largest Y and the denominator is set as a new Y.

If Y<X, the process returns to (3); if Y=X, 1 is outputted.

Fourth Method (Second Exhaustive Search, A-based Search)

In a fourth method, an exhaustive search is performed for a multiplier A.

An approach to finding a common multiplier using rational approximation mentioned earlier will be descried with reference to FIG. 38. As mentioned earlier, the GCD calculating section 382 cannot obtain a correct value if an input signal x(i) includes an error. A denominator selecting section 383 selects an appropriate representative value other than mx(i)=0 in one frame as X (denominator). A signal with a large volume of information (the maximum value in the foregoing example) is desirable in terms of obtaining the greatest common divisor.

In a rational approximation calculating section 384, error contained in the nominator mx(i) of a fraction mx(i)/X is considered, where the nominator is all mx(i) in a frame (mx(i)=0 is excluded from the processing as described above, reference to which will be omitted in the following description) and the denominator is a representative value X. The fraction mx(i)/X contains a negative or positive error with respect to a correct value. The error yi/Y within the error limits is obtained. ½ is added or subtracted in the foregoing because the error is error generated by half-adjust. If an error is +/−α, the irreducible fraction having the smallest denominator yi/Yi that satisfies the condition $(mx(i)-\alpha)/(X+\alpha) < yi/Yi < (mx(i)+\alpha)/(X-\alpha)$ should be obtained. If mx(i) contains for example an error of +/−2, $\alpha$ is set to 2. If positive and negative errors are asymmetric, +$\alpha$ and −$\beta$ are used.

The irreducible fraction yi/Yi can be obtained without fail from the theorem using the continued fraction expansion method described in Non-patent literature 3 given above.

As many fractions yi/Yi as the number of (i) in the frame are obtained in this way. A value among values Yi that is common to (i) is obtained in a common denominator checking section 385. If the number of the identical Yi is greater than or equal to a predetermined number the Yi is selected as the common Y, X is divided by the common Yi in a common factor calculating section 386, and the result is outputted as a common multiplier A.

TWENTY-FIRST EXAMPLE

Using Autocorrelation

Another example of a method for obtaining a multiplier A will be described with reference to FIG. 42.

"1" is placed in the bit position immediately preceding the MSB (most significant bit) of the mantissa of each signal x(i) to provide a 24-bit mx(i). The autocorrelation between this mx(i) and x(i) shifted by j bits (j=1, 2, . . . , 23) to the right is obtained. FIG. 42A shows an example of the autocorrelation between mx(i) and mx(i) (1) shifted by 1 bit. In the example in FIG. 42A, z(i) consists of 12 bits.

The number of 1-bits in the autocorrelation value is counted. This is performed for j=1, . . . 23. For each j, the sum of the numbers of 1-bits in correlation values of all z(i) is calculated. The sum for j that exceeds a threshold is represented by 1 and the sum for j that does not exceed the threshold is represented by 0. The bit sequence resulting from the determination is the multiplier A to be obtained.

As an example, FIG. 42B shows the numbers of 1-bits in correlation values of signals x(0)-x(4), where the number of bits of z(i) is 8 and j=1, 2, . . . , 9. In FIG. 42B, the numbers of 1-bits in the autocorrelation values when j=1 is 5 for x(0), 3 for x(1), and 2 for x(2). When j=2, the numbers of 1-bits in the autocorrelation values for x(0) to x(4) are all 0s. When j=3, the numbers of 1-bits in the autocorrelation values for x(0), x(1), x(2), . . . are 2, 4, 1, . . . . The sums of the numbers of 1-bits in the autocorrelation values when j=1, 2, 3, . . . are 23, 0, 15, . . . . If the threshold is 10, the results of determination as to whether the threshold is exceeded are 1, 0, 1, . . . for j=1, 2, 3, . . . . The result of the determination is a common multiplier A for x(0) to x(4). Since the number of 1-bits in a correlation value decreases as the number j increases, the threshold may be decreased as increases.

TWENTY-SECOND EXAMPLE

Edits such as transformation, amplitude adjustment, addition of effects, and mixing may be made to an original audio signal in 24-bit integer form, for example, and then the signal may be converted into floating-point form and the resulting signal may be inputted as an input signal x(i). In such a case, additions subtractions multiplications, and divisions applied to the original 24-bit integer signal are recorded and therefore can be known. The order in which the arithmetic operations have been performed and factors used are provided to an encoding apparatus along with the input signal x(i). A multiplier A is determined in a multiplier estimating section on the basis of the input information about those operations. For example, if an original signal is multiplied by a constant number A, the inputted constant number A may be outputted as the multiplier A.

Computers can be caused to function as the encoding, decoding, and rational approximation common multiplier calculating apparatuses described above. Programs for causing the computers to function as intended apparatuses (apparatuses having functions and configurations described and shown in the examples) or programs for causing the computers to perform their processes (described in the examples) may be loaded into the computers from recording media such as CD-ROMs, magnetic disks and semiconductor recording devices or downloaded through a communication network and may cause the computers to execute the programs.

The invention claimed is:

1. An information encoding method comprising:
    a separation step of separating a sequence of a plurality of input signals in each of predetermined segments into a common multiplier, a quotient signal sequence resulting from division of each input signal by the multiplier, and a remaining error signal sequence;
    a quotient encoding step of compression-encoding the quotient signal sequence to obtain a quotient code; and
    an output step of outputting the quotient code, the multiplier, and the error signal sequence.

2. An information encoding method according to claim 1, wherein the separation step separates the sequence of the plurality of input signals into the quotient signal sequence in integer form and the error signal sequence in floating-point form;
    the method further comprises an error encoding step of compression-encoding the error signal sequence to obtain an error code; and
    the output step outputs the quotient code, the multiplier and the error code.

3. The information encoding method according to claim 1, wherein:
    the separation step separates the sequence of the plurality of input signals into the quotient signal sequence in floating-point form and the error signal sequence in floating-point form;
    the method further comprises a quotient signal separating step of separating each of the quotient signals in floating-point form into a quotient signal in integer form and a difference signal in floating-point form to obtain a quotient signal sequence in integer form and a difference signal sequence in floating-point form;
    the quotient encoding step compression-encodes the quotient signal sequence in integer form;
    the method further comprises a difference encoding step of compression-encoding the difference signal sequence to obtain a difference code and an error encoding step of compression-encoding the error signal sequence to obtain an error code; and
    the output step outputs the quotient code, the difference code, the multiplier, and the error code.

4. An information encoding method for encoding a sequence of a plurality of input signals in floating-point form in each of predetermined segments, comprising:
    a common multiplier estimating step of estimating a common multiplier of the input signals constituting the input signal sequence in a common multiplier estimating section;
    a division step of dividing each of the input signals constituting the input signal sequence by the common multiplier to obtain a sequence of quotient signals in a division section;

a transformation step of obtaining a quotient signal sequence in integer form (integer quotient signal sequence) from the quotient signals constituting the quotient signal sequence in a transformation section;

a quotient encoding step of encoding the integer quotient signal sequence in a quotient encoder;

a multiplication step of multiplying each quotient signal in the integer quotient signal sequence by the common multiplier to obtain a signal sequence in floating-point form (floating-point signal sequence) in a multiplication section; and an error encoding step of encoding a sequence of error signals, each being the error between each signal in the floating-point signal sequence and each signal in the input signal sequence in an error encoder.

5. The information encoding method according to claim 4, wherein the common multiplier estimating step:

selects a representative value from among values of the input signals constituting the input signal sequence;

obtains by using rational approximation an irreducible fraction that has the smallest denominator between a positive error and a negative error based on an error of each of values of the input signals, each of the fractions having the representative value as the denominator and the value of each of the input signals constituting the input signal sequence as the numerator;

obtains a common denominator in the obtained irreducible fractions; and obtains a common multiplier for the values of the input signals constituting the input signal sequence from the common denominator and the representative value.

6. The information encoding method according to claim 4 or 5, wherein the transformation step comprises:

a search sub-step of adding or subtracting 1 to or from the least significant bit of each of the quotient signals which have been rounded, in a predetermined range, and searching for a quotient signal that provides 0 as the result of subtraction of the product of multiplication of the quotient signal resulting from the addition or the subtraction by the common multiplier from the input signal; and a quotient signal changing sub-step of, if the result of the search sub-step is successful for all of the quotient signals, providing the set of the quotient signals as the integer quotient signal sequence;

if the result of the search sub-step is unsuccessful for any of the quotient signals, providing 1 as the common multiplier and providing the input signals itself as the quotient signals.

7. An information encoding method encoding a sequence of a plurality of input signals (input signal sequence) in floating-point form in each of predetermined segments, comprising:

a common multiplier estimating step of estimating a multiplier (a common multiplier) of input signals constituting the input signal sequence in a common multiplier estimating section;

a division step of dividing each of the input signals constituting the input signal sequence by the common multiplier to obtain a sequence of quotient signals in a division section;

an integerization step of converting each of the quotient signals constituting the quotient signal sequence into a quotient signal sequence in integer form (integer quotient signal sequence) in a integerization section;

a quotient encoding step of encoding the integer quotient signal sequence in a quotient signal encoder;

a floating-point formatting step of obtaining a quotient signal sequence in floating-point form (floating-point quotient signal sequence) based on each of the quotient signals constituting the integer quotient signal sequence in a floating-point formatting section;

a multiplication step of multiplying each of the signals in the floating-point quotient signal sequence by the common multiplier to obtain a sequence of signals in floating-point format (floating-point signal sequence) in a multiplication section; and an error encoding step of encoding a sequence of error signals, each being the error between each signal in the floating-point signal sequence and each signal in the input signal sequence in an error encoder.

8. An information decoding method comprising:

a separation step of separating an input code into a quotient code, a multiplier, and an error signal sequence;

a quotient signal sequence decoding step of decoding the quotient code to generate a quotient signal sequence;

a multiplication step of multiplying each of the quotient signals constituting the quotient signal sequence by the multiplier; and a correction step of correcting each signal in the signal sequence generated in the multiplication step by using each of the error signals constituting the error signal sequence to obtain a decoded signal sequence.

9. The method according to claim 8, wherein the separation step separates the input code into a quotient code, a multiplier, and an error code;

the quotient signal sequence decoding step generates a quotient signal sequence in integer form;

the method further comprises an error signal sequence decoding step of decoding the error code to generate an error signal sequence in floating-point form; and the multiplication step multiples each quotient signal in the quotient signal sequence in integer form by the multiplier to generate a signal sequence in floating-point form.

10. The method according to claim 8, wherein the separating step separates the input code into a quotient code, an error code, a multiplier, and an error code;

the quotient signal sequence decoding step generates a quotient signal sequence in integer form;

the method further comprises a difference signal sequence decoding step of decoding the difference code to generate an difference signal sequence in floating-point form, an addition step of adding each quotient signal in the quotient signal sequence in integer form to a corresponding difference signal in the difference signal sequence to obtain a sequence of quotient signals in floating-point form and an error signal sequence decoding step of decoding the error code to general an error signal sequence in floating-point form; and the multiplication step multiplies each quotient signal in the quotient signal sequence in floating-point form by the multiplier to generate a signal sequence in floating-point form.

11. An information decoding method comprising:

a quotient decoding step of decoding a quotient code into a quotient signal sequence in integer form (integer quotient signal sequence) in a quotient decoder;

an error decoding step of obtaining an error signal sequence on the basis of an error code in an error decoder;

a multiplication step of multiplying each of the signals constituting the integer quotient signal sequence by a common multiplier to obtain a signal sequence in floating-point form in a multiplication section; and
an addition step of adding each of the signals constituting the error signal sequence to each signal in the signal sequence generated in the multiplication step.

12. An information decoding method comprising:
a quotient decoding step of decoding a quotient code into a quotient signal sequence in integer form (integer quotient signal sequence) in a quotient signal decoder;
an error decoding step of obtaining an error signal sequence on the basis of an error code in an error decoder;
a floating-point formatting step of generating a quotient signal sequence in floating-point form (floating-point quotient signal sequence) based on each of the signals constituting the integer quotient signal sequence in a floating-point formatting section;
a multiplication step of multiplying each of the signals constituting the floating-point quotient signal sequence by a common multiplier to obtain a signal sequence in floating-point form in a multiplication section; and
an addition step of adding each of the signals constituting the error signal sequence to each signal in the signal sequence generated in the multiplication step.

13. The information decoding method according to claim 11 or 12, wherein the error decoding step comprises the step of:
if a common multiplier is 1, setting as lower-order bits of the mantissa error signal signals obtained by decoding the error code, the number of the lower-order bits being equal to the total number of digits of the mantissa minus the number of digits of corresponding quotient signals in the integer quotient signal sequence, and setting "0" in the remaining higher-order bits to obtain an error signal sequence in floating-point representation; and
if the common multiplier is not 1, setting each signal obtained from each error code as the mantissa of the error signal in floating-point for to obtain an error signal sequence in floating-point representation.

14. An information encoding apparatus comprising:
a separation section which generates an input signal sequence of a plurality of input signals in each of predetermined segments;
a remainder separating section in which the input signal sequence is inputted and which separates the input signal sequence into a common multiplier of the input signals in the input signal sequence, a sequence of quotient signals resulting from division of each input signal by the multiplier, and a sequence of the remaining error signals;
a quotient encoder which compression-encodes the quotient signal sequence to obtain a quotient code; and
an output section which outputs the quotient code, the multiplier, and the error signal sequence.

15. The apparatus according to claim 14, wherein:
the remainder separating section is a component which separates the input signal sequence into the quotient signal sequence in integer form and the error signal sequence in floating-point form; and
the apparatus further comprises an error encoder which compression-encodes the error signal sequence to obtain an error code; and
the output section is a component which outputs the quotient code, the multiplier, and the error code.

16. The apparatus according to claim 14, wherein:
the remainder separating section is a component which separates the input signal sequence into the quotient signal sequence in floating-point form and the error signal sequence in floating-point form;
the apparatus further comprises an integerization section which separates each of the quotient signals in floating-point for into a quotient signal in integer for and a difference signal in floating-point form to obtain a quotient signal sequence in integer form and a difference signal sequence in floating-point form;
the quotient encoder is a component which compression-encodes the quotient signal sequence in integer form;
the apparatus further comprises an difference encoder which compression-encodes the difference signal sequence to obtain an difference code and an error encoder which compression-encodes the error signal sequence to obtain an error code; and
the output section is a component which outputs the quotient code, the difference code, the multiplier, and the error code.

17. An information encoding apparatus which encodes a sequence of a plurality of input signals in floating-point for in each of predetermined segments, comprising:
a common multiplier estimating section which estimates a multiplier (a common multiplier) of the input signals constituting the input signal sequence;
a division section which divides each of the input signals constituting the input signal sequence by the common multiplier to obtain a sequence of quotient signals;
a transformation section which rounds each of the quotient signals constituting the quotient signal sequence to obtain a quotient signal sequence in integer form (integer quotient signal sequence);
a quotient encoder which encodes the integer quotient signal sequence;
a multiplication section which multiplies each quotient signal in the integer quotient signal sequence by the common multiplier to obtain a signal sequence in floating-point form (floating-point signal sequence); and
an error encoder which encodes a sequence of error signals, each being the error between each signal in the floating-point signal sequence and each signal in the input signal sequence.

18. The information encoding apparatus according to claim 17, wherein the common multiplier estimating section:
selects a representative value from among values of the input signals constituting the input signal sequence;
obtains by using rational approximation an irreducible fraction that has the smallest denominator between a positive error and a negative error based on an error of each of values of the input signals, each of the fractions having the representative value as the denominator and the value of each of the input signals constituting the input signal sequence as the numerator;
obtains a common denominator in the obtained irreducible fractions; and
obtains a common multiplier for the values of the input signals constituting the input signal sequence from the common denominator and the representative value.

19. An information encoding apparatus which encodes a sequence of a plurality of input signals (input signal sequence) in floating-point format in each of predetermined segments, comprising:
a common multiplier estimating section which estimates a multiplier (a common multiplier) of input signals constituting the input signal sequence;
a division section which divides each of the input signals constituting the input signal sequence by the common multiplier to obtain a sequence of quotient signals;

an integerization section which converts each of the quotient signals constituting the quotient signal sequence into a quotient signal sequence in integer form (integer quotient signal sequence);

a quotient encoder which encodes the integer quotient signal sequence;

a floating-point formatting section which obtains a quotient signal sequence in floating-point form (floating-point quotient signal sequence) based on each of the quotient signals constituting the integer quotient signal sequence;

a multiplication section which multiplies each of the signals in the floating-point quotient signal sequence by the common multiplier to obtain a sequence of signals in floating-point format (floating-point signal sequence); and an error encoder which encodes a sequence of error signals, each being the error between each signal in the floating-point signal sequence and each signal in the input signal sequence.

20. The information encoding apparatus according to claim 17 or 18, wherein the transformation section comprises:

a search section which adds or subtracting 1 to or from the least significant bit of each of the quotient signals which have been rounded, in a predetermined range, and searches for a quotient signal that provides 0 as the result of subtraction of the product of multiplication of the quotient signal resulting from the addition or the subtraction by the common multiplier from the input signal; and a quotient signal changing section which, if the result of the search sub-step is successful for all of the quotient signals, provides the set of the quotient signals as the integer quotient signal sequence and if the result of the search sub-step is unsuccessful for any of the quotient signals, provides 1 as the common multiplier and provides the input signal itself as the quotient signal.

21. An information decoding apparatus comprising;

a separation section which separates an input code into a quotient code, a multiplier, and an error signal sequence;

a quotient decoding section which decodes the quotient code to generate a quotient signal sequence;

a multiplication section which multiplies each of the quotient signals constituting the quotient signal sequence by the multiplier; and a correcting section which corrects each signal in the signal sequence generated in the multiplication section by using each of the error signals constituting the error signal sequence to obtain a decoding signal sequence.

22. The apparatus according to claim 21, wherein the separation section is a component which separates the input code into a quotient code, a multiplier, and an error code;

the quotient decoding section is a component which generates a quotient signal sequence in integer form;

the apparatus further comprises an error decoder which decodes the error code to generate an error signal sequence in floating-point form; and the multiplication section is a component which multiples each quotient signal in the quotient signal sequence in integer form by the multiplier to generate a signal sequence in floating-point form.

23. The apparatus according to claim 21, wherein the separating section is a component which separates the input code into a quotient code, an error code, a multiplier, and an error code;

the quotient decoding section is a component which generates a quotient signal sequence in integer form;

the apparatus further comprises a difference decoder which decodes the difference code to generate a difference signal sequence in floating-point form an addition section of adding each quotient signal in the quotient signal sequence in integer for to a corresponding difference signal in the difference signal sequence to obtain a sequence of quotient signals in floating-point form and an error decoding section which decodes the error code to generate an error signal sequence in floating-point form; and the multiplication section is a component which multiplies each quotient signal in the quotient signal sequence in floating-point form by the multiplier to generate a signal sequence in floating-point form.

24. An information decoding apparatus comprising:

a quotient decoder which decodes a quotient code into a quotient signal sequence in integer form (integer quotient signal sequence);

an error decoder which obtains an error signal sequence on the basis of an error code;

a multiplication section which multiplies each of the signals constituting the integer quotient signal sequence by a common multiplier to obtain a signal sequence in floating-point form; and an addition section which adds each of the signals constituting the error signal sequence to each signal in the signal sequence generated in the multiplication section.

25. An information decoding apparatus comprising:

a quotient decoder which decodes a quotient code into a quotient signal sequence in integer form (integer quotient signal sequence);

an error decoder which obtains an error signal sequence on the basis of an error code;

a floating-point formatting section which generates a quotient signal sequence in floating-point form (floating-point quotient signal sequence) based on each of the signals constituting the integer quotient signal sequence;

a multiplication section which multiplies each of the signals constituting the floating-point quotient signal sequence by a common multiplier to obtain a signal sequence in floating-point form; and an addition section which adds each of the signals constituting the error signal sequence to each signal in the signal sequence generated in the multiplication section.

26. The information decoding apparatus according to claim 24 or 25, wherein the error decoder comprises:

means for, if a common multiplier is 1, setting as lower-order bits of the mantissa error signal a signal obtained by decoding the error code, the number of the lower-order bits being equal to the total number of digits of the mantissa minus the number of digits of corresponding quotient signals in the integer quotient signal sequence, and setting "0" in the remaining higher-order bits to obtain an error signal sequence in floating-point representation; and means for, if the common multiplier is not 1, setting each signal obtained from each error code as the mantissa of the error signal in floating-point representation to obtain an error signal sequence in floating-point form.

27. A method for estimating a common multiplier, comprising:

selecting a representative value from a set of a plurality of numeric values;

obtaining, using rational approximation, an irreducible fraction that has the smallest denominator between a positive error and a negative error based on an error of the numeric values among fractions, each of the fractions having the representative value as the numerator and each of the numeric values in the set as the denominator;

obtaining a common denominator in the obtained irreducible fractions; and obtaining a common multiplier for the plurality of values from the common denominator and the representative value.

28. A computer-readable recording medium on which is recorded a program for causing a computer to perform the step of the method according to any one of claimed 1-5, 8-12, and 27.

29. A common multiplier estimating apparatus comprising:

a denominator selecting section which selects a representative value from a set of a plurality of numeric values;

a rational approximation section in which the representative value, the set of numeric values, and the errors in the numeric values are inputted and which uses rational approximation to obtain a irreducible fraction that has the smallest denominator between a positive error and a negative error based on an error of the numeric values, each of the fractions having the representative value as the numerator and each of the numeric values in the set as the denominator;

a common denominator checking section in which the irreducible fractions are inputted and which obtains a common denominator; and a common factor calculating section in which the common denominator and the representative value are inputted and which corrects the common denominator and outputs a common multiplier for the set of numeric values.

* * * * *